(12) United States Patent
Ikeda et al.

(10) Patent No.: US 6,370,175 B1
(45) Date of Patent: Apr. 9, 2002

(54) LASER BEAM LUMINOUS ENERGY CORRECTION METHOD, LASER DRIVING APPARATUS, LASER BEAM SCANNER AND IMAGE RECORDING DEVICE

(75) Inventors: Chikaho Ikeda; Koichi Higashi, both of Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/288,655

(22) Filed: Apr. 9, 1999

(30) Foreign Application Priority Data

Apr. 13, 1998 (JP) .......................... 10-101568

(51) Int. Cl.[7] .............................. H01S 3/10; H01S 3/13; H01S 3/00; B41J 2/435
(52) U.S. Cl. ................ 372/38.1; 372/38.02; 372/38.07; 372/29.015; 372/29.011; 372/29.01; 372/24; 372/26; 347/246; 347/236
(58) Field of Search .............................. 372/38.1, 38.02, 372/38.07, 29.015, 29.011, 29.01, 24, 26; 347/246, 236

(56) References Cited

FOREIGN PATENT DOCUMENTS

| JP | A-53-87747 | 8/1978 |
| JP | A-63-184773 | 7/1988 |
| JP | A-1-182819 | 7/1989 |
| JP | A-1-302367 | 12/1989 |
| JP | B2-2-51188 | 11/1990 |
| JP | A-4-263566 | 9/1992 |
| JP | B2-4-75702 | 12/1992 |
| JP | A-5-19599 | 1/1993 |
| JP | B2-5-15339 | 3/1993 |

Primary Examiner—Frank G. Font
Assistant Examiner—Armando Rodriguez
(74) Attorney, Agent, or Firm—Oliff & Berridge, PLC

(57) ABSTRACT

The object of the present invention is to precisely correct the luminous energy of a laser beam on a scanned surface which varies according to scanning and varies according to an angle of incidence with the scanned surface when a laser beam emitted from a semiconductor laser for emitting a laser beam having luminous energy according to supply current is scanned on the scanned surface via a scanning optical system.

To achieve the above object, only modulation current when supply current supplied to a semiconductor laser is divided into threshold current having a current value in the vicinity in the spontaneous emission area of an extrapolated point which is an intersection with an axis when a linear part corresponding to a laser emission area in the supply current-to-output luminous energy characteristic of the semiconductor laser is extrapolated up to the axis showing that luminous energy is zero and modulation current which is a residual current component acquired by subtracting threshold current from supply current is regulated based upon a gain control value acquired by multiplying a gain set value which functions as the criterion of gain for converting image data to modulation current by a correction coefficient according to an angle of incidence.

23 Claims, 30 Drawing Sheets

$= (D_0 \cdot I_{S2-0} + D_1 \cdot I_{S2-1} + D_2 \cdot I_{S2-2} + D_3 \cdot I_{S2-3})$

LASER BEAM LUMINOUS ENERGY CORRECTION METHOD, LASER DRIVING APPARATUS, LASER BEAM SCANNER AND IMAGE RECORDING DEVICE

BACKGROUND OF THE INVENTION

The present invention relates to a laser beam luminous energy correction method for correcting the variation caused by a scanning optical system of the luminous energy of a laser beam incident on a scanned surface via the scanning optical system, a laser driving apparatus adopting the laser beam luminous energy correction method, a laser beam scanner for scanning the predetermined scanned surface by a laser beam emitted from a semiconductor laser driven by the laser driving apparatus and incident via the scanning optical system and an image recording device for recording an image using such a laser beam scanner.

Heretofore, for a method of correcting the variation caused by a laser beam scanning optical system of the luminous energy of a laser beam on a scanned surface (the surface of a photoconductor) and the unevenness in density of an image output according to laser xerography, there are first earlier technology (disclosed in the Unexamined Japanese Patent Publication Application No. Sho 53-87747) in which an ND filter for correcting luminous energy distribution is arranged on the optical path of a laser beam, second earlier technology (disclosed in the Examined Japanese Patent Publication Application No. Hei 2-51188) in which correction current based upon a function showing luminous energy distribution is superposed on driving current and makes electric correction, third earlier technology (disclosed in the Unexamined Japanese Patent Publication Application No. Hei 1-182819) in which the gain of a D/A converter is controlled based upon a reference value for controlling luminous energy, fourth earlier technology (disclosed in the Examined Japanese Patent Publication Application No. Hei 5-15339) in which the output of a D/A converter is regulated manually in place of controlling the gain of the D/A converter, fifth earlier technology (disclosed in the Unexamined Japanese Patent Publication Application No. Hei 1-302367) in which the maximum luminous energy and the minimum luminous energy are respectively regulated to the maximum driving current and the minimum driving current and the difference is linearly corrected and others.

However, there is a problem in the first earlier technology using the above ND filter that as the cost of the ND filter itself is high and in addition, the distribution of luminous energy varies according to the design of an optical system, the ND filter is required to be remodeled every time. There are also various problems in an electric correction method heretofore proposed as explained below.

FIG. 37 is a circuit diagram showing the above second earlier technology. An added value is acquired by adding a function value generated in a function signal generator 331 and according to a scanned position and a reference value from a reference signal circuit 332 by an adder 333 so as to use the added value for the reference value of current for driving a laser.

There is a problem that as in this method, a function value is added to the reference value using the adder 333, a function is required to be reset every time the characteristics of a laser vary because of the environmental change of temperature, humidity and others, aging change and others and this method cannot correspond to the change of the characteristics of the laser.

In the above circuit, current flowing to a laser 334 is detected and led to a comparator 335, however, there is a problem related to not current flowing in the laser 334 but the luminous energy of a laser beam emitted from the laser 334 and the variation caused by the change of the characteristics of the laser 334 of the luminous energy of a laser beam for current flowing in the laser 334 cannot be corrected.

FIG. 38 is a circuit diagram showing the above third earlier technology. Reference voltage Vref acquired by a reference voltage generator 341 and a voltage value showing the emission luminous energy of a laser 343 and detected by an optical detector 342 are compared by a comparator 344, a count value showing laser emission luminous energy according to the reference voltage Vref is acquired in an updown counter 348 by transmitting the result of the comparison to the updown counter 348, the count value is converted to an analog signal by a D/A converter 346 and transmitted to a computing element 347. In the meantime, a digital value according to a signal showing a scanned position acquired by an image scanning clock generator 349 is output from a digital value setting circuit 353, the digital value is converted to an analog signal by a D/A converter 350 and input to the computing element 347. The computing element 347 applies predetermined operation to two analog signals respectively transmitted from the two D/A converters 346 and 350 and transmits the result of the operation to a semiconductor laser driving circuit 351. Gain control based upon reference voltage Vref is applied to the D/A converter 350 by a gain control section 352. That is, a correction coefficient every scanned position is generated in the digital value setting circuit 348 and the correction coefficient is multiplied by a coefficient varying according to reference voltage Vref in automatic luminous energy control so as to suppress the a variation of luminous energy on a scanned surface.

However, in the above Examined Japanese Patent Publication Application No. Hei 2-51188, it is not described that any current component of current supplied to a semiconductor laser is to be corrected and there is a problem that a method of controlling the gain of the D/A converter 350 by the gain control section 352 is required to be changed every time the characteristic of a laser varies and the third earlier technology cannot correspond to the change of the characteristic of a laser as in the earlier technology described referring to FIG. 37.

In the above fourth earlier technology, an amplifier for controlling the output of the D/A converter 350 manually in provided in place of the gain control section 352 shown in FIG. 38 and as manual control is executed in this case, manual control is naturally executed every time the characteristic of a laser varies.

Further, in the Examined Japanese Patent Publication Application No. Hei 4-750702, the technique of controlling the emission luminous energy of a laser beam by controlling bias current is disclosed, however, the above technique also has a problem that is cannot correspond to the change of the characteristic of a laser.

As the above fifth earlier technology respectively relates the maximum luminous energy and the minimum luminous energy to the maximum driving current and the minimum driving current and linearly corrects the difference, the problems in the second and third earlier technologies are solved. However, if the fifth earlier technology is applied to laser xerography, the maximum luminous energy and the minimum luminous energy are required to be regulated due to ambient temperature and humidity or the deterioration of a photoconductor, however, reference voltage for the maximum and minimum luminous energy is fixed and it is not considered that if the maximum and minimum luminous energy is not controlled holding proportional relationship between the maximum luminous energy and the minimum luminous energy, laser beam luminous energy is not corrected right. The fifth earlier technology adopts a method that relationship between a correction value acquired by a correction coefficient circuit and the actual variation of laser beam luminous energy is defined by controlling luminous energy based upon two reference values Vp and Vb. As a result, though automatic luminous energy control is required only once if on-off control is executed by fixed luminous energy as in prior pulse length modulation, the above control is required to be executed twice in the case of the fifth earlier technology. In laser xerography, as automatic luminous energy control is required twice and effective time in which modulation by a picture signal is enabled is reduced when time required for luminous energy control is extended, countermeasures such as increasing the frequency of a clock and extending distance scanned by a laser beam are required to secure the same print speed and the cost is increased. Further, if intensity modulation described below is executed together, luminous energy control is required twice every level. As in a digital circuit, luminous energy control is originally executed by software, luminous energy control takes long time and if luminous energy control in short time at the beginning of each scan (each vertical scanning) as analog automatic luminous energy control is tried, only luminous energy control in units of page is enabled. Therefore, in laser xerography in which the high reproducibility of gradation is required, digital automatic luminous energy control in short time is difficult, however, if automatic luminous energy control is required twice, it is further difficult. If the fifth earlier technology is applied as a correction method when intensity modulation is executed using plural current sources as disclosed in the Unexamined Japanese Patent Publication Application No. Sho 63-184773, a problem that the correction factor of laser beam luminous energy varies depending upon a level of intensity modulation occurs because threshold current at an extrapolated point is not considered.

The Unexamined Japanese Patent Publication Application No. Hei 4-263566 shows countermeasures against automatic luminous energy control being required twice which is a problem of a fifth earlier technology and for intensity modulation using plural current source. According to technique disclosed in the above application, current in a laser oscillation area slightly larger than the threshold current of a laser is used, desired luminous energy is emitted based upon current on which a value acquired by multiplying the current by a correction coefficient is superposed, and another current source is set off against an error caused because current larger than threshold current at an extrapolated point is set. In the case of technique disclosed in the above application, as a circuit is complicated and in addition, current exceeding laser oscillation threshold current is regularly applied, there is a problem that an image is fogged overall in case the above technique is applied to laser xerography, and the above technique has a problem that as a method of calculating $\theta \cdot K$ ($\theta$: emission efficiency, K: gain for converting image data to current) of conditions shown in the above application for a current value in an addition circuit to be set is not shown, $\theta \cdot K$ is required to be acquired based upon laser beam luminous energy and laser driving current at two points as in the fifth earlier technology. Therefore, as a result, the problems in the fifth earlier technology are not solved. Further, the object of the technique disclosed in the above Unexamined Japanese Patent Publication Application No. Hei 4-263566 is to correct the equivalent variation of luminous energy (density) caused by the ununiformity of the rotation of a scanned object in the shape of a rotary roll and the object is not to correct the variation of luminous energy caused by a scanning optical system and the dispersion of the surface of a photoconductor respectively in question. In the Unexamined Japanese Patent Publication Application No. Hei 5-19599, technique for correcting the equivalent variation of luminous energy (density) caused by the ununiformity of the rotation of a scanned object in the shape of a rotary roll is also disclosed.

In the Unexamined Japanese Patent Publication Application No. Hei 9-197316, bias current is set so that it has a lower value than threshold current and a problem that an image is fogged is not caused in laser xerography. As a current indicated value Ipth corresponding to reference luminous energy Pth is a slightly larger value than a threshold at which the oscillation of a laser is started as disclosed in the above application and is not threshold current at an extrapolated point, the above current indicated value includes an error of correction. As the above method includes no circuit to correct difference from a threshold at an extrapolated point differently from the technique disclosed in the above Unexamined Japanese Patent Publication Application No. Hei 4-263566, correction quantity is different depending upon an output level. If Ipth can be reduced so that it has minute luminous energy when it is defined, the above difference can be also reduced, however, depending upon a method of connecting a PIN photodiode which receives the back radiation of a laser, if the output of a light receiving element is sink current, it is once converted to source current, current-voltage conversion is required to be executed in a resistor one end of which is grounded, and if luminous energy is minute and current equivalent to a received beam is small in case a current mirror circuit used for the above sink-source conversion is used, the input impedance of the current mirror circuit is increased and a frequency characteristic is greatly deteriorated. As a result, the time of automatic luminous energy control is greatly extended and in the worst case, a phenomenon of oscillation is caused depending upon a control method. As the oscillation mode of a laser is different from the mode of image modulation and spontaneous emission is included if luminous energy is minute, there is also a problem that driving current for laser oscillation to the output of a laser beam is not linear. Further, as in a semiconductor laser, a threshold is varied depending upon temperature, the smallest value of laser beam luminous energy at which a laser beam can be stably used is equivalent to approximately a few to 10% of the maximum rating luminous energy. Therefore, for example, if luminous energy on an actual printing condition is set so that it is equivalent to 50% and 30% of the maximum rating after Ipth is set so that it is equivalent to 10% of the maximum rating and a correction coefficient is calculated so that a beam has the maximum luminous energy, correction values are respectively equivalent to 82.2% and 85.2% for the setting equivalent to 80% as to an error of luminous energy. Further, if intensity modulation is executed and intensity is set to ⅓, correction values are respectively equivalent to 91.1% and 100% for the setting equivalent to 80% and in the worst case, a correction value is equivalent to 100% for the setting equivalent to 80% and an error of 20% is made. (Refer to FIGS. 6 and 7 described later and the explanation.) As the precision of approximately 0.4% is required to acquire the true reproducibility of 256 gradations, only luminous energy in the vicinity where a correction coefficient is calculated is used and as a result, reference luminous energy is automatic luminous energy control cannot be actually regulated according to output density in laser xerography.

SUMMARY OF THE INVENTION

The object of the present invention is to provide a laser beam luminous energy correction method, a laser driving apparatus, a laser beam scanner and an image recording device wherein the variation of the luminous energy caused by a scanning optical system of a laser beam scanned on a scanned surface via a vertical scanning optical system can be precisely corrected in view of the above conditions.

A first aspect of the present invention (an invention according to claim 1) is based upon a laser luminous energy correction method for correcting the variation of an output beam according to a beam position or an angle of incidence with a scanned surface when a beam output from a laser is scanned on the scanned surface via a scanning optical system to solve the above problems and characterized in that a current value exceeding a threshold current part having a current value in the vicinity in a spontaneous emission area of an extrapolated point which is an intersection with an axis when a linear part corresponding to a laser emission area in the driving current-to-output beam luminous energy characteristic of a laser is extrapolated up to the axis showing that luminous energy is zero is corrected using a correction value for correcting the variation of an output beam according to an angle of incidence with a scanned surface and the above laser is driven based upon the result of the correction and the above threshold current.

According to the first aspect, as a current value exceeding the threshold current part having a current value in the vicinity in the spontaneous emission area of the extrapolated point is corrected as described above, the variation of an output beam according to a beam position or an angle of incidence with the scanned surface can be precisely corrected. That is, the closer to a current value at the extrapolated point which is an ideal current value the current value of threshold current is, the more precisely threshold current can be corrected.

A second aspect (an invention according to claim 2) is based upon a laser driving apparatus for driving a laser (110) the output beam of which is scanned on a scanned surface via a scanning optical system and characterized in that generation means (18) for generating a correction value for correcting the variation of output according to an angle of incidence with a scanned surface, multiplication means (17) for multiplying a reference value by the correction value from the above generation means, first generation means (13) for including a constant current source the current value of which is controlled based upon the result of the multiplication by the multiplication means and generating modulation current (Is2) acquired by modulating current flowing in the constant current source according to image data, second generation means (12, 11) for generating threshold current (Is1+Ib) having a current value in the vicinity in a spontaneous emission area of an extrapolated point which is an intersection with an axis when a linear part corresponding to a laser emission area in the driving current-to-output beam luminous energy characteristic of a laser is extrapolated up to the axis showing that luminous energy is zero and addition means (10) for driving the laser based upon current generated from first and second current sources are provided.

According to the second aspect, the current value of the constant current source is controlled based upon the result of the multiplication of the reference value and the correction value by the multiplication means, the first generation means generates modulation current acquired by modulating current the current value of which is controlled according to image data and the second generation means generates threshold current having a current value in the vicinity in the spontaneous emission area of the extrapolated point. The above modulation current and threshold current are added (superposed) by the addition means and the laser is driven. As a result, as a current area exceeding threshold current is corrected, the variation of an output beam according to a beam position or an angle of incidence with the scanned surface can be precisely corrected. As the reference value is multiplied by the correction value, a correction value is not required to be varied even if intensity is required to be varied because of the condition of the scanning optical system and the scanned surface. Further, as the current value of the constant current source is controlled based upon the result of the multiplication, a correcting circuit can be realized by simple configuration.

A third aspect (an invention according to claim 3) is based upon a laser driving apparatus for driving a laser (100) the output beam of which is scanned on a scanned surface via a scanning optical system and characterized in that first generation means (18) for generating a correction value for correcting the variation of an output beam according to a beam position or an angle of incidence with a scanned surface, multiplication means (17) for multiplying a reference value by the correction value from the generation means, second generation means (13) for including one or more constant current sources the current value of which is controlled based upon the result of the multiplication by the multiplication means, selecting any of the constant current sources according to input image data and generating modulation current (Is2) acquired by modulating current flowing in the selected constant current source according to the image data, second current sources (12, 11) for generating threshold current (Is1+Ib) having a current value in the vicinity in a spontaneous emission area of an extrapolated point which is an intersection with an axis when a linear part corresponding to a laser emission area in the driving current-to-output beam luminous energy characteristic of a laser is extrapolated up to the axis showing that luminous energy is zero and addition means (10) for driving the laser based upon current generated from the second generation means and the second current source are provided.

According to the third aspect, the current value of one or more constant current sources is controlled based upon the result of the multiplication of the reference value and the correction value by the multiplication means, the first generation means selects the constant current source the current value of which is controlled according to image data and generates modulation current acquired by modulating current flowing in the selected constant current source according to the image data, and the second generation means generates threshold current having a current value in the vicinity in the spontaneous emission area of the extrapolated point. The modulation current and the threshold current are added by the addition means and the laser is driven. As a result, as current in the current area exceeding the threshold current is corrected, the variation of an output beam according to an angle of incidence with the scanned surface can be precisely corrected. As correction that the reference value is multiplied by the correction value is made, the correction value is not required to be varied even if intensity modulation according to image data is executed and intensity is required to be varied according to the condition of the scanning optical system and the scanned surface. Further, as the current value of the constant current source is controlled based upon the result of the multiplication, a correcting circuit can be realized by simple configuration.

As for the second and third aspects, it is desirable that the above second generation means includes third generation means (11) for generating bias current (Ib) regularly output independent of when image data is input and fourth generation means (12) for generating current (Is1) output when image data showing the emission of a laser beam is input and that the above threshold current is generated based upon current output from the third and fourth generation means. As a result, as bias current is also supplied when a laser beam is not emitted, the laser can be driven at high speed.

A fourth aspect (an invention according to claim 6) is based upon a laser driving apparatus for generating supply current modulated according to image data and driving a semiconductor laser for emitting a laser beam having luminous energy according to the supply current and scanned on a scanned surface via a scanning optical system by the supply current and characterized in that a modulation current source (51) to which a predetermined gain control signal and image data are input for outputting modulation current which composes a part of supply current, by which the image data is converted so that it has gain according to the gain control signal and which is modulated according to the image data, threshold current sources (52_1, 52_2) for outputting threshold current according to a predetermined current control signal which composes the above supply current together with the above modulation current and a computing element (53) for generating the above gain control signal by multiplying a gain set value which functions as the criterion of the gain of the modulation current source (51) by a correction value according to a beam position or an angle of incidence with a scanned surface varying according to scanning of a laser beam emitted from a semiconductor laser (100) and generating a current control signal to control so that threshold current output from the threshold current sources (52_1, 52_2) has a current value in the vicinity in a spontaneous emission area of an extrapolated point which is an intersection with an axis when a linear part corresponding to a laser emission area in the supply current-to-output beam luminous energy characteristic of the semiconductor laser is extrapolated up to the axis showing that luminous energy is zero are provided.

According to the fourth aspect, as the modulation current source (51) and the threshold current sources (52_1, 52_2) are provided and further, the computing element (53) for generating a gain control signal for controlling the modulation current source by multiplying the gain set value by the correction value and generating a current control signal for controlling so that threshold current in the threshold current source has a current value in the vicinity in the spontaneous emission area of the extrapolated point are provided, threshold current is regulated right, a modulation current part exceeding the threshold current is corrected and therefore, the variation of an output beam according to an angle of incidence with the scanned surface can be precisely corrected. As correction that the reference value is multiplied by the correction value is made, the correction value is not required to be varied even if intensity is required to be varied according to the condition of the scanning optical system and the scanned surface. Further, as the current value of the constant current source is controlled based upon the result of the multiplication, a correcting circuit can be realized by simple configuration.

Further, a fifth aspect (an invention according to claim 8) is based upon a laser driving apparatus for generating supply current modulated according to image data and driving a semiconductor laser for emitting a laser beam having luminous energy according to the supply current and scanned on a scanned surface via a scanning optical system by the supply current and characterized in that a modulating current source (91) to which a predetermined gain control value and image data are input for outputting modulation current which composes a part of the above supply current, by which the image data is converted so that it has gain according to the gain control value and which is modulated according to the image data, gain correction means (98) for generating the above gain control value by multiplying a gain set value which functions as the criterion of the gain of the modulation current source by a correction coefficient according to an angle of incidence with a scanned surface varying according to scanning of a laser beam emitted from a semiconductor laser and transmitting the gain control value to the modulation current source (91), threshold current sources (92_1, 92_2) for generating threshold current according to a current control value, monitor value generation means (93) for generating a monitor value acquired by adding a first monitor value acquired by converting a predetermined set value so that it has gain according to the above gain control value and a second monitor value according to the above current control value, current control value generation means (94) to which emission luminous energy monitor signal acquired by monitoring the emission luminous energy of a semiconductor laser (100) and a predetermined first reference value are input for generating the above current control value so that the semiconductor laser emits with emission luminous energy corresponding to the first reference value, gain set value generation means (95) to which the monitor value generated by the monitor value generation means (93) and a predetermined second reference value are input for generating a gain set value so that a monitor value corresponding to the second reference value is generated by the monitor value generation means (93), first sample-hold means (96) which can be switched to a through state in which input is output as it is and a hold state in which a value the input of which is sample-held is output for supplying a current control value generated by the current control value generation means (94) to the bias current source and a monitor value generation circuit as it is in the through state and with the current control value held in the hold state and second sample-hold means (97) which can be switched to a through state in which input is output as it is and a hold state in which a value the input of which is sample-held is output for supplying a gain set value generated by the gain set value generation means (95) to the gain correction means (98) and the monitor value generation means (93) as it is in the through state and with the gain set value held in the hold state are provided, and a first mode for keeping the above first and second sample-hold means (96, 97) in a through state and regulating the above gain set value and the above current control value using a correction value fixed in the gain correction means (98) and a second mode for keeping the first and second sample-hold means (96, 97) in a hold state, generating the above gain control value in the gain correction means (98) using the correction value according to an angle of incidence and outputting driving current in a driving current source by which image data is converted so that it has gain according to a gain control value and which is modulated according to the image data are provided.

According to the fifth aspect, in the above first mode, the first and second sample-hold means (96, 97) are kept in a through state, the current control value generation means

(94) and the gain set value generation means (95) are operated, threshold current is set to a threshold at an extrapolated point and a gain set value which functions as a criterion for correcting modulation current in a modulation current part exceeding threshold current is acquired. As described above, according to the fifth aspect, the threshold at the extrapolated point and the gain set value can be acquired at high speed by analog operation. Afterward, as the control is switched to open-loop control, threshold current is fixed, the gain set value is multiplied by a correction value by the gain correction means (98) and modulation current in a modulation current part exceeding threshold current is precisely corrected when the first mode is switched to the second mode, the similar action to that in the laser driving apparatus according to the above present invention is produced and the variation of an output beam according to a beam position or an angle of incidence with the scanned surface can be precisely corrected.

A sixth aspect (an invention according to claim 10) is based upon a laser beam scanner for scanning a predetermined scanned surface by a laser beam holding image information and characterized in that a semiconductor laser (1122) for emitting a laser beam having luminous energy according to supply current, a laser driving circuit (1121) for generating supply current modulated according to image data and driving the semiconductor laser by the supply current and scanning optical systems (1123, 1124, 1125) for scanning a laser beam emitted for the semiconductor laser on a predetermined scanned surface are provided, the above laser driving circuit (1121) includes generation means (18) for generating a correction value for correcting the variation of an output beam according to an angle of incidence with the above scanned surface, multiplication means (17) for multiplying a reference value by the correction value from the generation means and a constant current source the current value of which is controlled based upon the result of the multiplication by the multiplication means and is provided with first generation means (13) for generating modulation current (Is2) acquired by modulating current flowing in the constant current source according to the image data, second generation means (12, 11) for generating threshold current (Is1+Ib) having a current value in the vicinity in a spontaneous emission area of an extrapolated point which is an intersection with an axis when a linear part corresponding to a laser emission area in the modulation current-to-output beam luminous energy characteristic of the laser is extrapolated up to the axis showing that luminous energy is zero and addition means (10) for driving the laser based upon current generated from the first and second current sources.

The sixth aspect relates to the laser beam scanner for generating a laser beam holding image information using the laser driving apparatus according to the present invention and scanning the scanned surface by the laser beam, the variation due to the laser beam scanning optical system of luminous energy can be precisely corrected and a laser beam actually holding image information can be scanned.

Further, a seventh aspect (an invention according to claim 11) is based upon an image recording device utilizing a process for scanning a predetermined scanned surface by a laser beam holding image information in a process for recording an image and characterized in that a semiconductor laser for emitting a laser beam having luminous energy according to supply current, a laser driving circuit for generating supply current modulated according to image data and driving the semiconductor laser by the supply current and a scanning optical system for scanning a laser beam emitted from the semiconductor laser on the predetermined scanned surface are provided, and the above laser driving circuit is provided with generation means (18) for generating a correction value for correcting the variation of an output beam according to a beam position or an angle of incidence with the scanned surface, multiplication means (17) for multiplying a reference value by the correction value from the above generation means, first generation means (13) for including a constant current source the current value of which is controlled based upon the result of the multiplication by the above multiplication means and generating modulation current (Is2) acquired by modulating current flowing in the constant current source according to the above image data, second generation means ((12, 11) for generating threshold current (Is1+Ib) having a current value in the vicinity in a spontaneous emission area of an extrapolated point which is an intersection with an axis when a linear part corresponding to a laser emission area in the modulation current-to-output beam luminous energy characteristic of the laser is extrapolated up to the axis showing that luminous energy is zero and addition means (10) for driving the laser based upon current generated from the first and second current sources.

The seventh aspect relates to the image formation device for generating a laser beam holding image information using the laser driving apparatus according to the present invention and finally forming an image by scanning the scanned surface by the laser beam and according to the seventh aspect, the variation of luminous energy caused by the laser scanning optical system is precisely corrected and a high quality of image having precise density can be formed. As configuration for multiplying a correction value is provided, the above variation can be readily corrected by having a correction value according to repeatedly caused unevenness such as unevenness in sensitivity, electrification and transfer.

An eighth aspect (an invention according to claim 13) is based upon a laser driving method for driving a laser of which the output beam is scanned on a scanned surface via a scanning optical system, the laser driving method comprising the steps of:

generating a correction value for correcting the variation of an output beam according to a beam position or an angle of incidence with the scanned surface;

multiplying a reference value by the correction value obtained by the generation step;

with a constant current source in which a current value is controlled based upon the result of the multiplication obtained by the multiplication step, first generating for generating modulation current acquired by modulating current flowing in the constant current source according to the image data;

second generating for generating threshold current having a current value in the vicinity in a spontaneous emission area of an extrapolated point which is an intersection with an axis when a linear part corresponding to a laser emission area in the driving current-to-output beam luminous energy characteristic of the laser is extrapolated up to the axis showing that luminous energy is zero; and addition for driving a laser based upon current generated from the first and second current generating steps.

A ninth aspect (an invention according to claim 14) is based upon a laser driving method for driving a laser of which the output beam is scanned on a second surface via a scanning optical system, comprising the steps of:

first generating for generating a correction value for correcting the variation of an output beam according to a beam position or an angle of incidence with the scanned surface;

multiplying a reference value by the correction value obtained by the first generation step;

with one or more constant current sources in which a current value is controlled based upon the result of the multiplication obtained by the multiplying step, second generating for selecting the constant current source according to input image data and for generating modulation current acquired by modulating current flowing in the selected constant current source according to the image data;

generating threshold current having a current value in the vicinity in a spontaneous emission area of an extrapolated point which is an intersection with an axis when a linear part corresponding to a laser beam emission area in the driving current-to-output beam luminous energy characteristic of the laser is extrapolated up to the axis showing that luminous energy is zero by a second current source; and addition for driving a laser based upon current generated from the second generation step and the second current step.

The tenth aspect relates to the laser driving method according to the eighth or ninth aspect, wherein:

the second generation step comprises:

third generation step for generating bias current regularly output independent of time when the image data is input, and fourth generation step for generating current output when the image data is input meaning the emission of the laser; wherein the threshold current is generated based upon current output from the third and fourth generation means.

An eleventh aspect (according to claim 17) is based upon a laser driving method for generating supply current modulated according to image data and driving a semiconductor laser for emitting a laser beam having luminous energy according to supply current by the supply current for scanning a scanned surface via a scanning optical system, the laser driving method comprising the steps of:

modulation in which a predetermined gain control signal and image data are input for outputting modulation current which composes a part of the supply current, by which the image data is converted so that it has gain according to the gain control signal and which is modulated according to the image data;

outputting threshold current included in the modulation current and the supply current according to a predetermined current control signal; and generating the gain control signal by multiplying a gain set value which functions as the criterion of the gain of the modulation step by a correction value according to a beam position or an angle of incidence varying according to scanning with the scanned surface of a laser beam emitted from the semiconductor laser, and generating the current control signal to control so that threshold current output from the threshold current source is a current value in the vicinity in a spontaneous emission area of an extrapolated point which is an intersection with an axis when a linear part corresponding to a laser emission area in the supply current-to-output beam luminous energy characteristic of the semiconductor laser is extrapolated up to the axis showing that luminous energy is zero.

A twelfth aspect (according to claim 18) is based upon a laser driving method according to the eleventh aspect, wherein:

the generating the current control signal step comprises:

inputting a monitoring signal for monitoring the luminous energy of a laser beam emitted from the semiconductor laser for acquiring emission efficiency represented by the inclination of the linear part, generating the gain set value based upon the emission efficiency, acquiring an extrapolated point according to the monitoring signal, and generating the current control signal based upon the extrapolated point.

A thirteenth aspect (an invention according to claim 19) is based upon a laser driving method for generating supply current modulated according to image data and driving a semiconductor laser for emitting a laser beam having luminous energy according to the supply current for scanning a scanned surface via a scanning optical system by the supply current, the laser driving method comprising the steps of:

outputting modulation current which composes a part of the supply current by a modulation current source to which a predetermined gain control value and image data are input, by which the image data is converted so that it has gain according to the gain control value and which is modulated according to the image data;

generating the gain control value by gain correction means by multiplying a gain set value which functions as the criterion of the gain of the modulation current source by a correction value according to a beam position or an angle of incidence varying according to scanning with the scanned surface of a laser beam emitted from the semiconductor laser and transmitting the gain control value to the modulation current source by gain correction means;

generating threshold current by a threshold current source according to a current control value and composing the modulation current and the supply current;

generating a monitor value by monitor value generation means by adding a first monitor value to which a predetermined set value is converted so that it has gain according to the gain control value and a second monitor value according to the current control value;

generating the current control value by current control value generation means to which an emission luminous energy monitoring signal for monitoring the emission luminous energy of the semiconductor laser and a predetermined first reference value are input so that the semiconductor laser emits a beam having emission luminous energy corresponding to the first reference value;

generating the gain set value so that a monitor value corresponding to the second reference value is generated by the monitor value generation means by gain set value generation means to which a monitor value generated by the monitor value generation means and a predetermined second reference value are input;

supplying a current control value generated by the current control value generation means as it is in the through state and with the current control value held in the hold state to the bias current source and the monitor value generation means, by first sample-hold means capable to be switched to a through state in which input is output as it is and to a hold state in which a value the input of which is sample-held is output; and supplying a gain set value generated by the gain set value generation means as it is in the through state and with the gain set value held in the hold state to the gain correction means and the monitor value generation means, by second sample-hold means capable to switched to a through state in which input is output as it is and to a hold state in which a value the input of which is sample-held is output, wherein the laser driving apparatus utilizes:

a first mode for keeping the first and second sample-hold means through and controlling the gain set value and the current control value using a correction value fixed in the gain correction means; and a second mode for keeping the first and second sample-hold means sample-held, generating the gain control value using a correction value according to the angle of incidence in the gain correction means and outputting driving current by which image data is converted so that the image data has gain according to the gain control value in the driving current source and which is modulated according to the image data.

A fourteenth aspect (an invention according to claim 20) is based upon a laser driving method according to the thirteenth aspect, further comprising:

a low-pass filter located between the gain correction means and the modulation current source, and operated in the second mode.

A fifteenth aspect (an invention according to claim 21) is based upon a laser beam scanning method for scanning a predetermined scanned surface by a laser beam holding image information, the laser beam scanning method comprising the steps of:
    emitting a laser beam having luminous energy according to supply current by a semiconductor laser;
    generating supply current modulated according to image data and driving the semiconductor laser by the supply current by a laser driving circuit; and
    scanning the predetermined scanned surface by a scanning optical system for helping a laser beam emitted from the semiconductor laser, wherein:
    the semiconductor laser driving method comprises the steps of:
        generating a correction value for correcting the variation of an output beam according to an angle of incidence with the scanned surface by generation means;
        multiplying a reference value by a correction value from the generation means by multiplication means;
        generating modulation current acquired by modulating current flowing in the constant current source according to the image data by first generation means with a constant current source the current value of which is controlled based upon the result of the multiplication by the multiplication means, by the first generation means;
        generating threshold current having a current value in the vicinity in a spontaneous emission area of an extrapolated point which is an intersection with an axis when a linear part corresponding to a laser emission area in the driving current-to-output beam luminous energy characteristic of the laser is extrapolated up to the axis showing that luminous energy is zero, by second generation means; and
        driving a laser based upon current generated from the first and second current sources by addition means.

A sixteenth aspect (an invention according to claim 22) is based upon a laser beam scanning method according to the fifteenth aspect, wherein:

the scanning optical system comprises:
        a rotating polygon mirror for reflecting and deflecting a laser beam emitted from the semiconductor laser, and
        a beam diameter control optical member for regulating a laser beam emitted from the semiconductor laser and outgoing from one mirror surface of the rotating polygon mirror so that the beam has a predetermined beam diameter, and leading the beam to the rotating polygon mirror.

A seventeenth aspect (an invention according to claim 23) is based upon an image recording method with a process for scanning a predetermined scanned surface by a laser beam holding image information in a process for recording an image, the image recording method comprising the steps of:
    causing a semiconductor laser beam having luminous energy according to supply current emit;
    causing a laser driving circuit generate supply current modulated according to image data and driving the semiconductor laser by the supply current; and
    causing scanning optical system for helping a laser beam emitted from the semiconductor laser scan a predetermined scanned surface, wherein:
    the step of causing the laser driving circuit generate supply current comprises:
        generating a correction value for correcting the variation of an output beam according to a beam position or an angle of incidence with the scanned surface by generation means;
        multiplying a reference value by a correction value from the generation means by multiplication means;
        generating modulation current acquired by modulating current flowing in the constant current source according to the image data, by first generation means with a constant current source the current value of which is controlled based upon the result of the multiplication by the multiplication means;
        generating threshold current having a current value in the vicinity in a spontaneous emission area of an extrapolated point which is an intersection with an axis when a linear part corresponding to a laser emission area in the driving current-to-output beam luminous energy characteristic of the laser is extrapolated up to the axis showing that luminous energy is zero by second generation means; and
        driving a laser based upon current generated from the first and second current sources by addition means.

DESCRIPTION OF THE PREFERRED EMBODIMENTS

Embodiments of the present invention will be described below.

Figure 1:
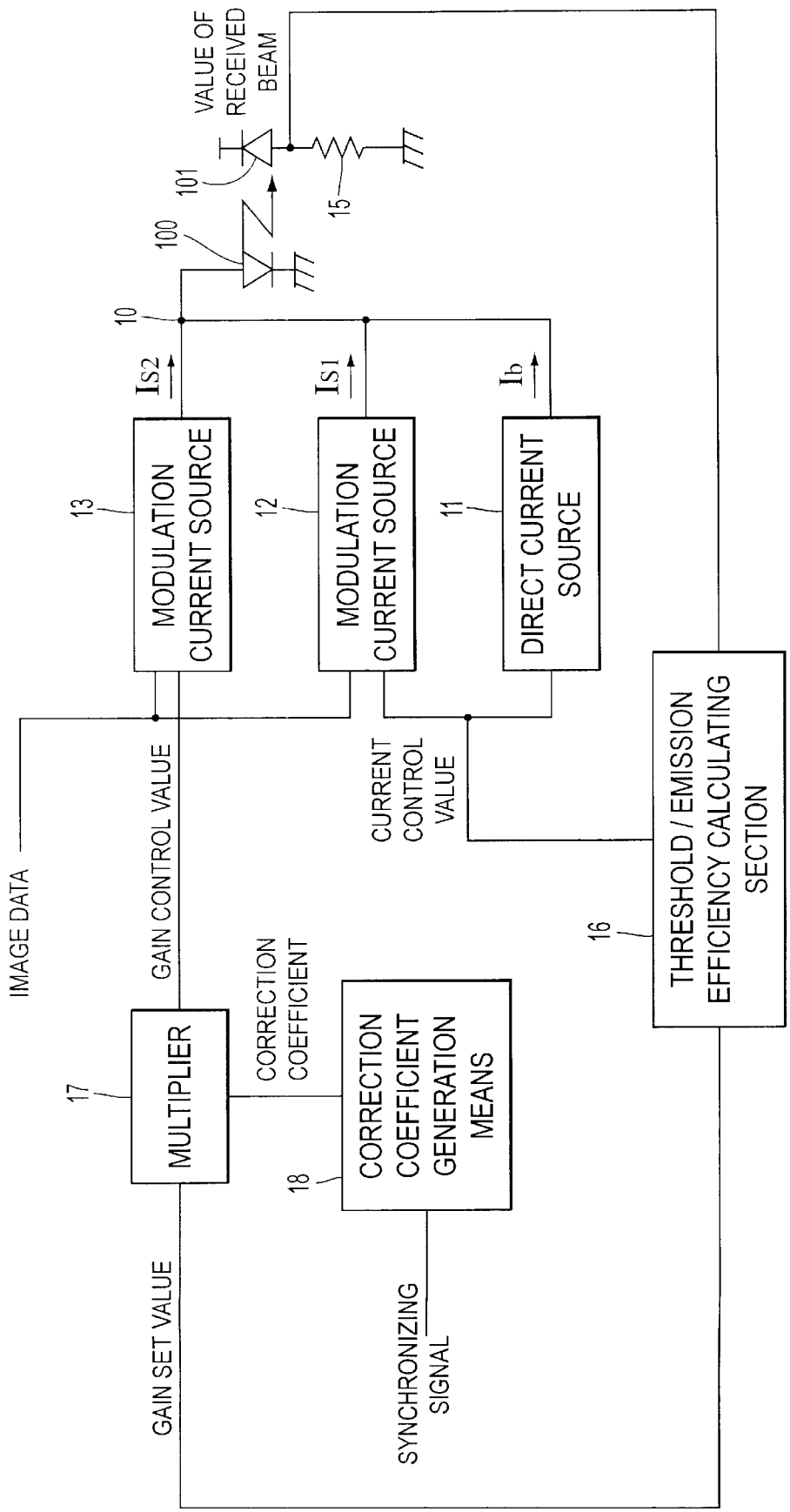
FIG. 1 is a block diagram showing a first embodiment of a laser driving apparatus according to the present invention.
Figure 2:
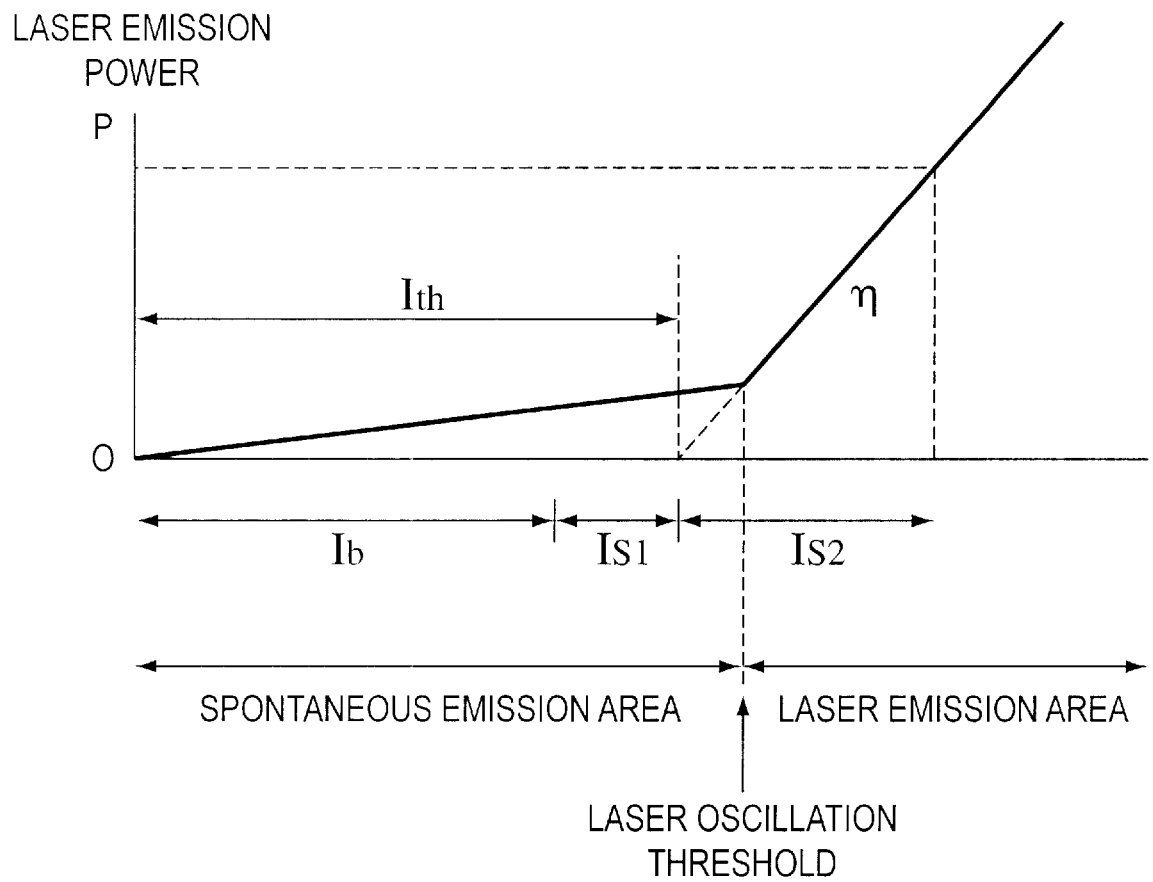
FIG. 2 shows the characteristic of the output luminous energy of a semiconductor laser to supply current supplied to the semiconductor laser.

FIG. 1 is a block diagram showing a first embodiment of a laser driving apparatus according to the present invention, FIG. 2 is an explanatory drawing for explaining the first embodiment and shows the output luminous energy characteristic of a semiconductor laser for supply current supplied to the semiconductor laser.

In the description of the first embodiment shown in FIG. 1 and each embodiment described later of the laser driving apparatus, it is premised that supply current modulated according to image data is generated, a semiconductor laser is driven by the supply current and the laser driving apparatus is used for a system for finally forming an image by scanning a scanned surface via a scanning optical system.

In an embodiment shown in FIG. 1, a direct current source 11, a modulation current source 12 and another modulation current source 13 are provided, and direct current Ib, modulation current Is1, another modulation current Is2 are respectively output. The three currents Ib, Is1 and Is2 are synthesized to be supply current supplied to a semiconductor laser 100. In this embodiment, means (wiring) 10 for synthesizing currents Ib, Is1 and Is2 as described above is equivalent to addition means in the present invention. When supply current is supplied to the semiconductor laser 100, the semiconductor laser 100 emits according to the supply current, a part of emitted beams are received by a photodiode 101, current according to the received luminous energy flows into the photodiode 101 and the current is converted to a voltage value (a value of the received luminous energy) according to the received luminous energy by a resistor 15. The value of the received beam is input to a threshold/emission efficiency calculating section 16. In the threshold/emission efficiency calculating section 16, a threshold and emission efficiency η are acquired based upon the input value of the received beam. The above threshold means an intersection P between an extrapolated straight line when a part in which the characteristic of output luminous energy for supply current is shown by a straight line in a laser emission area in the supply current-to-output beam luminous energy characteristic shown in FIG. 2 of the semiconductor laser is extrapolated up to the x-axis showing that output luminous energy is zero and the x-axis, and the emission efficiency corresponds to the inclination η of the straight line. Unless hereinafter particularly described, a threshold shall denote a threshold at an extrapolated point.

A method of acquiring these threshold and emission efficiency will be described in the following explanation of embodiments and so, assuming that these threshold and emission efficiency are acquired, explanation will be advanced. The threshold/emission efficiency calculating section 16 generates a current control value based upon an acquired threshold and transmits it to the direct current source 11 and the modulation current source 12. The direct current source 11 and the modulation current source 12 are composed so that they output currents Ib and Is1 provided with current values of 4 to 1 for example to the same current control value, and a current control value regulated so that the total of two currents Ib and Is1 respectively from the two current sources 11 and 12 is threshold current Ith shown in FIG. 2 is output by the threshold/emission efficiency calculating section 16. Image data is input to the modulation current source 12 and the modulation current source 13 and action related to image data will be described later.

In the threshold/emission efficiency calculating section 16, a gain set value is generated based upon acquired emission efficiency and is input to a multiplier 17. When the gain set value is input to the modulation current source 13, passing the multiplier 17, a gain set value which is a value for controlling so that the gain of the modulation current source 13 becomes gain suitable for the inclination η of the straight line shown in FIG. 2 is output from the threshold/ emission efficiency calculating section 16.

A correction coefficient from a correction coefficient generating section 18 is also input to the multiplier 17 and in the multiplier 17, the gain set value is multiplied by the correction coefficient and a gain control value is acquired. The gain of the modulation current source 13 is controlled based upon the gain control value.

In the correction coefficient generating section 18, correction coefficients respectively corresponding to scanning positions when a laser beam emitted from the semiconductor laser 100 is scanned on a predetermined scanned surface via a scanning optical system not shown are stored in the format of a table for example, and in actual scanning, a synchronization signal synchronized with a scanning position is input to the correction coefficient generating section 18 and a correction coefficient corresponding to the scanning position is sequentially input to the multiplier 17. In the multiplier 17, a gain set value input from the threshold/emission efficiency calculating section 16 is sequentially multiplied by sequentially input each correction coefficient, a gain control value sequentially varied based upon each correction coefficient is output and hereby, the gain of the modulation current source 13 is sequentially controlled according to a scanning position.

Image data is sequentially input to the modulation current source 13 in synchronization with a synchronization signal, the input image data is converted by gain according to a gain control value input in a synchronization state and modulation current Is2 modulated (the intensity or the pulse length of which is modulated) according to the image data is output.

Image data is also input to another modulation current source 12. The modulation current source 12 regards image data as binary data based upon whether the value of image data is zero or a value larger than one and turns modulation current Is2 on (if the value of image data is 1 or more) or off (if the value of image data is zero).

therefore, as shown in FIG. 2, if the value of image data is zero (including timing at which image data is not input), only direct current Ib from the direct current source 11 is supplied to the semiconductor laser 100 and when image data the value of which is 1 or more is input, modulation currents Is1 and Is2 from the two modulation current sources 12 and 13 are added to direct current Ib shown in FIG. 2 and supplied. Direct current Ib is equivalent to (4/5)_Ith, modulation current Is1 is equivalent to (1/5)_Ith, modulation current Is2 is equivalent to a current value acquired by converting image data so that it has gain according to a gain control value in the case of intensity modulation and is equivalent to a current value according to the value of image data.

The reason why not threshold current Ith but bias current Ib smaller than threshold current Ith is supplied to the semiconductor laser 100 when image data is not input (or a data value is zero) is to removed bad effect caused because slight light emitted from the semiconductor laser 100 when threshold current Ith is supplied irradiates a scanned surface, and the reason why the whole threshold current Ith is not turned on or off is to secure high-speed responsibility when an off state is switched to an on state by keeping current to some extent flowing to the semiconductor laser 100 even in an off state.

A data value and emission power are precisely proportioned by turning on or off modulation current with the same current value which is equivalent to the fixed ratio of threshold current Ith without depending upon the value of image data as to modulation current Is1 and varying only modulation current Is2 exceeding threshold current Ith according to a data value in the case of intensity modulation.

In the threshold/emission efficiency calculating section 16 shown in FIG. 1, as a threshold and emission efficiency are acquired and a current control value and a gain set value are acquired based upon them, a correction coefficient stored in the correction coefficient generating section 18 is no related to the variation of the characteristics of the semiconductor laser 100, and in the correction coefficient generating section 18, a correction coefficient for correcting variation corresponding to each beam position or incidence angle of a laser beam irradiated on a scanned surface in case a laser beam with fixed luminous energy is emitted from the semiconductor laser 100 has only to be stored.

In the threshold/emission efficiency calculating section 16, when a laser beam emitted from the semiconductor laser 100 is off a predetermined scanned surface, a threshold and emission efficiency are calculated at timing at which image formation is not prevented every scanning, before the start of scanning for one page or after finishing the scanning, a current control value and a gain set value are acquired and afterward, the current control value and the gain set value are held till the next timing of calculating a threshold at an extrapolated point and emission efficiency.

Figure 3:
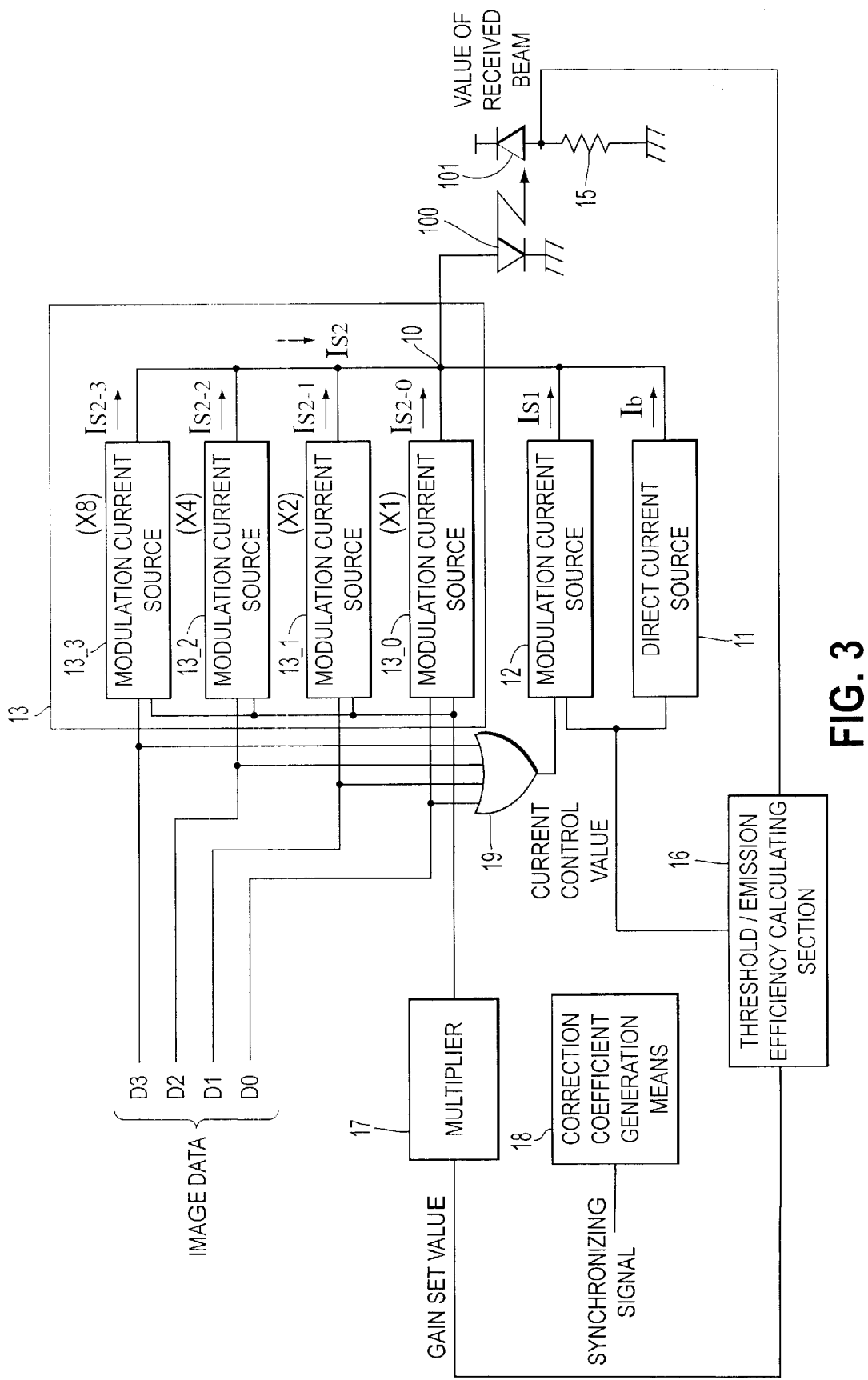
FIG. 3 is a block diagram showing a second embodiment of the laser driving apparatus according to the present invention.
Figure 4:
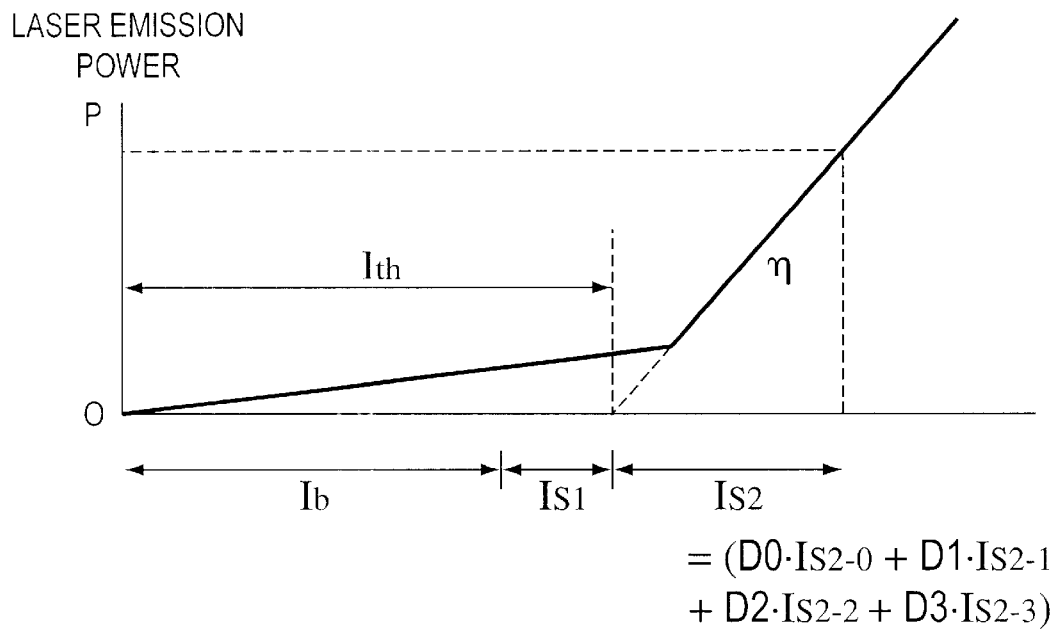
FIG. 4 shows the supply current-to-output luminous energy characteristic of a semiconductor laser.

FIG. 3 is a block diagram showing a second embodiment of the laser driving apparatus according to the present invention and FIG. 4 is an explanatory drawing for explaining the second embodiment. Difference from the first embodiment described referring to FIGS. 1 and 2 will be described below.

A modulation current source 13 shown in FIG. 3 is composed of four modulation current sources 13_0, 13_1, 13_2 and 13_3 respectively corresponding to each bit of 4-bit image data input to the modulation current source 13.

The gain of these four modulation current sources 13_0, 13_1, 13_2 and 13_3 is controlled according to a gain control value output from a multiplier 17.

Current with each different current value is output from each modulation current source 13_0, 13_1, 13_2 and 13_3 when each bit D0, D1, D2 and D3 of image data input to each modulation current sources 13_0, 13_1, 13_2 and 13_3 is all on. That is, if the current value of current Is2_0 output from the modulation current source 13_0 is '1' in the above example, each modulation current source 13_0, 13_1, 13_2 and 13_3 outputs each current Is2_1, Is2_2 and Is2_3 respectively with current values 2, 4 and 8.

Plural simultaneous outputs from the four modulation current sources 13_0, 13_1, 13_2 and 13_3 according to each bit D0, D1, D2 and D3 of image data are selected and current is output from the selected modulation current sources. Therefore, modulation currents Is2=D0_Is2_0+D1_Is2_1+D2_Is2_2+D3_Is2_3 (D0, D1, D2 and D3 are respectively '1' when each corresponding bit of image data is on and are respectively '0' when each corresponding bit is off) is output from the modulation current source 13 in which the modulation current sources 13_0, 13_1, 13_2 and 13_3 are synthesized as shown in FIG. 4. Each bit D0, D1, D2 and D3 of image data are input to another modulation current source 12 via OR gate 19 and when any one bit of these four bits is on, modulation current Is1 which is fixed current is output from the modulation current source 12. Hereby, a laser beam the intensity of which is modulated according to image data is emitted from the semiconductor laser 100 by the laser driving apparatus shown in FIG. 3. As described in relation to the first embodiment, it is modulation current Is2 precisely equal to or exceeding threshold current Ith that the intensity is modulated according to image data and a laser beam having precise image information is emitted.

The above is the basic description of the second embodiment and before the further detailed description of the second embodiment, the second embodiment will be compared with earlier technology.

Figure 5:
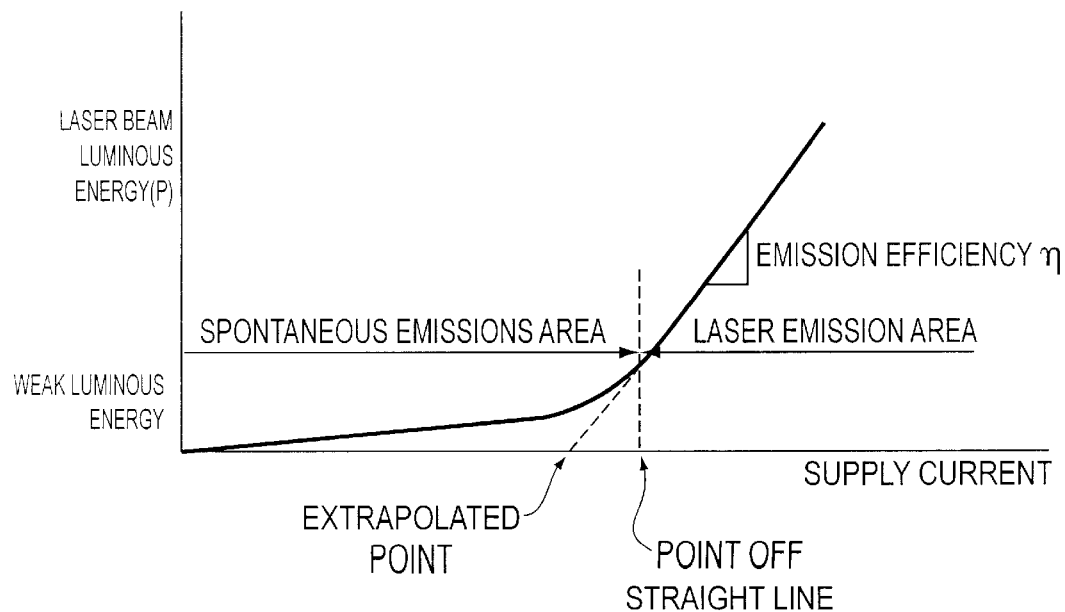
FIG. 5 shows the characteristic of the output luminous energy of a semiconductor laser for comparing with the earlier technology.

FIG. 5 shows the characteristics of luminous energy output from the semiconductor laser for comparing with earlier technology.

Any of earlier technology has a problem that it cannot be applied to an intensity modulating laser driving circuit because in the above earlier technology, the oscillation threshold of a semiconductor laser is not considered precisely. A method in which a laser oscillation threshold is considered is also proposed. In Japanese published unexamined patent application No. Hei 9-197316 in the earlier technology, a method of correcting current exceeding a threshold determined by emitting a laser beam is adopted. However, a laser oscillation start point located on a straight line is apart from an extrapolated point. Further, as the characteristics of an individual semiconductor laser have dispersion and there is deterioration by aging, actually the laser oscillation start point is required to be set so that it is further apart from an extrapolated point. However, to set precisely, it is desirable that a threshold is set in the vicinity of an extrapolated point in a spontaneous emission area lower than a laser oscillation start point shown in FIG. 5. If required precision allows, the vicinity of an extrapolated point can be also regarded as a large range.

Figure 6:
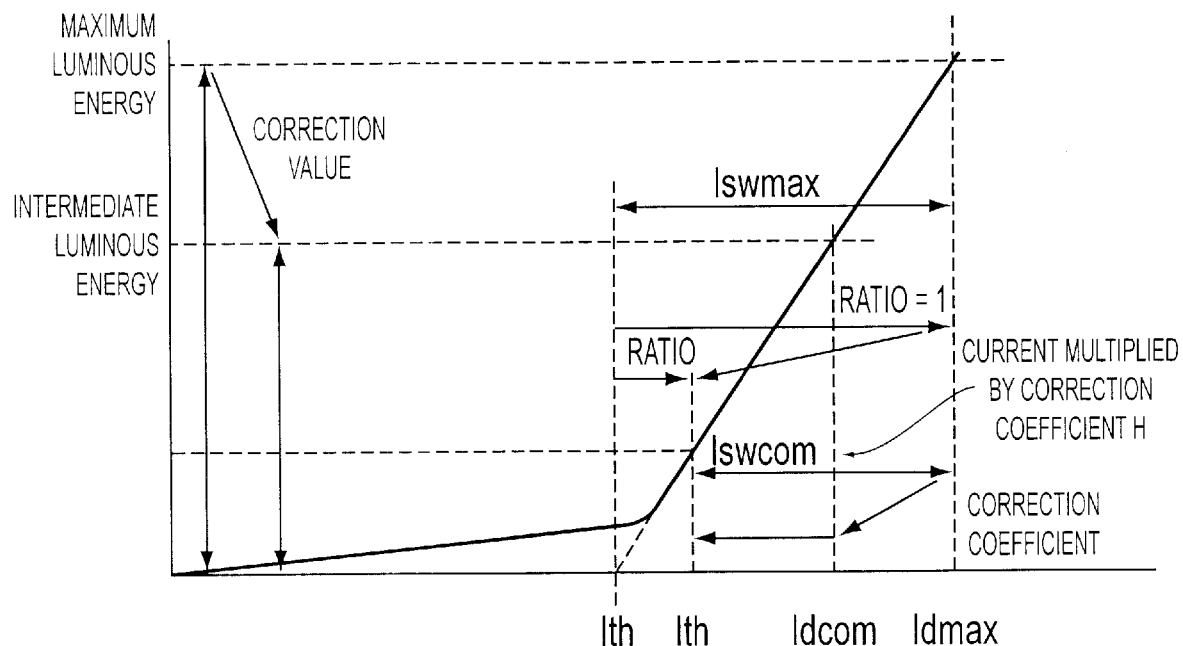
FIG. 6 is an explanatory drawing for explaining a theoretical error when a threshold Ith' off from a threshold Ith at an extrapolated point is set.
Figure 7:
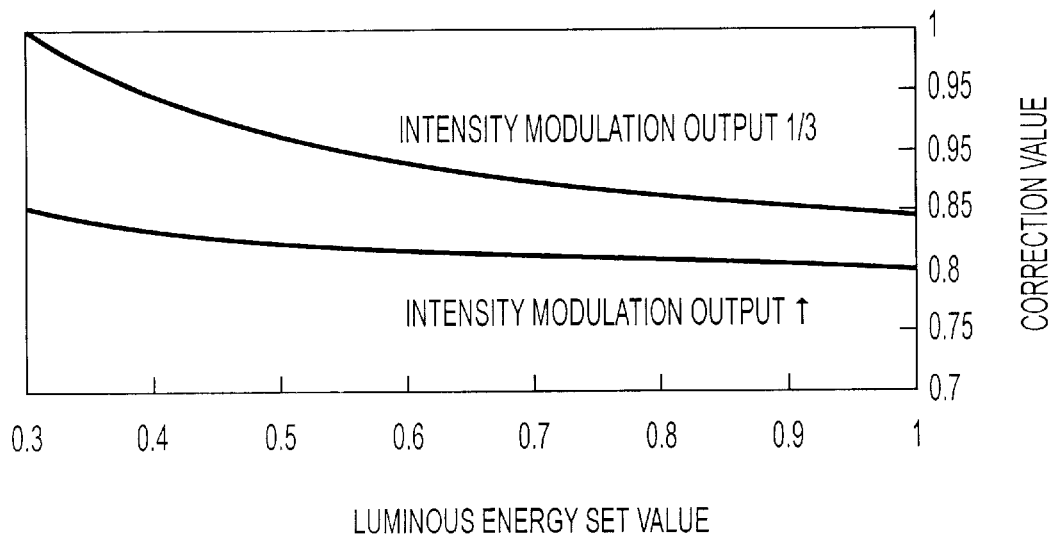
FIG. 7 is a graph showing a correction value for a luminous energy indicated value led from a theoretical expression led referring to FIG. 6.

FIG. 6 is an explanatory drawing for explaining a theoretical error when a threshold Ith' off from a threshold Ith at an extrapolated point is set and FIG. 7 is a graph showing a correction value for a luminous energy indicated value at the correction coefficient of 80% derived from its theoretical expression.

First, an expression showing a theoretical error is derived. The definition of each notation in FIG. 6 is as follows.

ratio=Threshold setting error (Example: If a threshold setting error is 0.1, threshold current is set to ten percent of modulation current Iswmax exceeding a threshold Ith at an extrapolated point. If a threshold setting error is zero, Ith' is equal to Ith.)

comp=Correction value (Correction quantity in view of luminous energy, Example: If correction quantity is 0.8, it is equivalent to 80% of the maximum luminous energy.)

H: Correction coefficient (Correction quantity in view of current, As Ith and Ith' are different, a correction coefficient is not equal to a correction value.)

Iswmax=Threshold current by extrapolation (Temporary threshold set by oscillating a laser)

com=Luminous energy set value (Ratio set for the maximum luminous energy, Example: If a luminous energy set value is 0.5, it is equivalent to a half of luminous energy at Iswmax.)

Iswcom=Operating modulation current (Current exceeding Ith')

A basic expression for automatic luminous energy control is as follows.

$$Id\max = Ith + Isw\max = ratio \cdot Isw\max + (1-ratio) \cdot Isw\max \quad (1)$$

The correction coefficient of current required to acquire the luminous energy of the double of a correction value for the maximum luminous energy is calculated in the above expression.

Modulation current multiplied by the correction coefficient is as follows.

$$Id = Ith + ratio \cdot Isw\max + H \cdot (1-ratio) \cdot Isw\max \quad (2)$$

In the meantime, supply current required to acquire the luminous energy of the double of a corrective value for the maximum luminous energy is as follows.

$$Ith + comp \cdot Isw\max \quad (3)$$

Therefore, if (2) is equal to (3), as follows.
Ith+comp·Iswmax=Ith+ratio·Iswmax+H·(1−ratio)·Iswmax H·(1−ratio)·Iswmax=(comp−ratio)·Iswmax Therefore, a correction coefficient required to acquire the luminous energy of the double of a correction value for the maximum luminous energy is as follows.

$$H = (comp-ratio)/(1-ratio) \quad (4)$$

Supply current acquired by putting the expression (4) into the basic expression (1) for acquiring the luminous energy of the double of a correction value for the maximum luminous energy is as follows.

$$Id = Ith + ratio \cdot Isw\max + (comp-ratio) \cdot Isw\max \quad (5)$$

Next, if luminous energy is changed from the maximum luminous energy to the double of a luminous energy supply value (com), supply current in case the correction coefficient H acquired above is used as it is calculated.

First, supply current to acquire the luminous energy of the double of a luminous energy set value for the maximum luminous energy before correction is calculated as follows.

$$Id = Ith + com \cdot Isw\max \quad (6)$$

As the correction coefficient H is multiplied for current exceeding Ith' in correction, current Iswcom exceeding ith' is required to be acquired. As supply current I is current acquired by totalizing Ith' and Iswcom, as follows.

$$I=Ith+Iswcom=Ith+\text{ratio}\cdot Iswmax+Iswcom \quad (7)$$

If (6) is equal to (7), as follows.

$$Iswcom=(com-\text{ratio})\cdot Iswmax \quad (8)$$

If the expression (8) is put into the expression (7), as follows.

$$I=Ith+\text{ratio}\cdot Iswmax+(com-\text{ratio})\cdot Iswmax \quad (9)$$

Supply current when current exceeding Ith' is multiplied by the correction coefficient H is as follows.

$$I=Ith+\text{ratio}\cdot Iswmax+H(com-\text{ratio})\cdot Iswmax$$

If the expression (4) related to the correction coefficient H acquired at the maximum luminous energy is put into the above expression, as follows.

$$I=Ith+\text{ratio}\cdot Iswmax+\{(com-\text{ratio})/(1-\text{ratio})\}\cdot(com-\text{ratio})\cdot Iswmax \quad (10)$$

As it is current from which Ith is subtracted that is in proportion to luminous energy in the above expression, as follows.

After the correction of $P$ ratio·$Iswmax+\{(com-\text{ratio}/1-\text{ratio})\}\cdot(com-\text{ratio})\cdot Iswmax$ (11)

If Ith is subtracted to extract current proportional to luminous energy as in the expression (11) as ideal supply current to achieve a luminous energy indicated value com is acquired in the following expression (12), as follows.

$$I=Ith+com\cdot Iswmax \quad (12)$$

Ideal $P$ $com\cdot Iswmax$ (13)

An actual correction value in case the maximum luminous energy is corrected using a correction coefficient acquired at the maximum luminous energy for luminous energy equivalent to the double of a luminous energy set value is as follows by after the correction of P/ideal P, that is, the expression (11)/the expression (13).

Correction value=[ratio+{(comp-ratio)/(1-ratio)}·(com=ratio)]/(com)

The above expression (14) shows a conclusion.

As for the change of a correction value to be fixed to 80% when a correction coefficient of current is determined so that the correction value is 80% for example at the maximum luminous energy and afterward, luminous energy is changed to luminous energy equivalent to the double of a luminous energy set value for the maximum luminous energy, the correction value 0.8 becomes 0.822 if luminous energy is set to the luminous energy set value of 0.5 equivalent to a half of the maximum luminous energy and further, the correction value becomes 0.852 if a luminous energy set value is 0.3. In case intensity modulation is executed and further, optical output at the luminous energy level of ⅓ is modulated, a correction value is 0.844 when a luminous energy set value is 1, the correction value is 0.911 when a luminous energy set value is 0.5, further, the correction value is 1 when a luminous energy set value is 0.3 and the effect of correction is lost. If 256 gradations are required, correction precision is required to be secured so that a correction value becomes 0.804 or less for an original correction value 0.8, however, depending upon the above result, if a luminous energy set value is changed according to environmental conditions in xerography, there occurs a problem that the density of an image cannot be regulated by laser beam luminous energy because an error in correcting luminous energy exceeds an allowable error in 256 gradations depending upon how to set a luminous energy set value.

According to the present invention, high-precision correction at least including no theoretical error is enabled by setting to a threshold at an extrapolated point.

Figure 8:
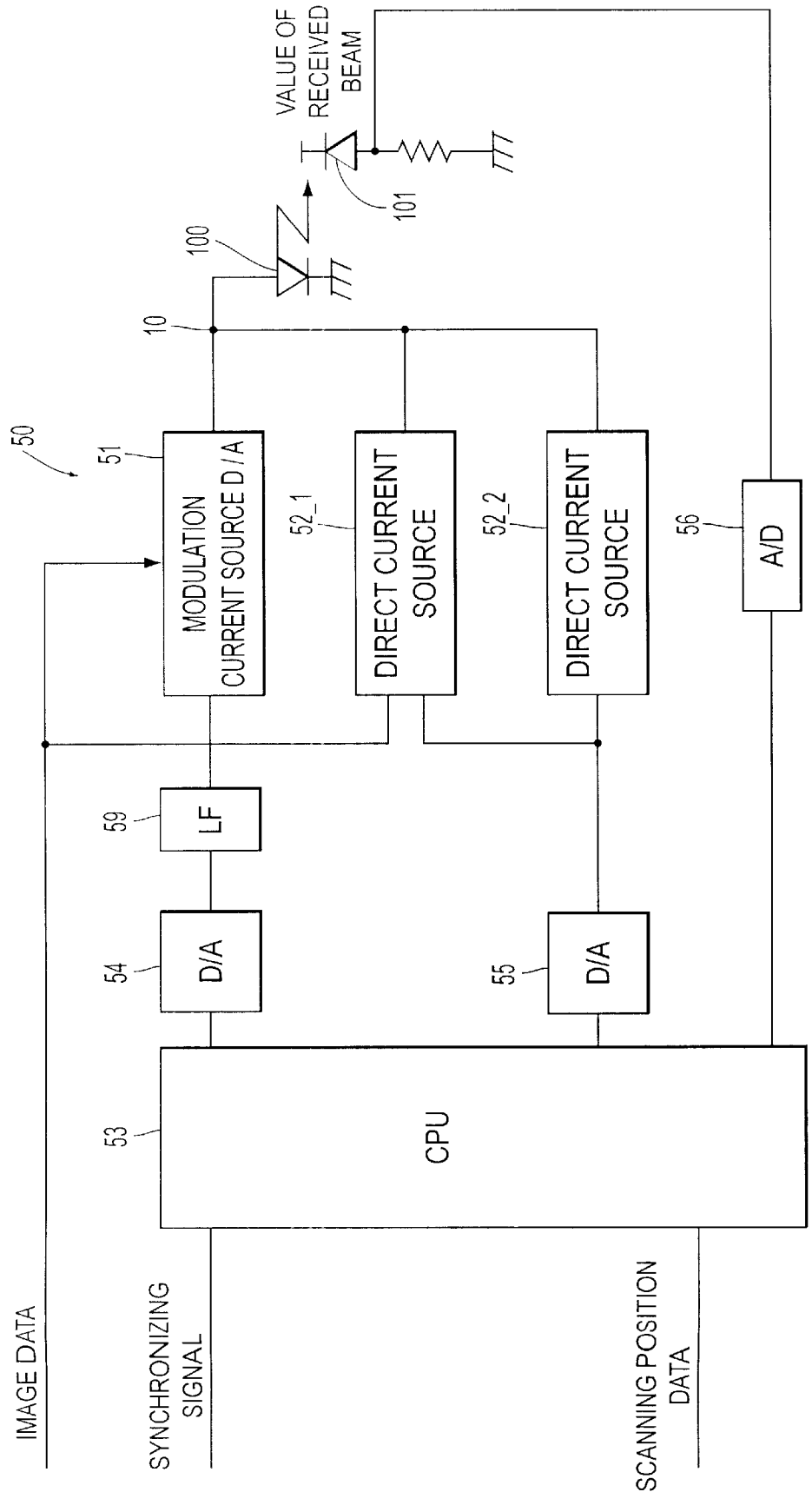
FIG. 8 is a block diagram showing a third embodiment of the laser driving apparatus according to the present invention.
Figure 9:
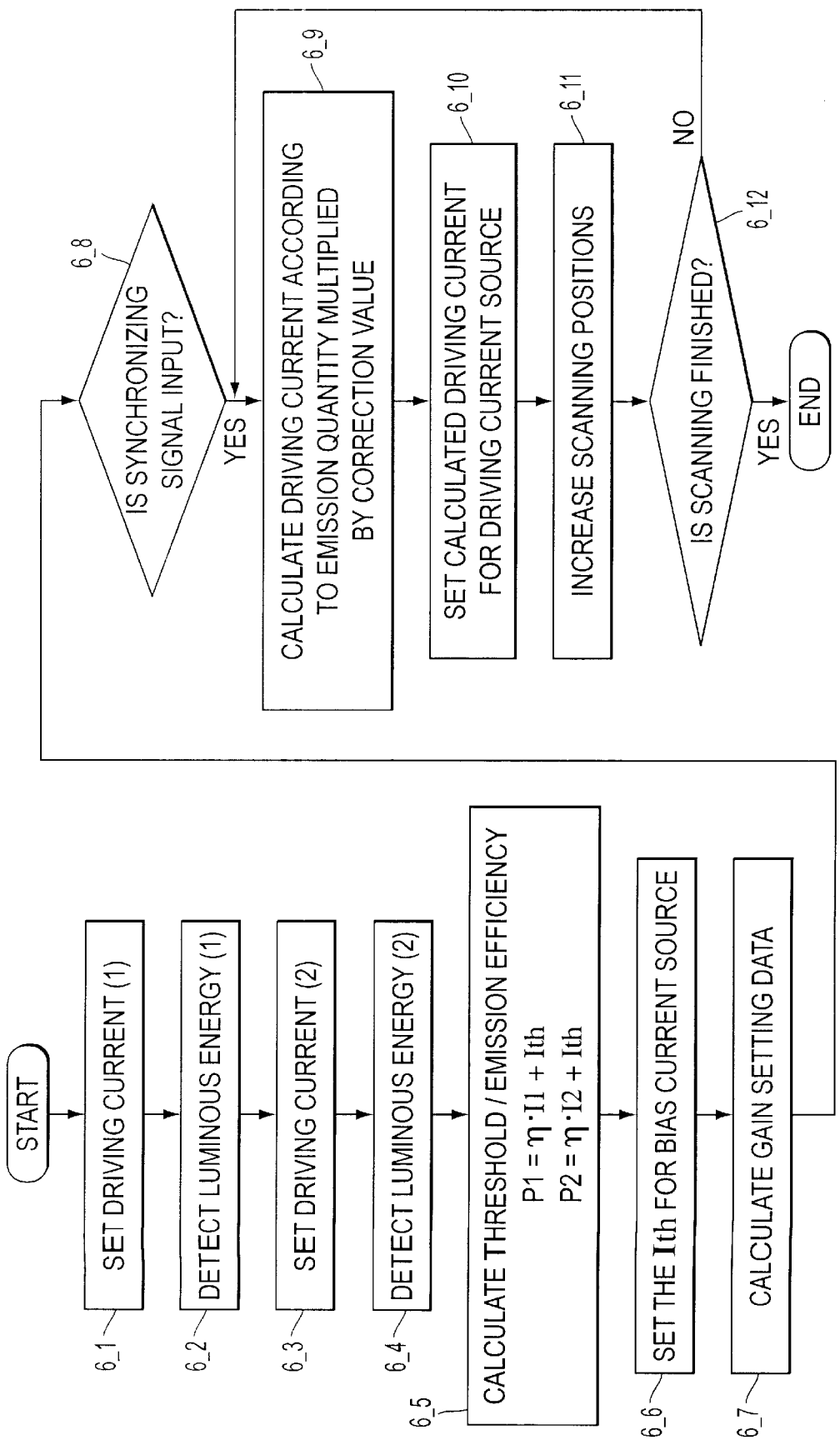
FIG. 9 is a flowchart showing the operation of the third embodiment shown in FIG. 8.
Figure 10:
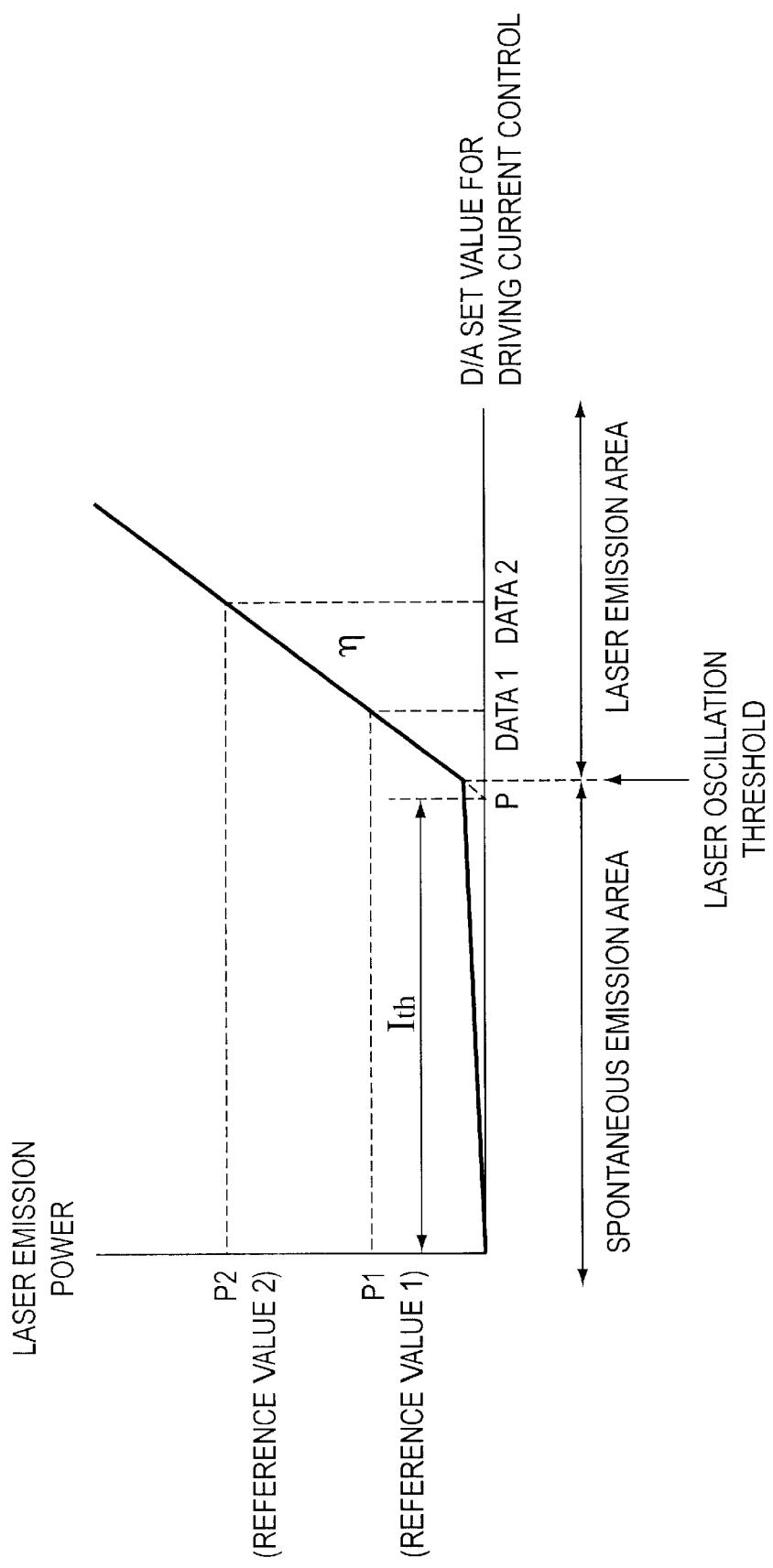
FIG. 10 shows the supply current-to-output luminous energy characteristic of a semiconductor laser.

FIG. 8 is a block diagram showing a third embodiment of the laser driving apparatus according to the present invention, FIG. 9 is a flowchart showing operation in the third embodiment shown in FIG. 8 and FIG. 10 shows a supply current-to-output luminous energy characteristic for explaining the operation.

A laser driving apparatus 50 is provided with a first D/A converter 51 as a modulation current source, another modulation current source 52_1, a direct current source 52_2, CPU 53, a second A/D converter 54 for converting the result of operation by CPU 53 to an analog signal and transmitting the analog signal to the first D/A converter 51, a third D/A converter 55 for converting the result of operation by CPU 53 to an analog signal and transmitting the analog signal to another modulation current source 52_1 and the direct current source 52_2, an A/D converter 56 for converting received luminous energy acquired by receiving a part of laser beams emitted from a semiconductor laser 100 by a photodiode 101 to digital data and transmitting the digital data to CPU 53 and a low-pass filter 59 for smoothing the output of the second A/D converter 54. A synchronization signal and scanning position data are input to CPU 53 in addition to data showing received luminous energy from the A/D converter 56 and image data is input to the first D/A converter 51.

Gain control voltage acquired by converting gain control data from CPU 53 to an analog signal by the second D/A converter 54 and digital image data are input to the first D/A converter 51, the image data is converted so that it has gain according to gain control voltage by the first D/A converter 51 and the first D/A converter outputs modulation current modulated according to the image data.

Current control voltage acquired by converting current control data from CPU 53 to an analog signal by the third D/A converter 55 is input to the modulation current source 52_1 and the direct current source 52_2 and both sources output threshold current according to the current control voltage.

Modulation current output from the first D/A converter 51, modulation current output from the modulation current source 52_1 as a part of threshold current and further, direct current are synthesized and supplied to the semiconductor laser 100. As each role of the first D/A converter 51, the modulation current source 52 and the direct current source 52_2 is similar to each role of the modulation current source 13, another modulation current source 12 and the direct current source 11 respectively shown in FIG. 1, the description is omitted.

CPU 53 fills a role equivalent to an operation section in the present invention, multiplies a gain set value which functions as the criterion of the gain of the first converter by a correction coefficient according to a beam position or an angle of incidence varying according to scanning a scanned surface by a laser beam emitted from the semiconductor laser 100, generates gain control data for supplying gain control voltage to the first D/A converter 51 based upon the result of multiplication and outputs it to the second D/A converter 54 and further, generates digital current control data for controlling so that threshold current output from the modulation current source 52_1 and the direct current source 52_2 has a current value at an extrapolated point (P) in the characteristic of output luminous energy to supply current to the semiconductor laser 100 shown in FIG. 10 or in the vicinity of the threshold in a spontaneous emission area and outputs it to the third D/A converter 55.

However, in an actual circuit, a correction coefficient according to a beam position of an angle of incidence is given only in the form of an incomplete value because of the restriction of a memory when a correction coefficient according to a beam position or an angle of incidence varying according to scanning is multiplied and its digit is also restricted. Further, as the resolution of the first D/A converter for converting the result of multiplication to a control signal is restricted in view of the cost, gain control voltage output from the first D/A converter 51 is a discrete value. If the value is used for gain control voltage as it is, is applied to an image writer and the variation of luminous energy in scanning is corrected, the luminous energy of a laser beam varies like a step at the same point in scanning and as a result, stripelike unevenness is caused in a place where luminous energy varies like a step in the direction of paper feed. Therefore, a low-pass filter is required to reduce the steplike variation of gain control voltage. For characteristics required for a low-pass filter, a higher-order frequency component which is caused in the discretization of gain control voltage and which will be not included in ideal gain control voltage when it is supposed that the actual variation of luminous energy is corrected so that the variation is smooth in relation to time and voltage has only to be suppressed, and if discrete values are connected in the shape close to a polygonal line using a first-order low-pass filter composed of CR including higher-order low-pass filters or a constant current source and a capacitor, the similar effect can be also produced. In short, a higher-order frequency component not included originally has only to be suppressed. Further, as the above low-pass filer has character of suppressing a higher-order frequency component, delay is caused in transmitting a signal because of the filter. As a result, extra operating time is required by the quantity of delay in transmitting a signal when a laser beam threshold is operated by a computing element, detecting output from a beam receiving device. Therefore, it is desirable that it is set that a low-pass filter is not operated in calculating a threshold so that a higher-order frequency component is transmitted.

The second D/A converter 54 and the third D/A converter 55 respectively converter gain control data and current control data input to each to analog gain control voltage and analog current control voltage and respectively output to the first D/A converter 51 and the bias current source 52.

Next, referring to FIGS. 9 and 10, operation in a third embodiment shown in FIG. 8 will be described.

First, the set value (gain control data) of a second D/A converter 54 is set to zero, the output of a third D/A converter 55 for controlling a bias current source is gradually increased and supply current to a semiconductor laser 100 is increased. Then, a semiconductor laser 59 starts emission when a laser oscillation threshold shown in FIG. 2 is exceeded and laser emission power reaches to P1 when the set value (current control data) of the third D/A converter 55 for controlling the bias current source reaches data 1 (a step 6_1). The laser emission power P1 at this time is read by an A/D converter 56 and stored in a memory in CPU (a step 6_2). Similarly, laser emission power P2 when the set value of the second D/A converter 54 for controlling the bias current source reaches data 2 is read and stored in the memory in CPU (steps 6_3 and 6_4). The expression of a straight line in the linear area of the emission power characteristic of the semiconductor laser 100 for the set values of the D/A converters is defined biased upon the laser emission power P1 and P2 and the data 1 and 2 (a step 6_5), and the intersection P of the straight line and the x-axis showing that laser emission power is zero, that is, a threshold at an extrapolated point is acquired. Afterward, the set value of the third D/A converter 55 for controlling the bias current source equivalent to the acquired threshold at the extrapolated point is set as the set value of the bias current source (a step 6_6). Next, after image data (meaning not actual image data but data for regulation at this stage) to the second D/A converter 54 for controlling the modulation current source is restored in a full scale, the set value (gain set data) of the second D/A converter 54 for controlling the modulation current source is acquired so that it is equal to desired laser emission power in view of the output of the A/D converter 56 (a step 6_7). Next, a value (gain control data) is acquired by multiplying its set value (gain set data) by a correction coefficient for keeping luminous energy on the scanned surface fixed by CPU and is supplied to the second D/A converter 54 for controlling modulation current which determines the gain of the first D/A converter 51 according to scanning point data input to CPU 53 in actual scanning (steps 6_9, 6_10). The above operation is repeated every vertical scanning position (steps 6_8 to 6_12). According to this method, as the multiplication of a correction coefficient is executed only for a current part except threshold current at an extrapolated point Ith, a correction coefficient is not required to be varied even in the case of intensity modulation or even if the reference values P1 and P2 are varied respectively for the data 1 and 2.

Figure 11:
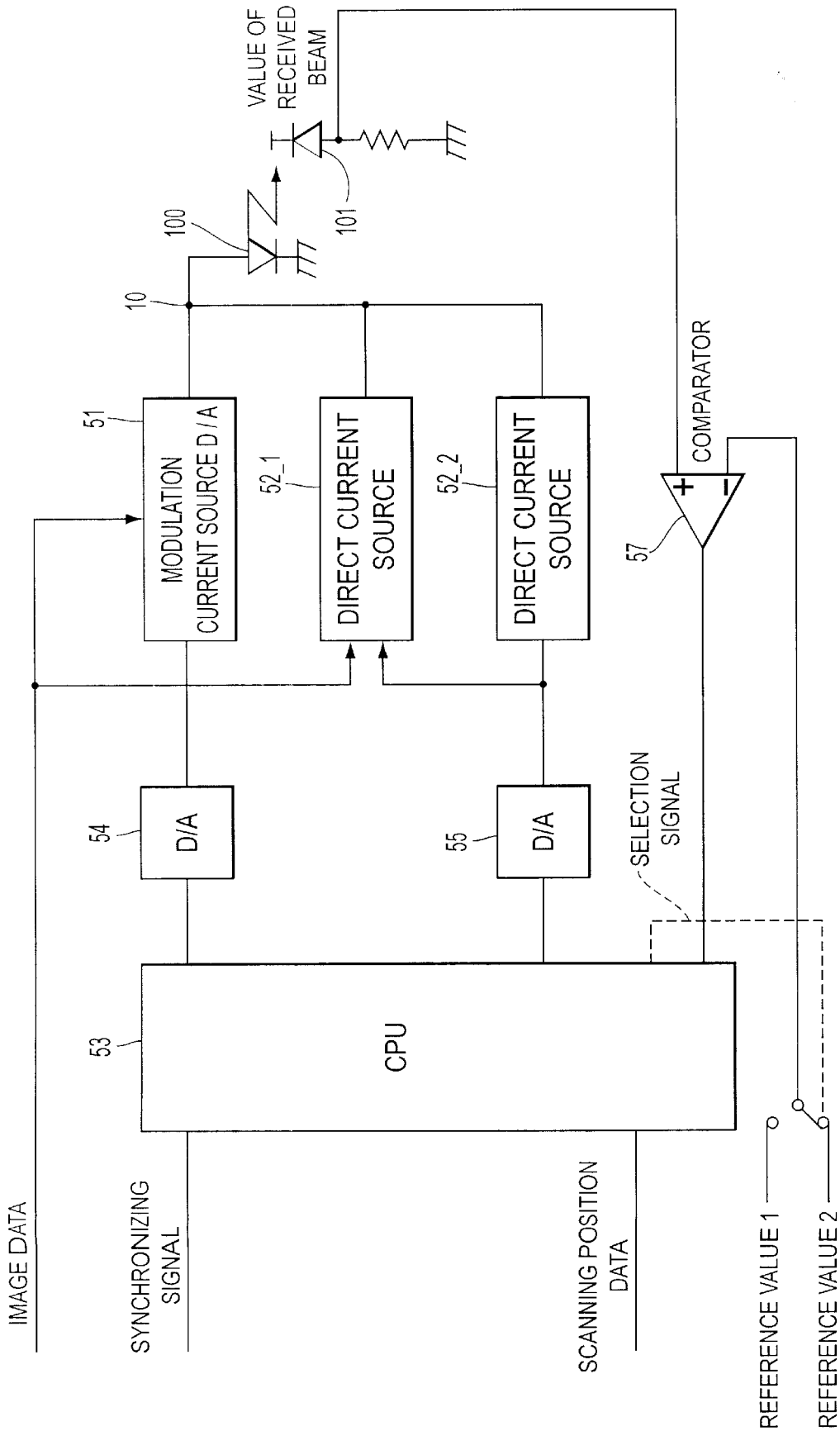
FIG. 11 is a block diagram showing a fourth embodiment of the laser driving apparatus according to the present invention.

However, if the above method is actually realized, a high-precision A/D converter 56 is required for monitoring a laser emission power. FIG. 11 shows a fourth embodiment in view of the measure. In FIG. 11, the comparator 57 in FIG. 8 is replaced with the A/D converter. As the configuration of a 8 or more-bit A/D converter requiring particularly high precision becomes complicated, the cost is increased. Therefore, in this case, reference values 1 and 2 which are an analog signal are applied from an external device, are switched according to a selection signal by CPU 53 and are supplied to a comparator 57. The basic operation is the same as that in the embodiment shown in FIG. 8, when the reference value 1 is input to the comparator 57 according to the selection signal, the current value of current output from a modulation current source 51 (a first D/A converter) is set to zero and the current value of current output from a bias current source 52 is gradually increased, the output of the comparator 57 is inverted when a value of received beam exceeds the reference value 1, it is input to CPU and as a result, it is known that emission luminous energy at that time is reference value 1. The input data 1 of a third D/A converter 55 for controlling the bias current source at that time is stored. Further, as the current value of current output from the bias current source 52 is increased until emission luminous energy reaches the reference value 2, the data 2 can be known. The following processing is similar.

In addition, a method shown in FIG. 11 of setting the reference value 2 equal to the double (or n times) of the reference value 1 and acquiring threshold current by subtracting difference data (or difference data l/n) between the data 1 when the reference value 1 is exceeded and the data 2 when the reference value 2 is exceeded from the data 1 is also proposed and as operation such as division is not required, the load of CPU 53 can be reduced. As a counter can execute similar processing without using CPU, a control circuit may be also included in a driving apparatus for driving a semiconductor laser.

For a method of acquiring an expression expressing a linear operational line by digital operation, there are also multiple methods except an expression described here, however, a method of acquiring a linear operational line is not important, and in short, a method of acquiring threshold current at an extrapolated point acquired by extrapolating a linear area in the operational characteristic of a laser up to a point showing that luminous energy is zero, correcting only modulation current exceeding the threshold current at the extrapolated point of supply current supplied to a semiconductor laser by multiplying a correction coefficient, adding the threshold current at the extrapolated point and driving the semiconductor laser may be adopted in the present invention.

Figure 12:
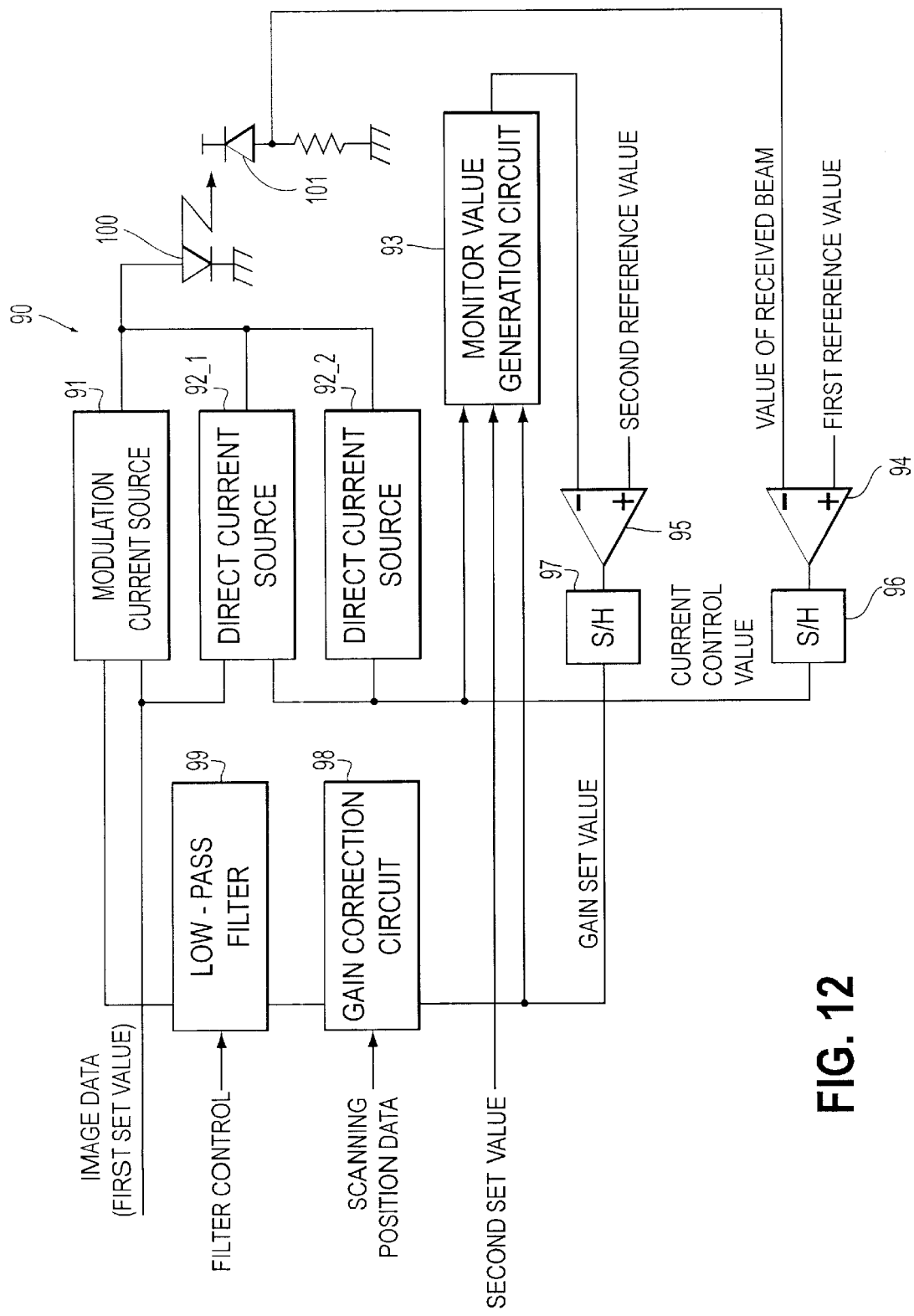
FIG. 12 is a block diagram showing a fifth embodiment of the laser driving apparatus according to the present invention.
Figure 13:
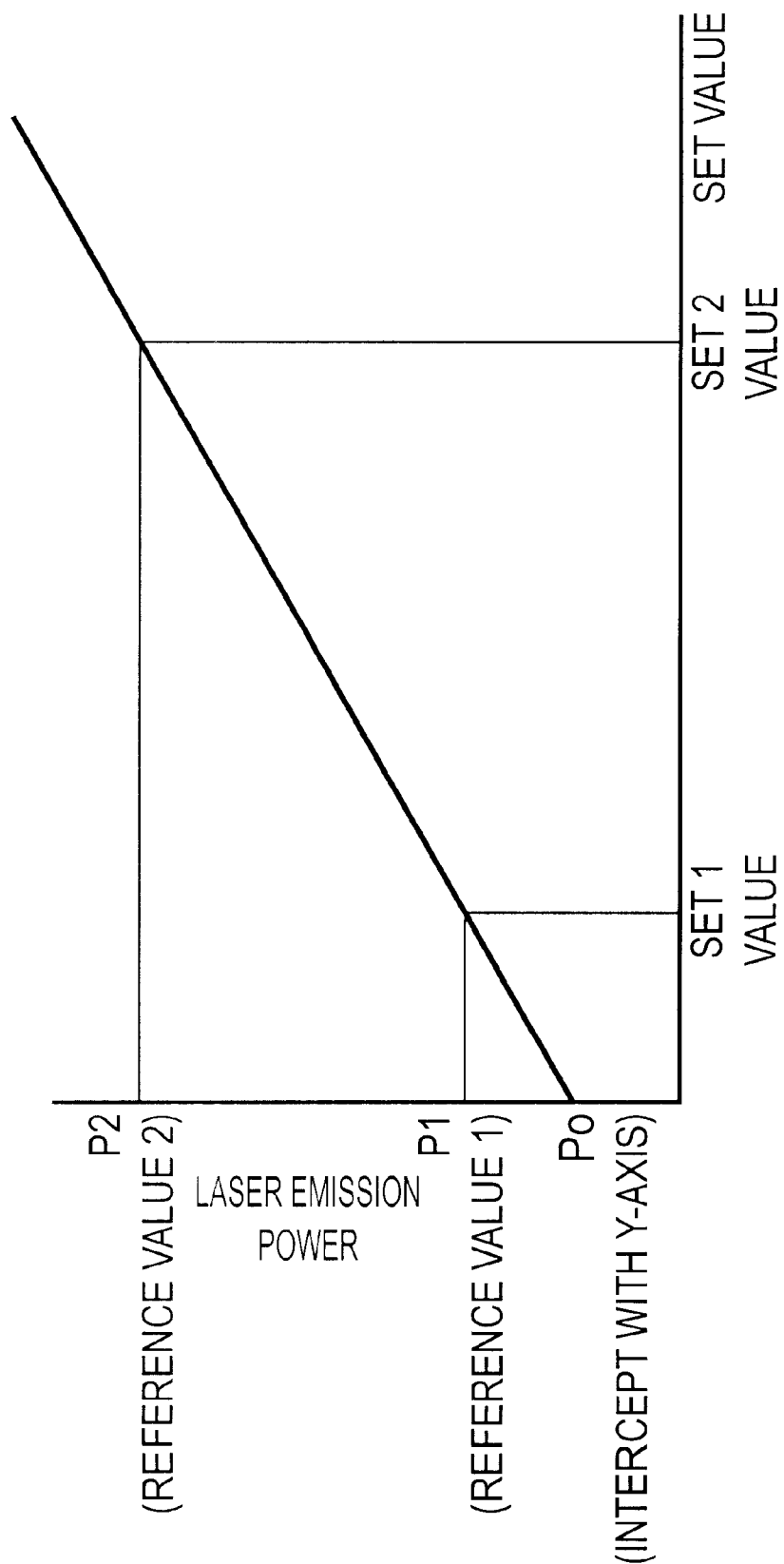
FIG. 13 shows correspondent relationship between a set value and a laser emission power.
Figure 14:
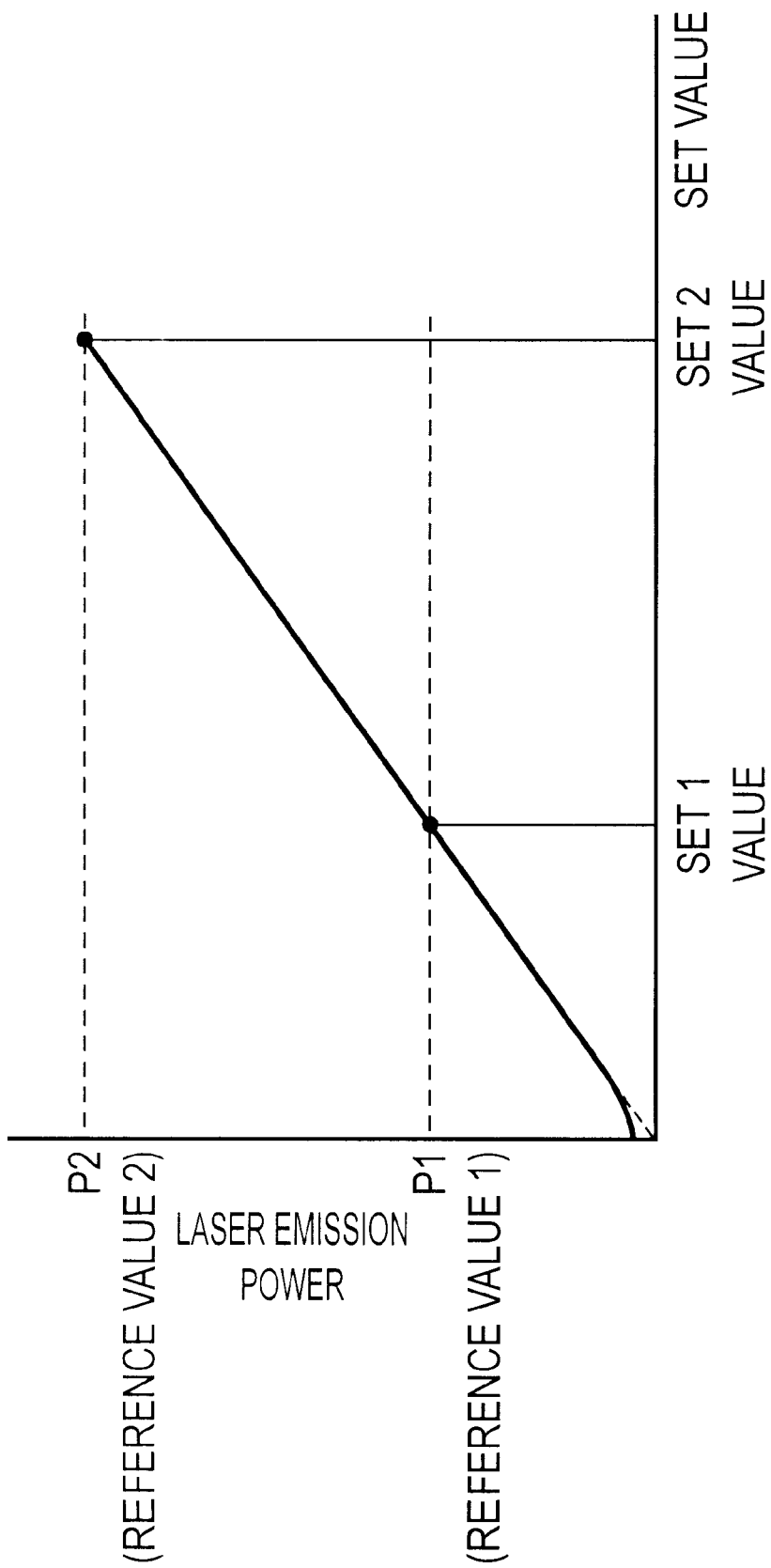
FIG. 14 shows correspondent relationship between a set value and a laser emission power.

FIG. 12 is a block diagram showing a fifth embodiment of the laser driving apparatus according to the present invention and FIGS. 13 and 14 respectively show correspondent relationship between a set value and laser emission power for explaining the operation of a semiconductor laser driving apparatus shown in FIG. 12.

In a semiconductor laser driving apparatus 90 shown in FIG. 12, a modulation current source 91, another modulation current source 92_1, a direct current source 92_2, a monitor value generation circuit 93, a first operation amplifier 94, a second operation amplifier 95, a first sample-hold circuit 96, a second sample-hold circuit 97, a gain correction circuit 98 and a low-pass filter 99 are provided.

The first and second sample-hold circuits 96 and 97 are respectively switched to a through state in which input is output as it is when a gain set value and a current control value are regulated and are respectively switched to a hold state in which input is sample-held and the held value is output when regulation is finished. First, a method of regulating a gain set value and a current control value will be described. At this time, the first and second sample-hold circuits are respectively switched to a through state.

Image data which is fixed to a first set value is input to the modulation current source 91 and the modulation current source 91 supplies modulation current having a current value according to the input first set. A gain set value output from the second operation amplifier 95 is also input to the modulation current source 91 via the second sample-hold circuit 97, the gain correction circuit 98 and the low-pass filter 99 and in the modulation current source 91, its gain is regulated according to the input gain control value (meaning a gain set value via the gain correction circuit 98). Therefore, modulation current output from the modulation current source 91 also has a current value regulated according to the gain control value in a state in which the first set value is fixed.

A current control value output from the first operation amplifier 94 is input to another modulation current source 92_1 and the direct current source 92_2 via the first sample-hold circuit 96, and the modulation current source 92_1 and the direct current source 92_2 respectively supply threshold current according to the current control value to a semiconductor laser 100. Therefore, current on which threshold current and modulation current are superposed (supply current) is supplied to the semiconductor laser 100. The role of the modulation current source 92_1 and the direct current source 92_2 in this embodiment is the same as each role of the modulation current source 12 and the direct current source 11 in the first embodiment shown in FIG. 1 and the description is omitted.

The monitor value generation circuit 93 produces action such as action by all the modulation current sources 91 and 92_1 and the direct current source 92_2 for example. That is, a second set value (a predetermined set value in the present invention), a gain set value generated by the second operation amplifier 95 and a current control value generated by the first operation amplifier 94 are input to the monitor value generation circuit 93, and a monitor value acquired by adding a first monitor value according to the second set value and acquired by regulating gain according to the gain set value (that is, a first monitor value corresponding to modulation current generated in the modulation current source 91) and a second monitor value according to the current control value (that is, a second monitor value corresponding to threshold current generated in the modulation current source 92_1 and the direct current source 92_2) is generated. However, the first set value is input to the modulation current source 91, the second set value is input to the monitor value generation circuit 93, therefore, the first monitor value does not directly correspond to modulation current generated in the modulation current source 91 and corresponds when both the first set value and the second set value are equal.

In this embodiment, more concretely, if the current value of modulation current generated in the modulation current source 91 is Is, the current value of threshold current generated in the modulation current source 92_1 and the direct current source 92_2 is Ith and further, a proportional constant is C, monitor current having the following current value M is generated in a monitor value generation circuit 13.

$$M = C \times \{(\text{second set value} + \text{first set value} \times Is + Ith)\} \quad (15)$$

The proportional constant C is the ratio of the current value of supply current (modulation current Is+threshold current Ith) to a monitor value in case both the first set value and the second set value are equal, if the proportional constant C is set to a large value, power consumption in a monitor unrelated to the driving of a laser is increased and if the proportional constant is too small, a problem such as noise which has an effect upon the precision of setting is caused. Therefore, it is desirable that the proportional constant C is set so that it is an intermediate value of them, for example, approximately 1 mA at the maximum.

When supply current Is+Ith is supplied to the semiconductor laser 100, a part of a laser beam emitted from the semiconductor laser 100 is received by a photodiode 101 and the value of the received beam is input to the first operation amplifier 94. A predetermined first reference value is also input to the first operation amplifier 94, a current control value is generated so that the semiconductor laser 100 emits a beam having luminous energy corresponding to the first reference value and input to the modulation current source 92_1, the direct current source 92_2 and the monitor value generation circuit 93. As described above, at this stage, the two sample-hold circuits 96 and 97 are in a through state. In the modulation current source 92_1 and the direct current source 92_2, a current control value output from the first operation amplifier 94 is received, threshold current Ith having a current value corresponding to the current control value is generated and supplied to the semiconductor laser 100.

A monitor value generated by the monitor value generation circuit 93 is input to the second operation amplifier 95, the monitor value is compared with a predetermined second reference value, a gain set value is generated, one is input to the modulation current source 91 via the gain correction circuit 98 and the low-pass filter 99 and another is directly input to the monitor value generation circuit 93. In automatic luminous energy control, if a correction coefficient in the gain correction circuit 98 is set to a fixed value, for example 1, the potential in input and output of the gain correction circuit 98 is set so that it is the same and the function of the low-pass filter 99 is also turned off (in a through state). As a result, in automatic luminous energy control, the gain set value is input to the modulation current source 91 as it is. In the modulation current source 91, the gain of the modulation current source 91 is regulated by quantity in which threshold current Ith is regulated by a current control value under a condition that supply current Is+Ith to the semiconductor laser 100 is maintained so that it is fixed current corresponding to the first reference value and as a result, modulation current Is is regulated.

As shown in FIG. 13, if a set value 1 and a set value 2 are respectively given as the first set value and the second set value, and a reference value 1 corresponding to laser emission power P1 and a reference value 2 corresponding to laser emission power P2 are respectively given as the first reference value and the second reference value, a straight line shown in FIG. 13 is formed and threshold current corresponding to emission power P0 equivalent to an intercept of the y-axis when a set value is zero is settled. That is, an example shown in FIG. 13 means that if modulation current Is is zero (the first set value (image data) is zero) and only threshold current Ith is supplied to the semiconductor laser 100 as supply current, the semiconductor laser 100 emits with emission power P0.

Bias current IB is just equal to threshold current Ith at the extrapolated point by setting each set value and each reference value so that a straight line b passing the origin of coordinates shown in FIG. 14 is formed, that is, so that the following expression is met and the output of a beam can be accurately proportioned to a set value.

$$P2 \div P1 = \text{set value } 2 \div \text{set value } 1 \quad (16)$$

When reference voltage is varied because of temperature, humidity, the deterioration of a photoconductor and others, the voltage is also required to be varied with the expression (2) met and this can be readily realized by dividing voltage by resistors R1 and R2 as shown in FIG. 12 described later. That is, as follows.

$$P2 \div P1 = \text{set value } 2 \div \text{set value } 1 = (R1+R2) \div R2$$

If the linearity of current to the output of a beam at the set value 1 of emission in a spontaneous emission area is bad, if the linearity of the responsibility and the output for luminous energy of the photodiode 101 in a low luminous energy area is deteriorated or if the offset of the operation amplifier comes into question, these problems can be improved by bringing the set value 1 close to the set value 2. In this case, as the setting precision of a threshold is deteriorated when the set value 1 is too close to the set value 2, precision is also required to be considered to settle the set value 1.

After luminous energy control is executed as described above, the gain set value and the current control value are fixed by keeping the two sample-hold circuits 96 and 97 in a hold state and modulation by image data is started. The image data is input to the modulation current source 91 in place of the first set value shown in FIG. 9. At that time, in the gain correction circuit 98, the gain set value held in the second sample-hold circuit 97 is multiplied by a correction coefficient every scanning position according to scanning position data, a gain control value is generated and input to the modulation current source 91 via the low-pass filter 99. As the gain control value input to the modulation current source 91 is a value acquired by multiplying the gain set value held in the second sample-hold circuit 97 in automatic luminous energy control by a correction coefficient, the current value of modulation current Is is a current value acquired by multiplying the current value in automatic luminous energy control by a correction coefficient in case image data having the same value as the first set value in automatic luminous energy control is input. When a gain control value input to the modulation current source 91 according to the variation of a correction coefficient varies like a step in case a discrete value is given as a correction coefficient, the luminous energy of a laser beam emitted from the semiconductor laser 100 varies like a step, the variation of luminous energy may cause a stripe in an image and to prevent such a stripe from being caused, the low-pass filter 99 is arranged on the output side of the gain correction circuit 98.

In the above embodiment, as a first feedback circuit including the first operation amplifier 94 and a second feedback circuit including the second operation amplifier 95 are provided, these first and second feedback circuits are simultaneously operated and a straight line (the characteristic of laser emission power to set values) shown in FIG. 14 is defined with analog values, threshold current Ith can be set at high speed, hereby, modulation current Is is limited to current which contributes to the emission of a semiconductor laser and laser emission luminous energy is accurately proportioned to a correction coefficient by multiplying a gain set value defining the gain of modulation current by a correction coefficient.

Figure 15:
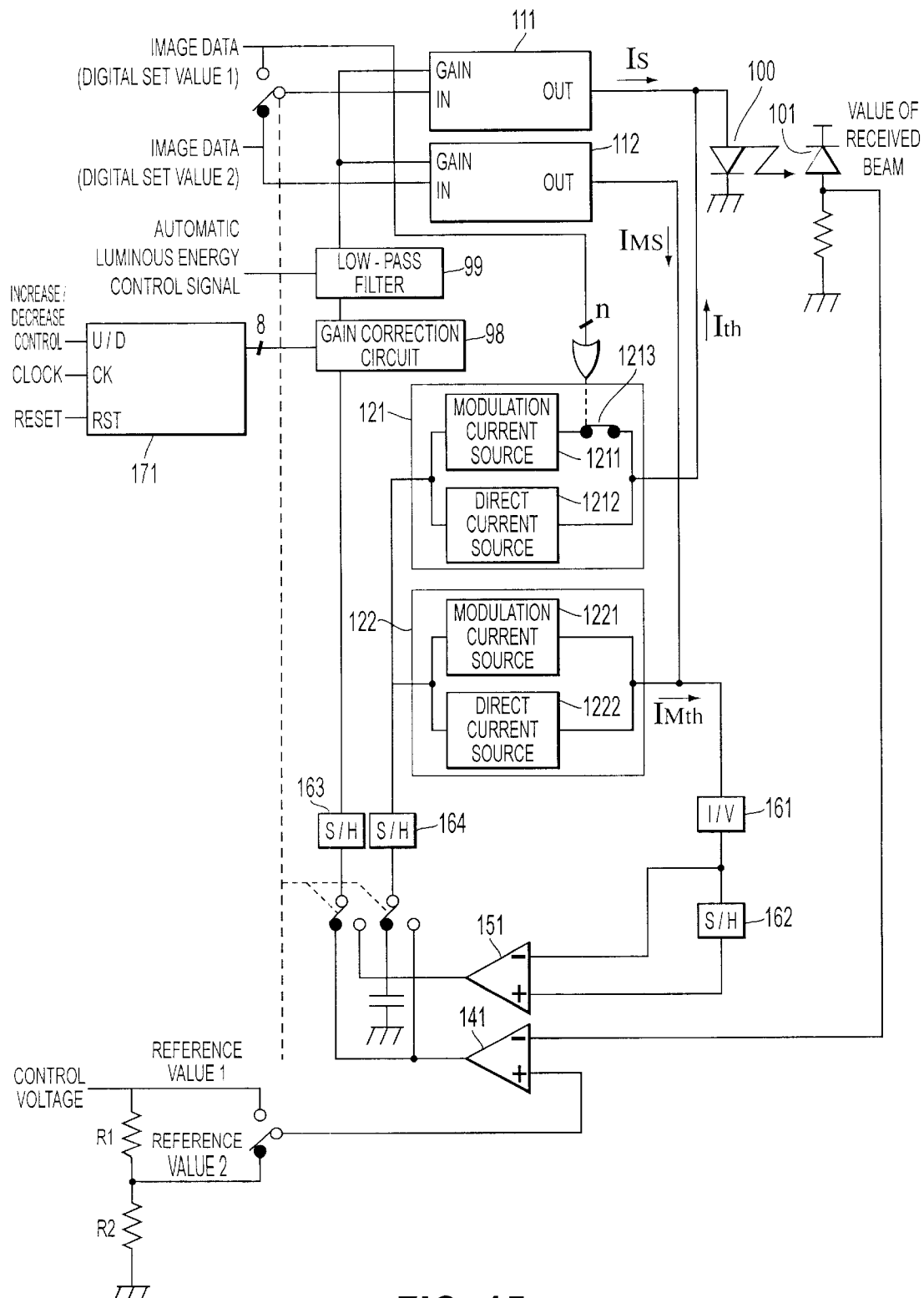
FIG. 15 is a block diagram showing a sixth embodiment of the laser driving apparatus according to the present invention.
Figure 16:
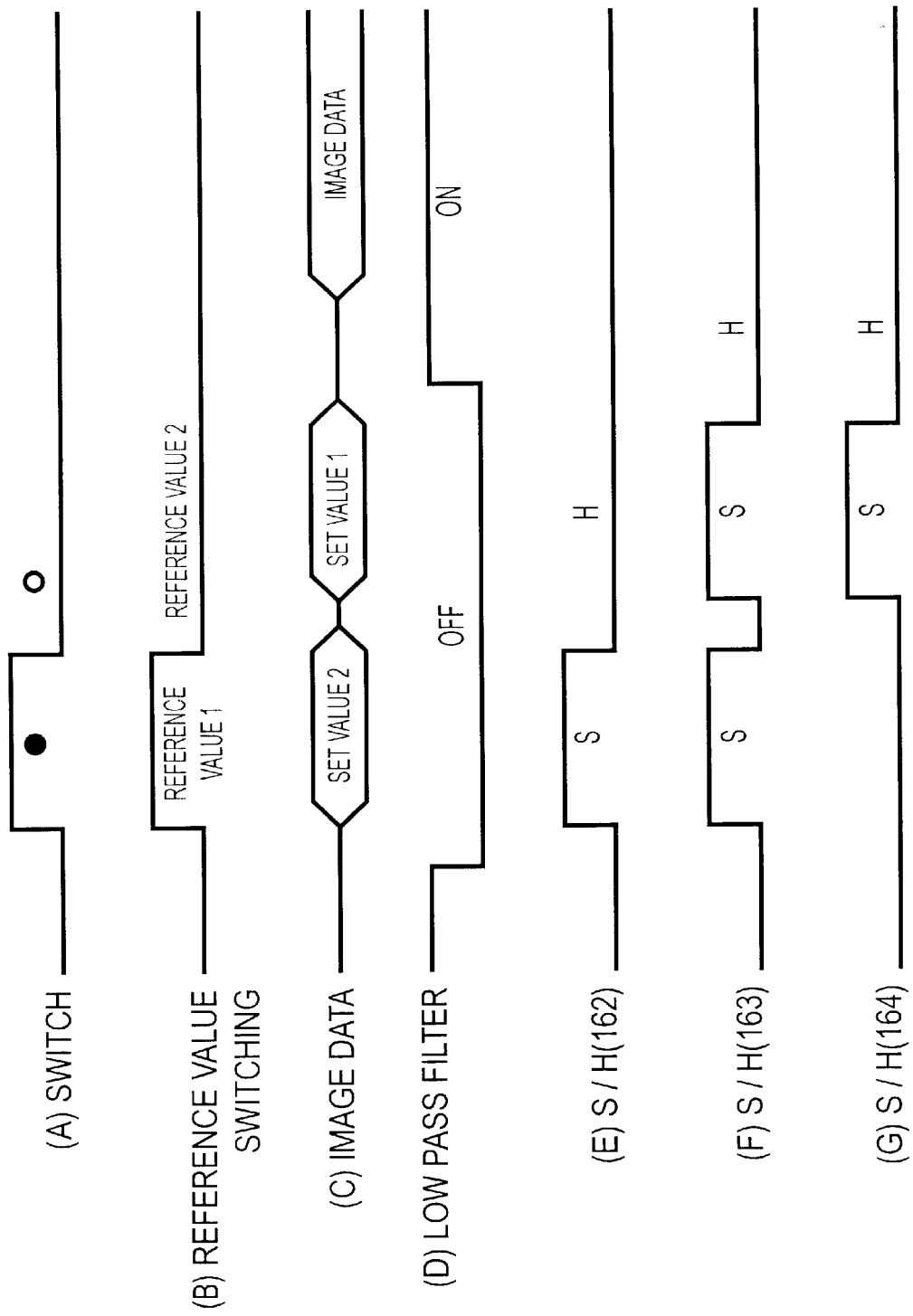
FIG. 16 is a timing chart showing the operation of the sixth embodiment shown in FIG. 15.

FIG. 15 is a block diagram showing a sixth embodiment of the laser driving apparatus according to the present invention and FIG. 16 is a timing chart showing the operation of the sixth embodiment shown in FIG. 16.

In a laser driving apparatus shown in FIG. 15, a first D/A converter 111, a second D/A converter 112, a threshold current source 121 composed of a modulation current source 1211 and a direct current source 1212, a mirror threshold current source 122 composed of a modulation current source 1221 and a direct current source 1222, a first operation amplifier 141, a second operation amplifier 151, an I/V converter 161, a first sample-hold circuit 162, second and third sample-hold circuits 163 and 164, a gain correction circuit 98, a low-pass filter 99, an updown counter 171 and plural change-over switches are provided. These change-over switches except the switch 1213 are all simultaneously switched, a state connected to a terminal shown by a black circle (a stable shown by a black circle in FIG. 16 (A)) is called a first step and a state switched to a terminal shown by a white circle is called a second step.

The first D/A converter 111 is equivalent to the modulation current source in the present invention, image data or a digital set value is input from a digital signal input terminal IN, analog current having a current value according to the input image data or set value is output from an analog output terminal OUT and supplied to a semiconductor laser 100 as modulation current Is. A control terminal GAIN is provided to the first D/A converter 111, a gain control signal generated by multiplying a gain set value by a correction coefficient in a gain correction circuit 98 is further input from the control terminal GAIN via a low-pass filter 99 and in the first D/A converter 111, the gain of an analog current value for the input image data or digital set value is regulated according to the input gain control signal, In automatic luminous energy control, in a first mode, a set value 2 shown in FIG. 10 is input to the first D/A converter 111 and when the first mode is switched to a second mode, the set value 2 is input.

The second D/A converter 112 composes a section of the monitor value generation circuit in the present invention and the similar digital input terminal IN, control terminal GAIN and analog output terminal OUT to those in the first D/A converter 111 are provided. However, in this embodiment, the second D/A converter is composed so that modulation current IMS for monitoring having a current value of 10% to the same digital set value and the same gain set value is output, compared with the first converter 111. The object is to reduce the power consumption of a laser driving apparatus 110 and to set monitor current to a level at which it can accurately monitor, for example, modulation current Is is normally 10 mA or more and if modulation current for monitoring IMS more than 1 mA equivalent to $\frac{1}{10}$ of the modulation current Is is secured, sufficient noise margin can be secure. Only the digital set value 2 is input to the second D/A converter 112 independent of a first step and a second step in automatic luminous energy control.

The threshold current source 121 is equivalent to the threshold current source in the present invention, a current control signal is input to the threshold current source 121, bias current Ith having a current value according to the input current control signal is generated in the threshold current source 121 and supplied to the semiconductor laser 100 together with modulation current Is output from the first D/A converter 111. The threshold current source 121 is composed of two current sources of the modulation current source 1211 and the direct current source 1212, the modulation current source 1211 of these is constituted so that the on-off of the switch 1213 on the output side is controlled by image data and the semiconductor laser 100 is prevented from being made to emit by threshold current by turning off the switch 1213 when image data is zero, that is, when a laser beam is not emitted. The two current sources 1211 and 1212 are mirror current sources to which the same current control signal is input and they are set so that if a current value when current output from the two current sources 1211 and 1212 in automatic luminous energy control is added is 100%, modulation operation is started after the luminous energy control is finished, image data is zero and in a state which current from the current source 1211 is not added, a current value is normally approximately 80% because of a laser beam emission delay and wrong emission. This value can be regulated by varying the ratio of mirror current.

The same current control signal as the current control signal input to the threshold current source 121 is input to the mirror threshold current source 122 and the mirror threshold current source outputs threshold current for monitoring IMth equivalent to $\frac{1}{10}$ of threshold current Ith output from the threshold current source 121. This mirror threshold current source 122 is also composed of the two current sources of the modulation current source 1221 and the direct current source 1222 as the threshold current source 121, it is because the configuration of the mirror threshold current source is matched with that of the threshold current source 121, these two current sources 1221 and 1222 are connected in both input and output and integrated so that they function as one current source. The mirror threshold current source 122 composes a section of the monitor value generation circuit in the present invention together with the above second D/A converter 112.

The I/V converter 161 outputs a voltage signal (called monitor voltage) equivalent to the sum (hereinafter, current equivalent to the sum is called monitor current) of current which flows into the I/V converter 161, that is, modulation current for monitoring IMS output from the second D/A converter 112 and threshold current for monitoring IMth output from the mirror threshold current source 122. The monitor voltage is input to the sample-hold circuit 162 and in this sample-hold circuit 162, monitor voltage when the first mode is switched to the second mode is held.

A value of a received beam acquired because a part of beams emitted from the semiconductor laser 100 is received by a photodiode 101 and a reference value according to a mode (a reference value 2 in the first mode and a reference value 1 in the second mode) are input to the first operation amplifier 141. The values of these reference values 1 and 2 are different and both are equivalent to the first reference value in the present invention. A signal output from the first operation amplifier 141 is input to the first D/A converter 111 and the second D/A converter 112 as a gain control signal via the sample-hold circuit 163, the gain correction circuit 98 and the low-pass filter 99 in the first mode, and input to the threshold current source 121 and the mirror threshold current source 122 as a current control signal via the sample-hold circuit 164 in the second mode. In the second step, the first operation amplifier 141 is equivalent to the current control value generation circuit in the present invention.

Monitor voltage via the sample-hold circuit 162 and monitor voltage before it is input to the sample-hold circuit 162 are input to the second operation amplifier 151. The second operation amplifier 151 is effective in the second step, final monitor voltage in the first step is held in the first sample-hold circuit 162, and the held monitor voltage (equivalent to the second reference value in the present invention) and the current monitor voltage in the second step are input to the second operation amplifier 151. A signal output from the second operation amplifier 151 is input to the first D/A converter 111 and the second D/A converter 112 as a gain control signal via the second sample-hold circuit 163 in the second step.

The second and third sample-hold circuits 163 and 164 are provided to switch automatic luminous energy control, that is, feedback control and open-loop control, in automatic luminous energy control described here, in the first step, the third sample-hold circuit 164 is in a hold state in which input is sample-held and the second sample-hold circuit 163 is in a through state in which input is output as it is, in the second step, both sample-hold circuits 163 and 164 are in a through state and when automatic luminous energy control operation is finished, a gain set signal which is a signal output from the second operation amplifier 141 at that time (in the second step) and a current control signal which is a signal output from the first operation amplifier 141 are respectively held until the next automatic luminous energy control is started.

Next, the automatic luminous energy control operation of the laser driving apparatus shown in FIG. 12 will be described.

First, change-over switches shown in FIG. 12 are set so that they are in a state shown in FIG. 12 (in the first step), and the first sample-hold circuit 162, the second sample-hold circuit 163, the gain correction circuit 98 and the low-pass filter 99 are all set to a through state.

Then, the digital set value 2 shown in FIG. 13 is input to the first and second D/A converters 111 and 112, and modulation current Is according to the set value 2 and modulation current for monitoring IMS are output. In the first step, for threshold current Ith and threshold current for monitoring IMth respectively output from the threshold current source 121 and the mirror threshold current source 122, each current value corresponding to each value held in the sample-hold circuit 164 last time shall be set as each initial value.

Modulation current Is output from the first D/A converter 111 and threshold current Ith output from the threshold current source 121 are merged and supplied to the semiconductor laser 100, and the semiconductor laser 100 emits with luminous energy according to the merged supply current Is+Ith. The emission is monitored by the photodiode 101 and a value of a received beam is input to the first operation amplifier 141. In the first step, the reference value 2 is input to the first operation amplifier 141, a signal output from the first operation amplifier 141 passes the second sample-hold circuit 163 in a through state, the gain correction circuit 98 and the low-pass filter 99 as it is and input to the first and second D/A converters 111 and 112 as a gain control signal, the gain of the first D/A converter 111 is regulated so that the semiconductor laser 100 emits with emission power P2 shown in FIG. 10 corresponding to the reference value 2 and as a result, the gain of the second D/A converter 112 is also regulated.

In the meantime, modulation current for monitoring IMS output from the second D/A converter 112 and having a current value equivalent to $\frac{1}{10}$ of modulation current Is and threshold current for monitoring IMth output from the mirror threshold current source 122 and equivalent to $\frac{1}{10}$ of threshold current IB are merged and input to the I/V converter 161, monitor voltage corresponding to the merged monitor current is generated and input to the first sample-hold circuit 162. When the circuit is stabilized in the above state, the first step is switched to the second step and final monitor voltage in the first step is held in the first sample-hold circuit 162.

That is, in the first step, the semiconductor laser 100 emits with laser emission power P2 determined based upon the reference value 2 and monitor voltage having the information of a current value of supply current to the semiconductor laser 100 at that time is held in the first sample-hold circuit 162. The monitor voltage in the first step held in the first sample-hold circuit 162 is input to the second operation amplifier 151 as the second reference value in the present invention in the second step as described above. The set value 2, laser emission power P2 and the reference value 2 are related by the first step.

In the second step, the switches shown in FIG. 15 are respectively switched to the side of the white circle. In the second step, the second and third sample-hold circuits 163 and 164 both become a through state, and a first feedback circuit including the first operation amplifier 141 and a second feedback circuit including the second operation amplifier 151 are simultaneously operated. In the second step in which the switches shown in FIG. 15 are respectively switched to the side of the white circle, a digital set value 1 shown in FIG. 13 is input to the first D/A converter 111 and the reference value 1 is input to the first operation amplifier 141. However, in the second step, the digital set value 2 also continues to be input to the second D/A converter 112.

In the second step, as described above, a signal output from the first operation amplifier 141 passes the third sample-hold circuit 164 and input to the threshold current source 121 and the mirror threshold current source 122 as a current control signal, a signal output from the second operation amplifier 151 passes the second sample-hold circuit 163, the gain correction circuit 98 in a through state and the low-pass filter 99 and input to the first and second D/A converters 111 and 112 as a gain control signal.

In the second step, as the set value 2 continues to be input to the second D/A converter 112 as in the first step and as monitor voltage in the first step held in the first sample-hold circuit 162 and the current monitor voltage are input to the second operation amplifier 151, a signal output from the second operation amplifier 151 continues to control the gain of the first D/A converter 111 so that the semiconductor laser 100 emits with emission power P2 corresponding to the reference value 2 in case the set value 2 continues to be input to the first D/A converter 111 and a result, the gain of the second D/A converter 112 also continues to be controlled.

However, actually, as the set value 1 is input to the first D/A converter 111, modulation current Is having a current value according to the set value 1 is output from the first D/A converter 111 and supplied to the semiconductor laser 100 together with threshold current Ith. A beam emitted by the semiconductor laser 100 is monitored by the photodiode 101 and a value of a received beam is input to the first operation amplifier 141. In the second step, the reference value 1 is input to the first operation amplifier 141 and the current value of threshold current Ith output from the threshold current source 121 is regulated by a signal output from the first operation amplifier 141 so that the emission power of the semiconductor laser 100 is emission power P1 corresponding to the reference value 1. As a result, the current value of threshold current for monitoring IMth output from the mirror threshold current source 122 is also regulated.

For example, if the set value 2 continues to be input to the first D/A converter 111 after the first step is switched to the second step assuming that a current value as the initial value of threshold current Ith in the first step is zero, a condition that the semiconductor laser 100 keeps emission power P2 in the first step as it is met, actually, threshold current Ith output from the threshold current source 121 is increased so that the semiconductor laser 100 emits with emission power P1 corresponding to the reference value 1, the gain of the first D/A converter 111 is reduced and modulation current Is decreases. When a current value in the first step as the initial value of threshold current Ith is a value except zero, the similar measures are also taken and after the first step is switched to the second step, the current value of threshold current Ith and the gain of the first D/A converter 111 are regulated so that the above condition is met. Hereby, the straight line shown in FIG. 14 is defined. When a signal in the whole circuit is stabilized in the second step, the second and third sample-hold circuits 163 and 164 become a hold state, hereby, automatic luminous energy control is finished and open-loop control is started.

Figure 17:
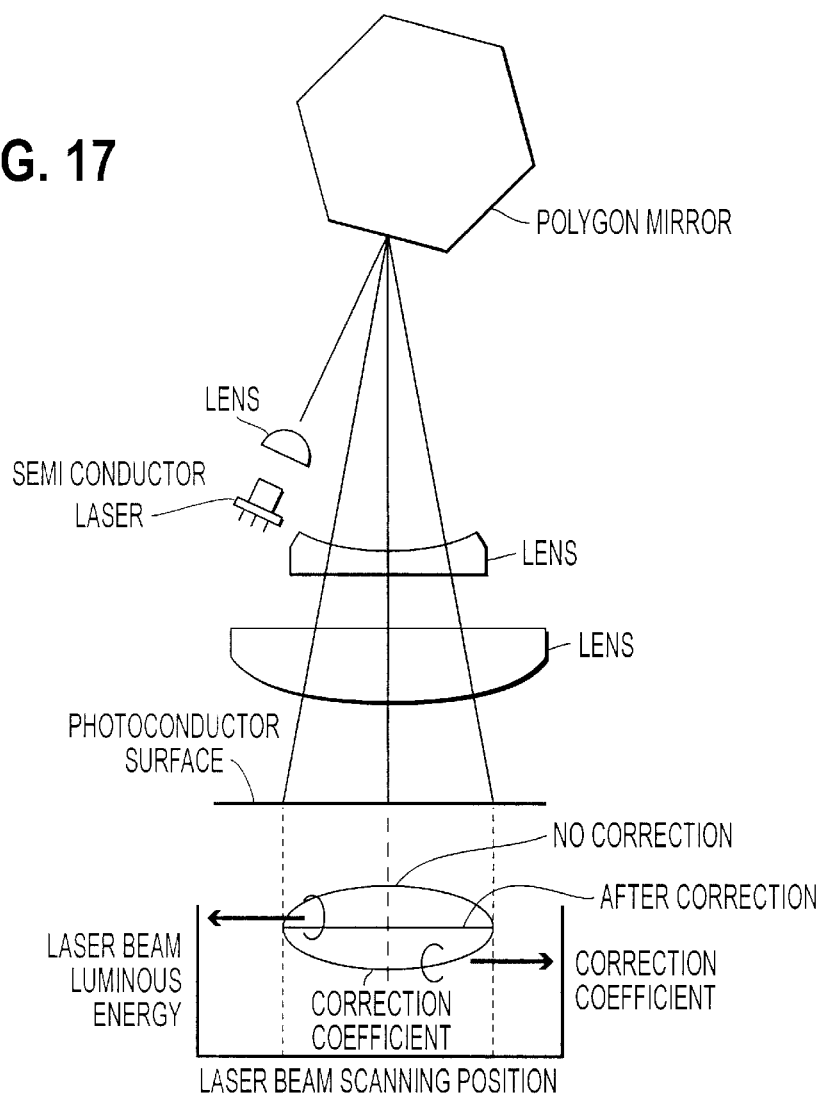
FIG. 17 is a schematic drawing showing the variation of luminous energy caused by a scanning optical system and a correction coefficient.
Figure 18:
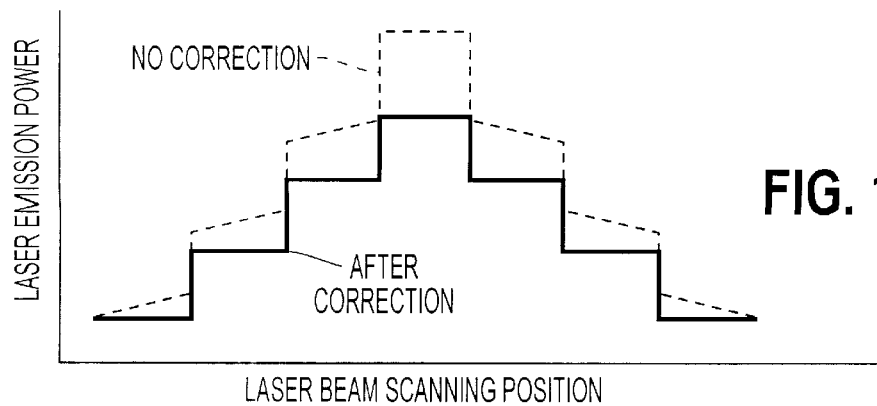
FIG. 18 shows laser emission power before and after correction in case intensity modulation is applied.
Figure 19:
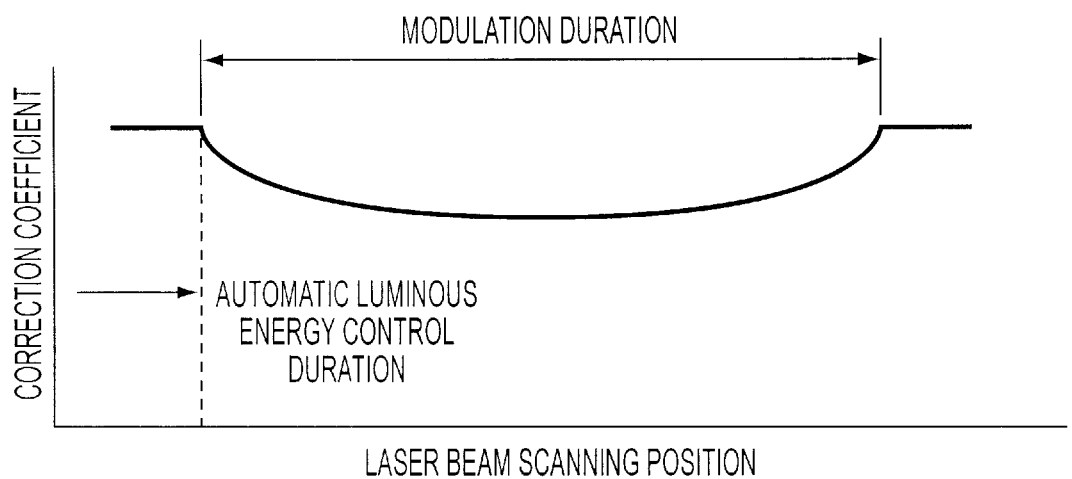
FIG. 19 shows a correction coefficient for a laser beam scanning position.

After open-loop control is started, the gain correction circuit 98 is operated and the low-pass filter 99 is operated. The correction coefficient of the gain correction circuit 98 when a coefficient in automatic luminous energy control executed outside an effective writing area is 1 can be acquired by calculating the inverse number of laser beam luminous energy on the surface of a photoconductor in case the semiconductor laser is emitted with fixed luminous energy as shown in FIG. 13 and a correction coefficient every scanning position is to be calculated beforehand. Therefore, a correction coefficient in automatic luminous energy control is 1. When writing is started, a correction coefficient is updated according to a scanning position. In the above updating, a correction coefficient can be calculated with the small number of signals by using an up-down counter 171 to which an increasing/a decreasing signal, a clock pulse and a reset pulse for switching countup operation and countdown operation are input shown in FIG. 15. As a curve of laser beam luminous energy not corrected shown in FIG. 17 shows, as in an optical system according to laser xerography, normally, luminous energy is low at the end and is high in the center, a correction coefficient is set to 1 in automatic luminous energy control, a correction coefficient is decreased as a scanning position approaches the center and is increased up to 1 when the scanning position passes the center. The low-pass filter 99 arranged at the subsequent stage of the gain correction circuit 98 is inserted to prevent luminous energy from suddenly varying and to prevent a stripe from being formed on an image when a correction coefficient is varied in digital control. Hereby, the correction of luminous energy distribution caused by the scanning optical system is enabled. A graph after correction shown in FIG. 18 shows correction in case intensity modulation is also applied. As the threshold current source is set as the output destination of threshold current and laser beam luminous energy is proportional to a digital set value input to the D/A converter 11 and a correction coefficient every scanning position, luminous energy distribution is guaranteed even if intensity modulation is applied. FIG. 19 shows a correction coefficient for a laser beam scanned position. In automatic luminous energy control, a correction coefficient is normally set to 1, however, as described later, a value except 1 can be also selected if necessary.

Figure 20:
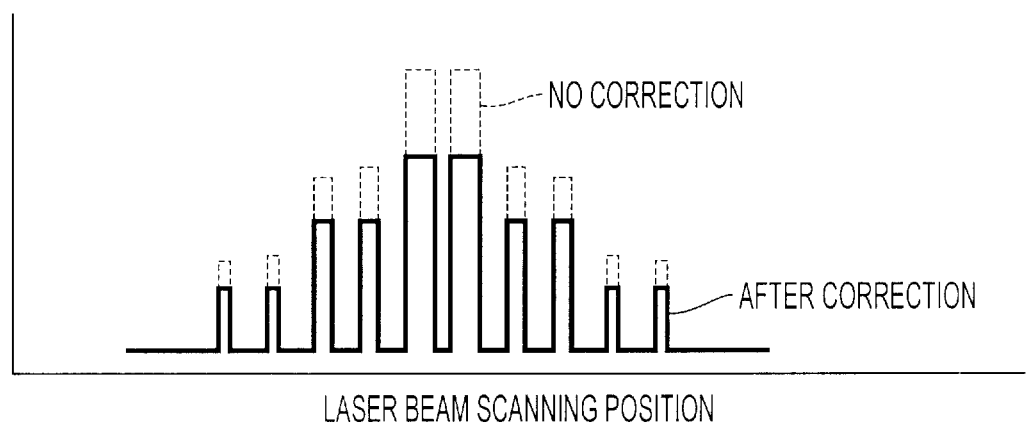
FIG. 20 shows laser emission power before and after correction in case pulse length modulation is also applied.

FIG. 20 shows a case that pulse length modulation is further applied and as described above, in this case, the correction of luminous energy is also suitably made.

According to the embodiment shown in FIG. 16, even if external environment such as temperature and humidity varies in laser xerography or even if a reference value of laser beam luminous energy is varied because of the variation of the density of an image and the variation of setting by an operator, not only the variation of a correction coefficient in pulse length modulation (PWM) is not required by the on/off of fixed laser beam luminous energy but the variation of a correction coefficient is also not required in intensity modulation using plural current sources in case high speed is required in a video frequency. That is, according to the embodiment shown in FIG. 15, as a correction coefficient of luminous energy distribution on a laser beam scanned surface and an intensity set value in intensity modulation are multiplied, arbitrary image data can be corrected in regularly fixed ratio without varying a correction coefficient. As a correction coefficient is also not required to be varied in the case of intensity modulation, the gain correction circuit 98 has only to be provided with a frequency characteristic which follows the updating of a correction coefficient in a laser beam scanned position on a scanned surface and therefore, current control using an operation amplifier regularly used can sufficiently function.

Figure 21:
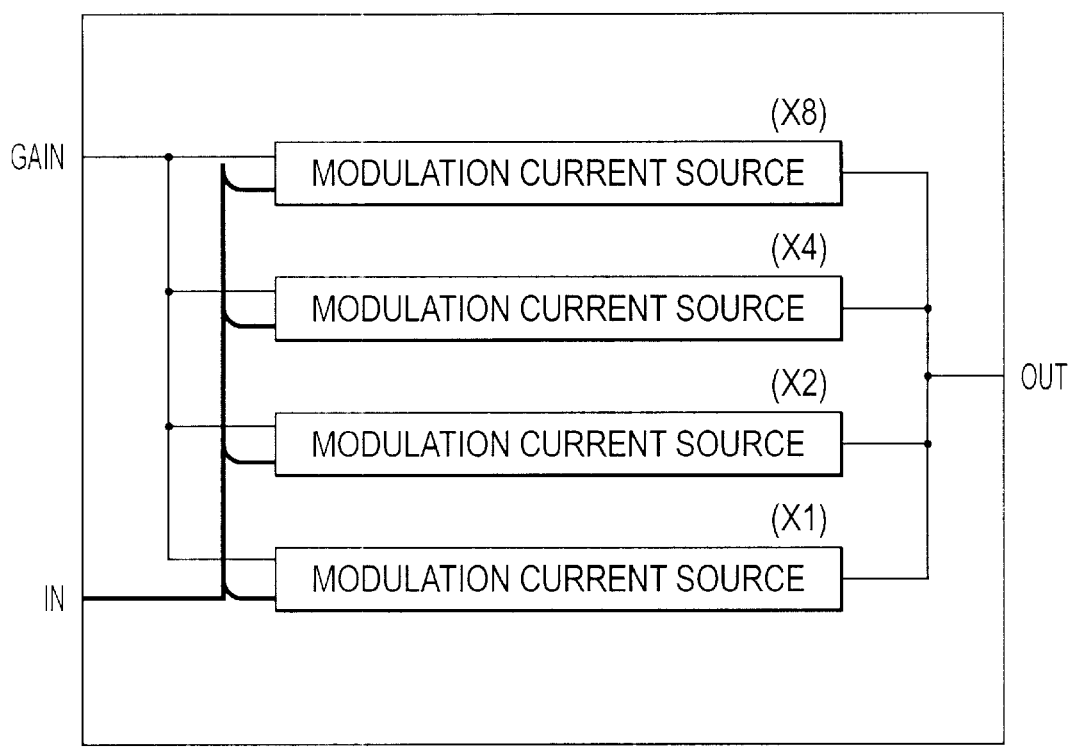
FIG. 21 is a block diagram showing the internal configuration of a D/A converter.

FIG. 21 is a block diagram showing the internal configuration of the first and second D/A converters 111 and 112.

These D/A converters are respectively composed of plural (four in this case) modulation current sources as the modulation current source 13 described referring to FIG. 3.

These modulation current sources are respectively composed so that current having a different current value is output and current equivalent to the total of current output from the modulation current source turned on according to image data (a set value) is output.

Figure 22:
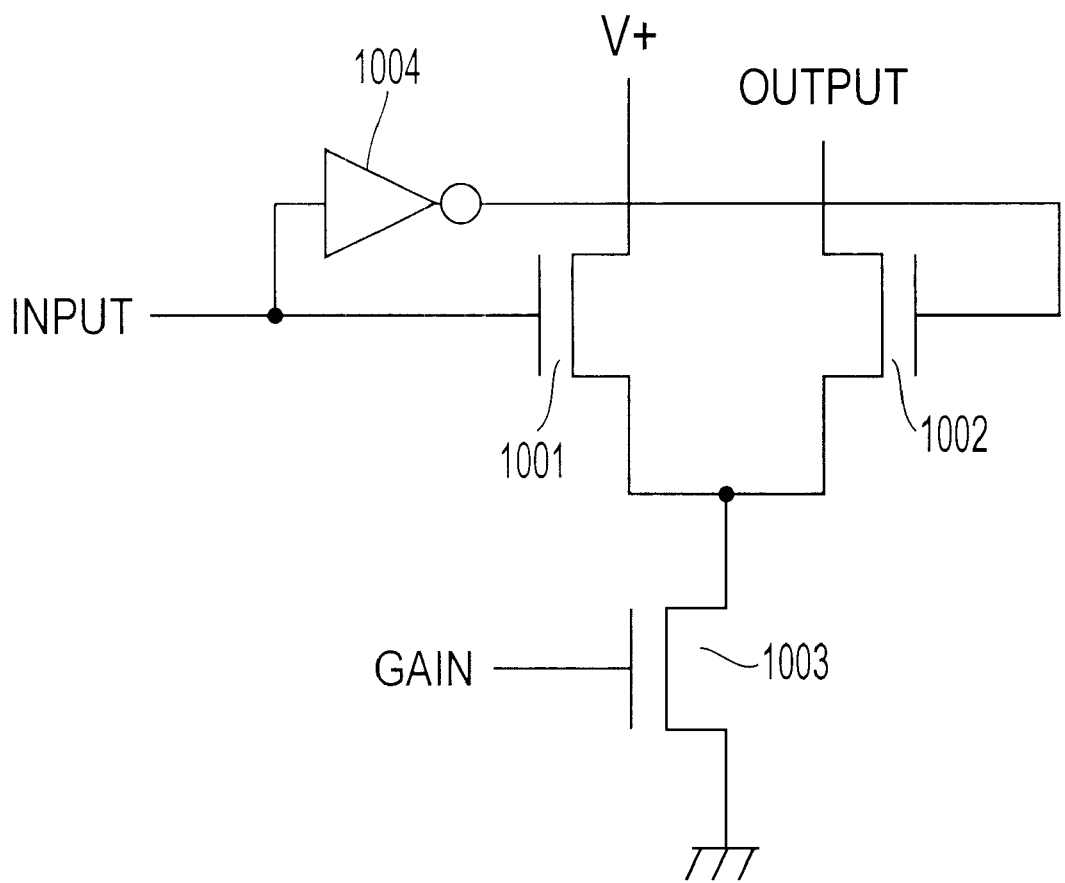
FIG. 22 is a circuit diagram showing one modulation current source or one direct current source.

FIG. 22 is a circuit diagram showing one modulation current source shown in FIGS. 15 and 21 or one direct current source.

In FIG. 22, three transistors 1001, 1002 and 1003 and one inverter 1004 are shown and the current value of output current is determined based upon a value of voltage input to the gate of the transistor 1003. When input is at a high level, current flows via the transistor 1001 and the transistor 1003, therefore, output is off, when input is at a low level, current flows via the transistor 1002 and the transistor 1003 and therefore, output is on.

Figure 23:
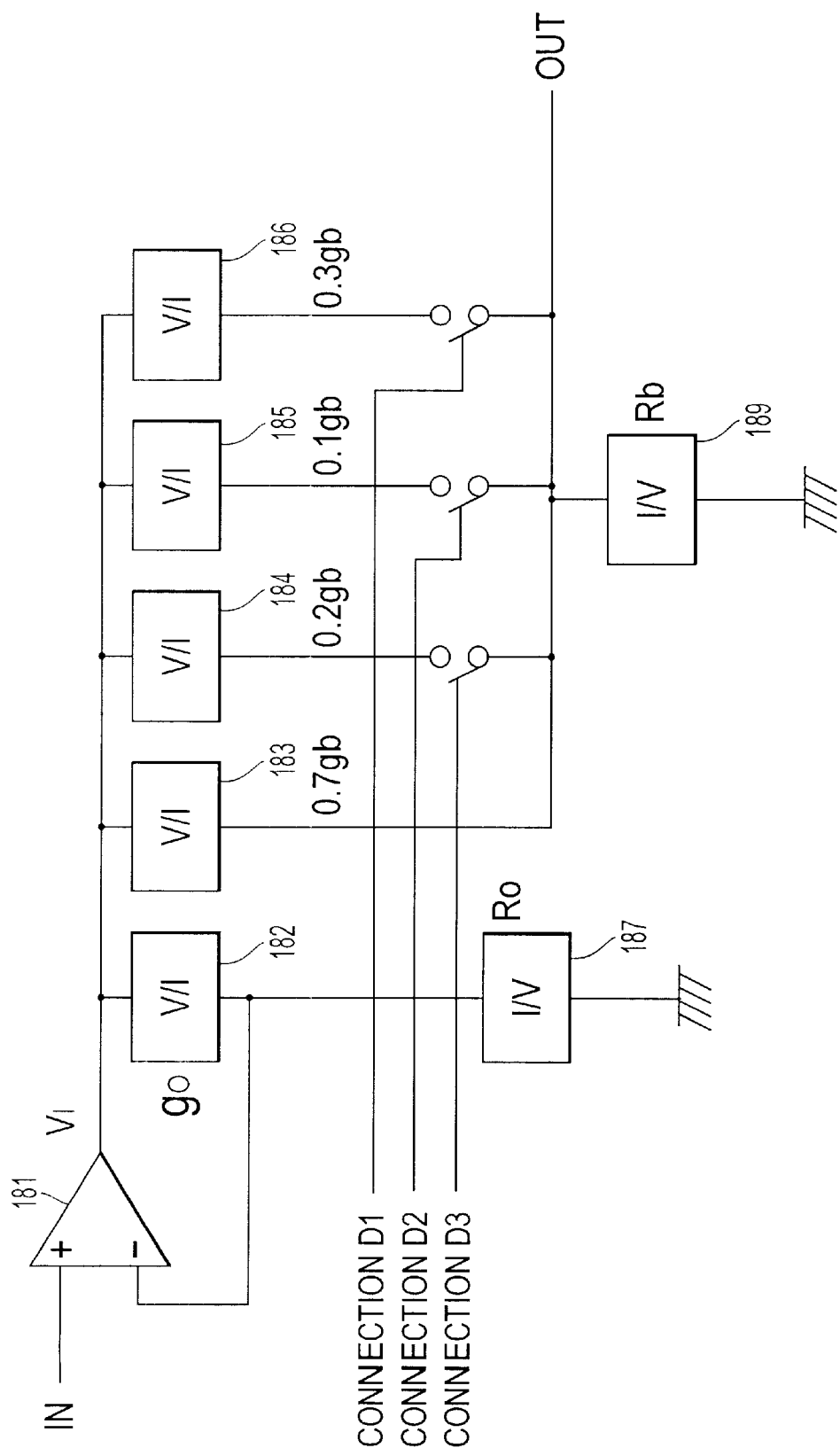
FIG. 23 is a block diagram showing a gain correction circuit.

FIG. 23 is a block diagram showing the gain correction circuit.

A comparator 181, V/I converters 182 to 186, I/V converters 187 and 189 compose a constant current circuit and the output of the comparator 181 is controlled so that the output voltage of the I/V converter 187 is equal to input IN. Further, its output terminal is connected to the V/I converters 182 to 186 connected in parallel. The V/I converters 182 to 186 connected in parallel output current weighed with the same control voltage input. Further, switches are provided to the circuit and controlled by digital data (correction D1, D2, D3) holding a correction coefficient.

The meaning of each symbol in FIG. 23 is as follows:

Ra: Resistance value of I/V converter 187

Rb: Resistance value of I/V converter 189 ga: Conductance (Inverse number of resistance value) of V/I converter 182

0.7ga: Conductance (Inverse number of resistance value) of V/I converter 183

0.2ga: Conductance (Inverse number of resistance value) of V/I converter 184

0.1ga: Conductance (Inverse number of resistance value) of V/I converter 185

0.3ga: Conductance (Inverse number of resistance value) of V/I converter 186

VI: Output voltage of amplifier 181

The condition of IN/OUT will be described below.

The output voltage of the amplifier 181 is acquired as follows.

$$VI = (IN/Ra) \cdot (1/ga) \tag{17}$$

Current I flowing into the I/V converter 189 is acquired as follows.

$$I = VI \times \{0.7 \times gb + 0.2 \times gb \times D3 + 0.1 \times gb \times D2 + 0.3 \times gb \times D1\} \tag{18}$$

Output voltage OUT is acquired as follows.

$$OUT = Rb \times VI \times \{0.7gb + 0.2gb\, D3 + 0.1gbD2 + 0.3gbD1\} \tag{19}$$

If D1=1, D2=0 and D3=0, the condition of IN=OUT is acquired as follows.

$$IN = (IN/Ra) \cdot (1/ga) \cdot Rb \times 1 \times gb \therefore Raga = Rbgb \tag{20}$$

Table 1 shows correspondent relationship between the on/off of correction D1, D2 and D3 and a correction coefficient.

TABLE 1

|  | Correction D1 | Correction D2 | Correction D3 | Correction co-efficient |
|---|---|---|---|---|
| State 1 | Off | Off | Off | 0.7 |
| State 2 | Off | On | Off | 0.8 |
| State 3 | Off | Off | On | 0.9 |
| State 4 | On | Off | Off | 1.0 |
| State 5 | Off | On | On | 1.0 |

TABLE 1-continued

|  | Correction D1 | Correction D2 | Correction D3 | Correction co-efficient |
|---|---|---|---|---|
| State 6 | On | On | Off | 1.1 |
| State 7 | On | Off | On | 1.2 |
| State 8 | On | On | On | 1.3 |

Figure 24:
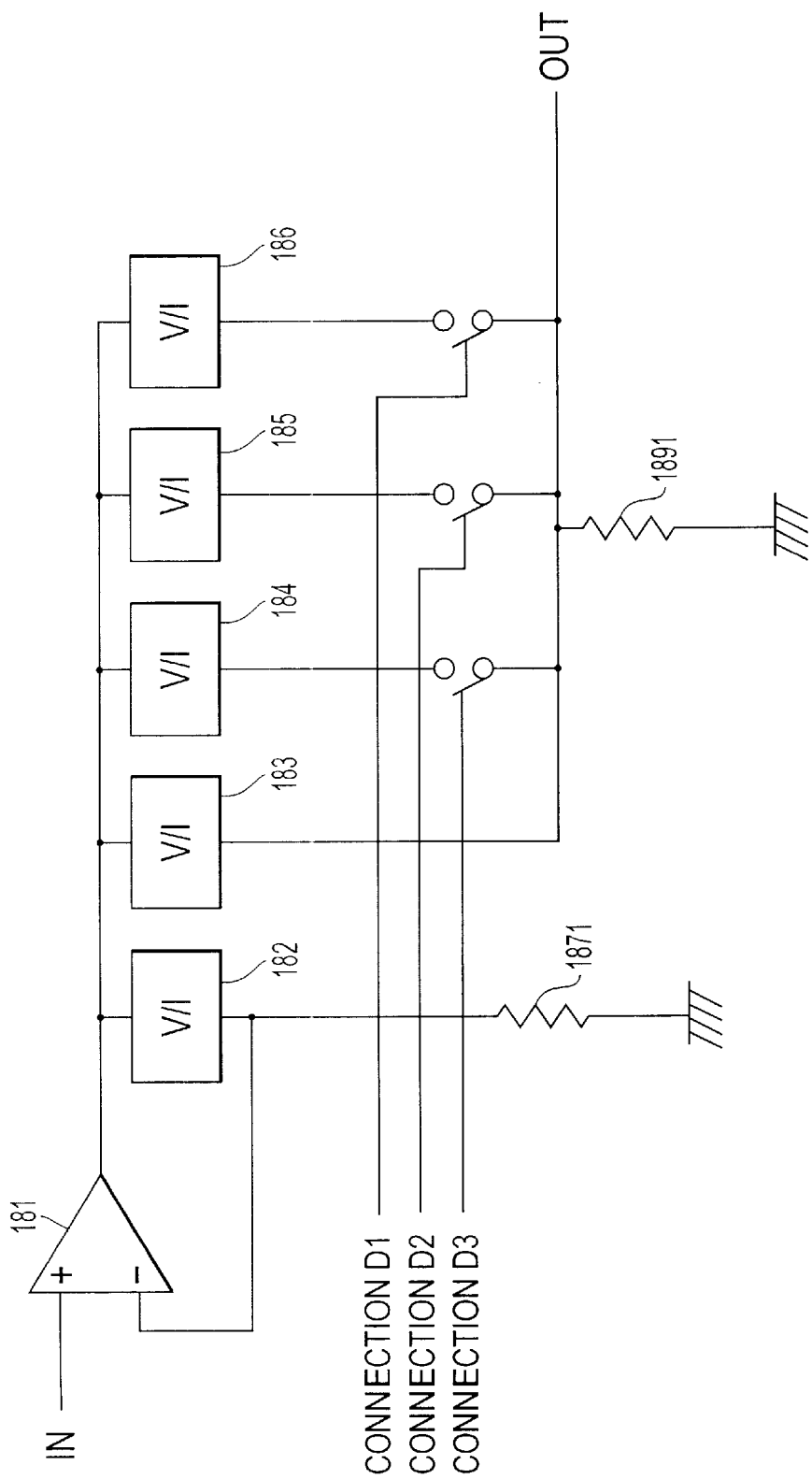
FIG. 24 is a block diagram showing a gain correction circuit.
Figure 25:
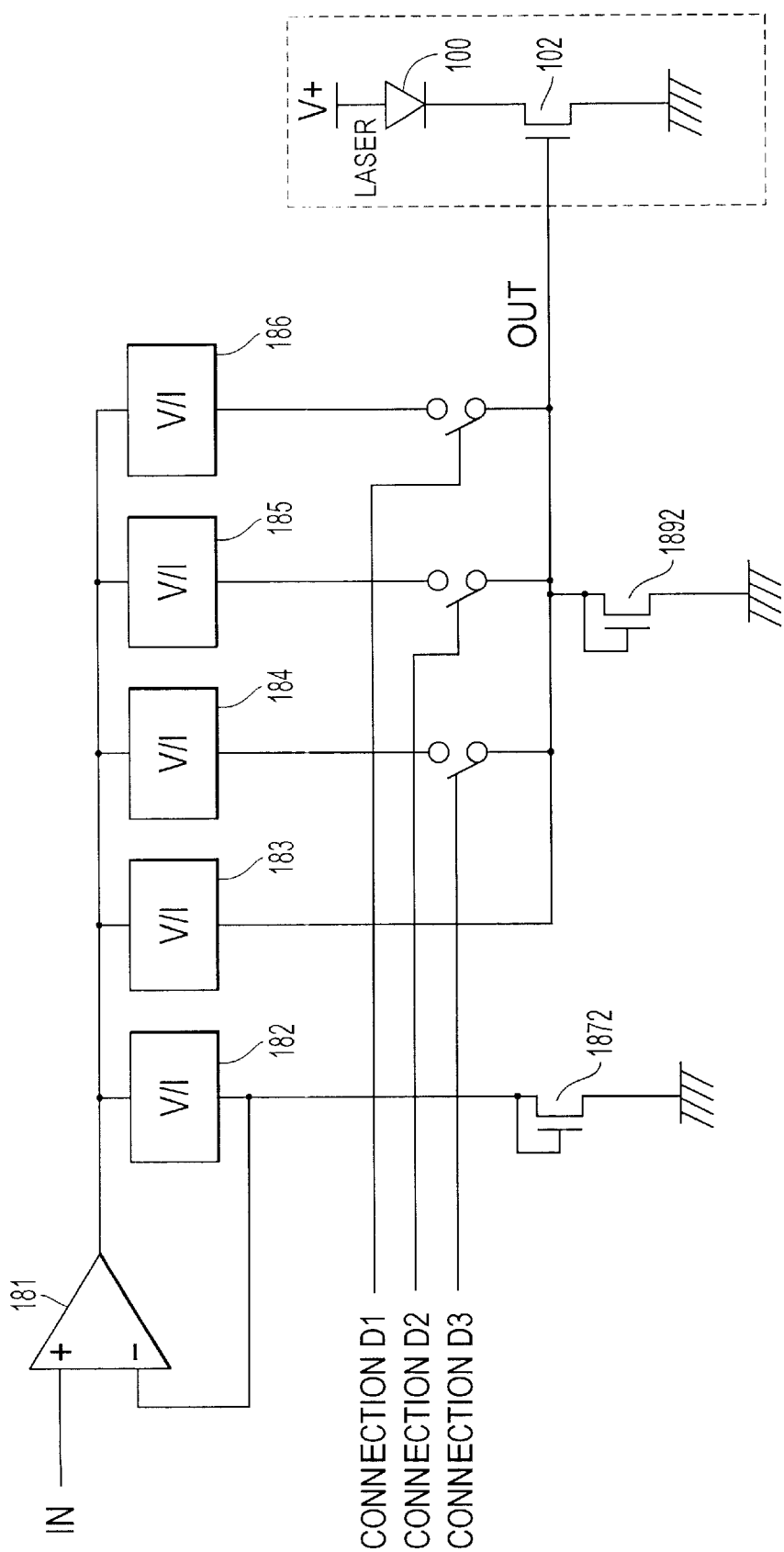
FIG. 25 is a block diagram showing a gain correction circuit.

When correction D1 is turned on, the corresponding switch is closed and current equivalent to VI×gb·(0.3+0.7) flows from the V/I converter 183 and the I/V converter 186 to the I/V converter 189. If the ratio of conductance between the I/V converter 187 and the I/V converter 189 is equal to the ratio between each current of the total of current respectively flowing in the resistor of the I/V converter 187 and the resistor of the I/V converter 189 connected to an output terminal OUT (RaGa=Rbgb), output potential equal to input potential is acquired. This is the reason why a correction coefficient 1 is required and automatic luminous energy control is normally executed in this state. Further, output can be varied in a range of ±0.3 for input IN when the input IN is 1 in FIG. 23 by varying correction D1, D2 and D3. FIG. 24 shows a case in which the simplest resistors 1871 and 1891 are used for an I/V converter. Further, FIG. 25 shows a case in which transistors 1872 and 1892 are used for an I/V converter and in the configuration, the semiconductor laser 100 can be directly driven by connecting an output terminal OUT to the control electrode (gate) of a transistor 102 having the same characteristics as the transistor 1892 and driving at low voltage is enabled.

Figure 26:
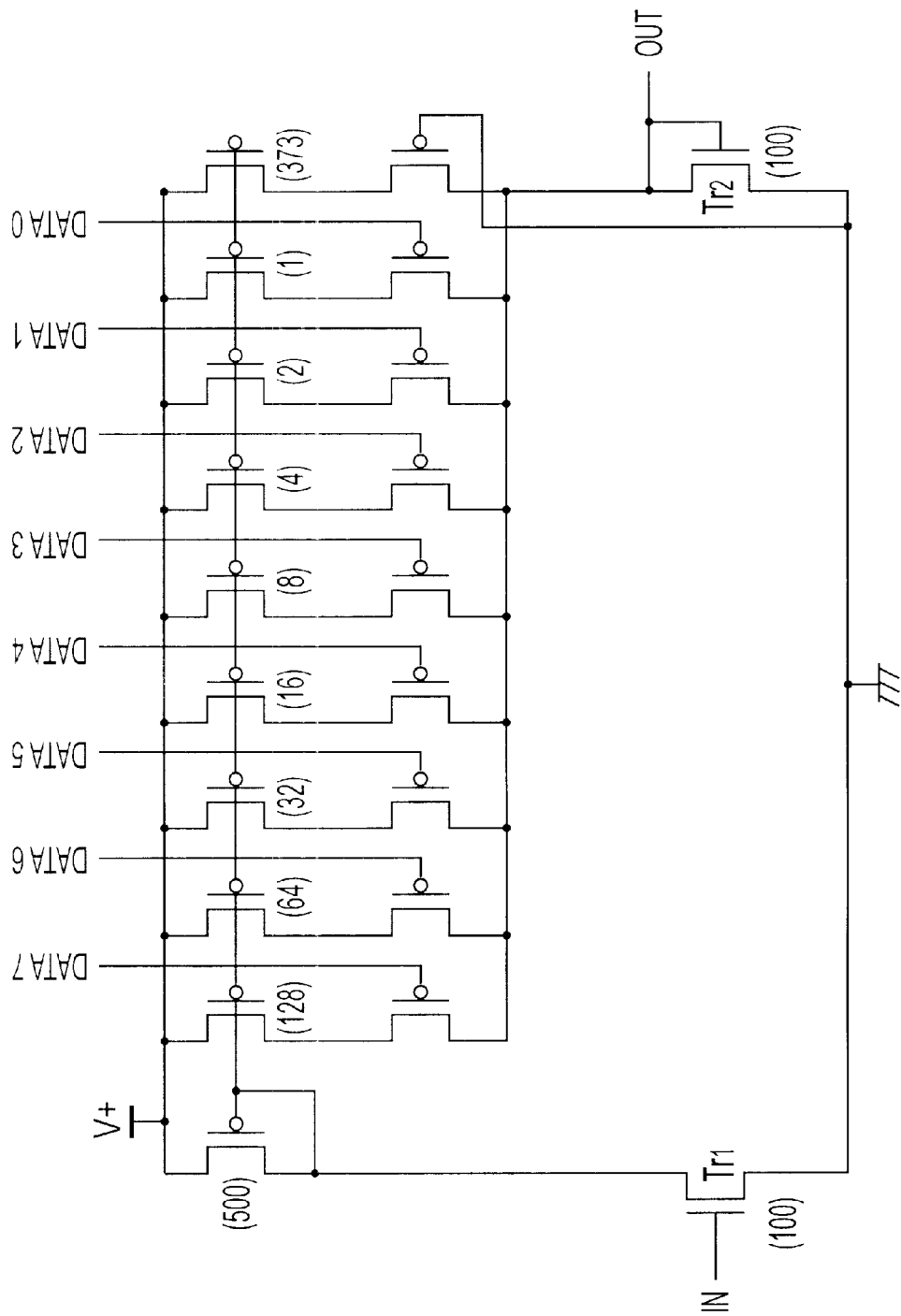
FIG. 26 is a block diagram showing a gain correction circuit including transistors.

FIG. 26 is a circuit diagram showing a gain correction circuit including transistors. Basically, the V/I converters shown in FIG. 25 are replaced with transistors, input voltage is directly applied to a transistor and the amplifier 181 is omitted. The subscript of each transistor denotes mutual conductance gm. When data 0 to data 6 are turned on (a low level) and data 7 is turned off (a high level) in case the mutual conductance of a transistor for input is 500, the total of mutual conductance of the transistors each switch of which is fixed to on and the mutual conductance of which is 373 is 500 and if each mutual conductance of Tr1 and Tr2 respectively connected to IN and OUT is set so that it is equal, a correction coefficient is 1. If a correction coefficient is to be set so that it has a value larger than 1, the transistor the mutual conductance of which is 128 is turned on. In this example, a correction coefficient which can be varied between 373/500 and 628/500 at ±128 steps can be acquired by controlling data 0 to data 7. In automatic luminous energy control, it is not necessarily required that a correction coefficient is 1. The reason is that in the embodiment shown in FIG. 15, if automatic luminous energy control is executed according to negative-feedback control, luminous energy is regulated so that it has a reference value even if a correction coefficient is set to any value. Therefore, if automatic luminous energy control is executed using a correction coefficient of 373/500 for example, 1 in which is a value in automatic luminous energy control to 628/373 are corrected and the upper limit of correction can be raised. Conversely, if the gain correction circuit is set so that it has a value of 628/500 and automatic luminous energy control is executed, 1 to 373/628 are corrected and the lower limit value can be lowered. However, attention is to be paid because the stability of a negative-feedback loop and the precision of convergence are slightly influenced in case in automatic luminous energy control, the gain correction circuit is set so that it has a value except 1.

Figure 27:
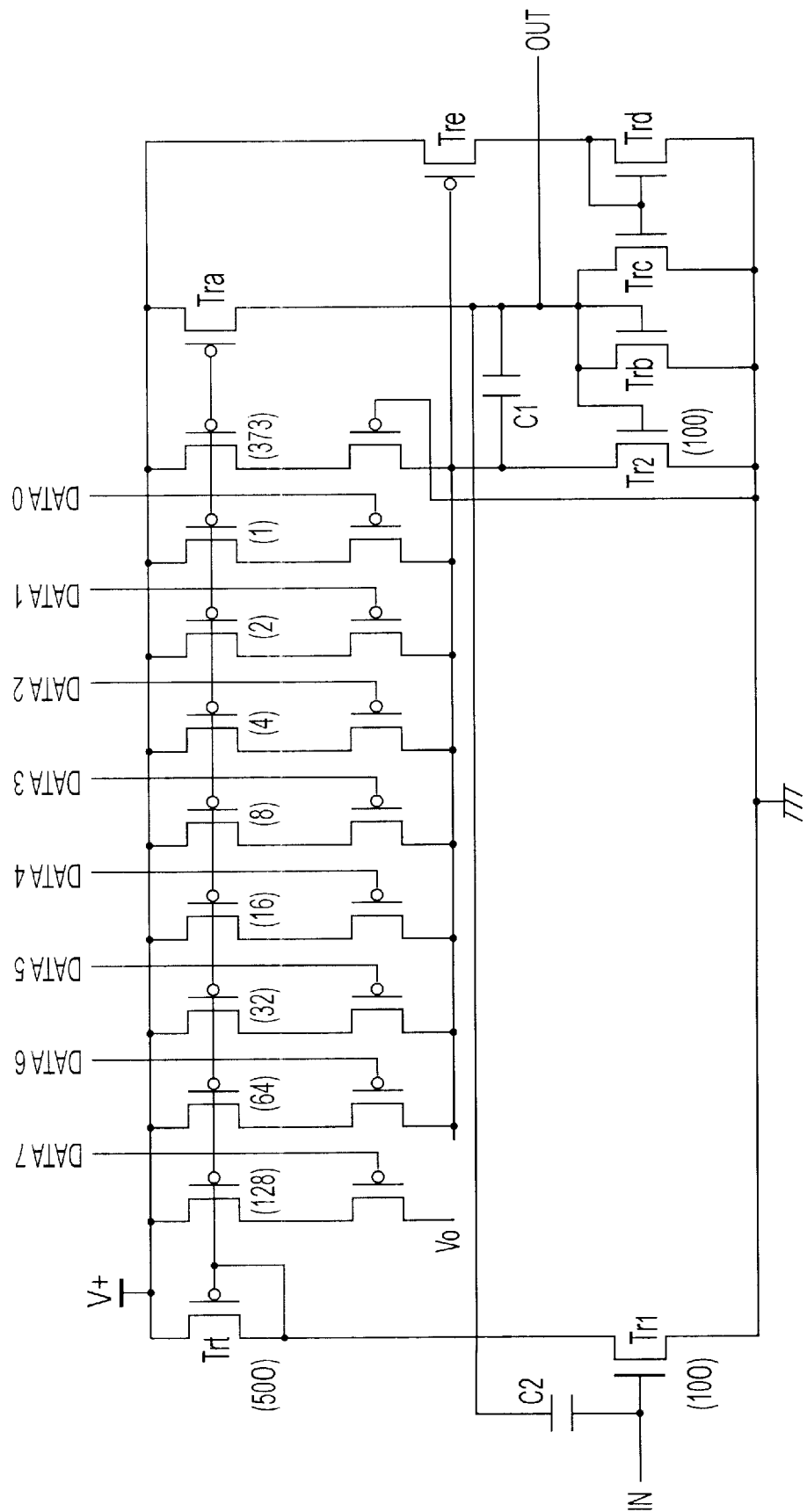
FIG. 27 is a block diagram showing a gain correction circuit including transistors.

FIG. 27 shows a gain correction circuit acquired by improving the gain correction circuit shown in FIG. 26, a negative-feedback circuit composed of transistors Tra, Trb, Trc, Trd and Tre is provided to prevent mirror current from varying depending upon voltage between the drain and the source and a correction factor is prevented from being off from its designed value by bringing the potential Vn of the drain close to the potential of the drain of the transistor Tr1 for input. A capacitor C1 is inserted to compensate the phase of an internal feedback circuit and a capacitor C2 is a capacitor for bypass to prevent oscillation due to the phase lag of a negative-feedback loop in automatic luminous energy control when the potential of input IN is low and mirror current is decreased.

Figure 28:
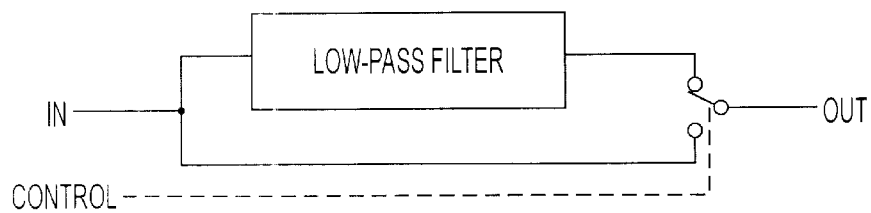
FIG. 28 is a block diagram showing a low-pass filter.
Figure 29:
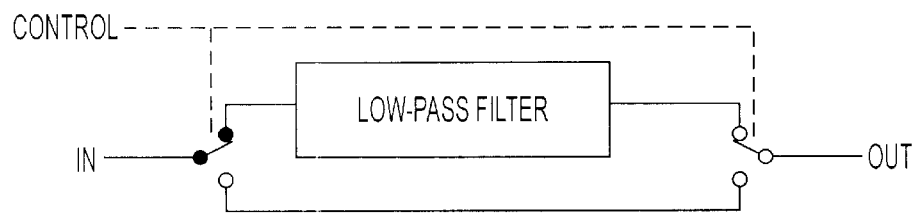
FIG. 29 is a block diagram showing a low-pass filter.
Figure 30:
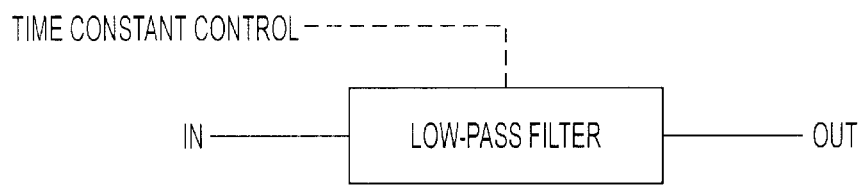
FIG. 30 is a block diagram showing a low-pass filter.
Figure 31:
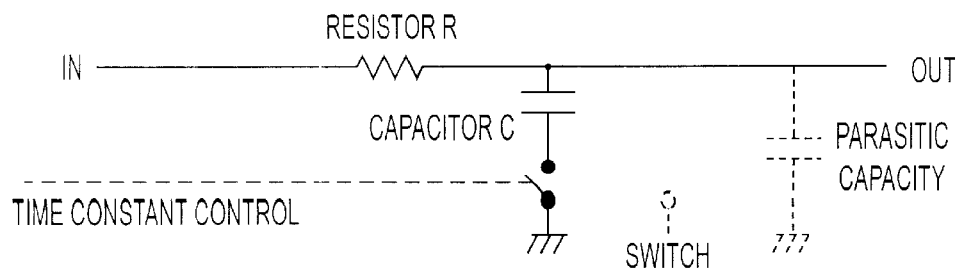
FIG. 31 is a circuit diagram showing a low-pass filter composed so that the time constant is controlled.

FIGS. 28 to 30 are block diagrams respectively showing a low-pass filter 99 connected to the subsequent stage of the gain correction circuit. In automatic luminous energy control, the low-pass filter 99 is required to be turned off because oscillation is caused because of a phase lag. FIG. 28 shows a method of bypassing by a switch. FIG. 29 also shows a method of bypassing by a switch, however, as both input and output are switched by each switch, the stability of negative feedback in automatic luminous energy control can be secured by turning off the switch in case the low-pass filer viewed from IN is heavy as a load. FIG. 30 shows a method of controlling a time constant in place of bypassing by switches. Concretely, in the case of a primary low-pass filter between C and R shown in FIG. 31, the grounding terminal of a capacitor is controlled by a switch. When the switch is open, the time constant of the low-pass filter is determined based upon resistance R and parasitic capacity and the similar effect to bypassing a low-pass filter is acquired. When the switch is turned on, the time constant is determined based upon resistance R and capacity C. It is desirable that a time constant determined based upon C and R is set to at least 10 times of the cycle of a picture signal considering that the low-pass filter is provided to prevent the sudden variation of laser beam luminous energy when a correction coefficient is varied. When the time constant is close to the cycle of a picture signal, a stripe appears on an image and the quality of an image may be deteriorated. If no low-pass filter is provided in case the resolution of the gain correction circuit 98 is high, the deterioration of the quality of an image is not caused, however, if a differential non-linear error is small and resolution is high, it is inevitable that the cost is increased by the quantity. Conversely, as the time constant does not follow the change of a correction coefficient in case the correction coefficient is suddenly varied if the time constant is too large, the time constant is required to be determined based upon both the quality of an image and followability. Particularly as laser diode modulation current for a vertical scanning position on a photoconductor described in the Unexamined Japanese Patent Application Publication No. Hei 9-197316, as a correction coefficient is regularly increased/decreased and does not converge in the case of zigzag approximation, there is a problem that a fixed offset error is made according to the rate of the increase or decrease of a correction coefficient between the input and output of the low-pass filer if the time constant is large and the effect of offset is also required to be considered.

Figure 32:
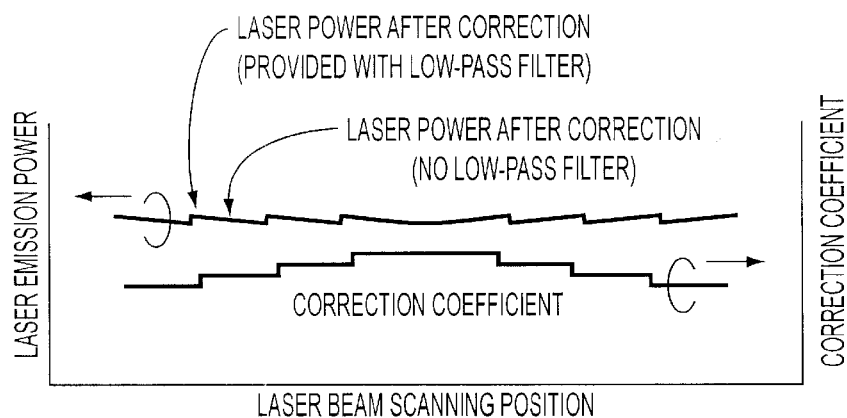
FIG. 32 schematically shows the effect of the low-pass filter.

FIG. 32 shows the effect of the low-pass filter. If a correction coefficient is controlled by a digital value, a correction coefficient varies like a step when input data varies. The variation causes the variation of laser beam luminous energy, finally causes the variation of the density of an image and deteriorates the quality of an image. For a countermeasure against it, a low-pass filter is inserted to prevent a correction coefficient from suddenly varying when input data varies, hereby, laser power smoothly varies and the quality of an image can be prevented from being deteriorated by the sudden variation of the density.

Figure 33:
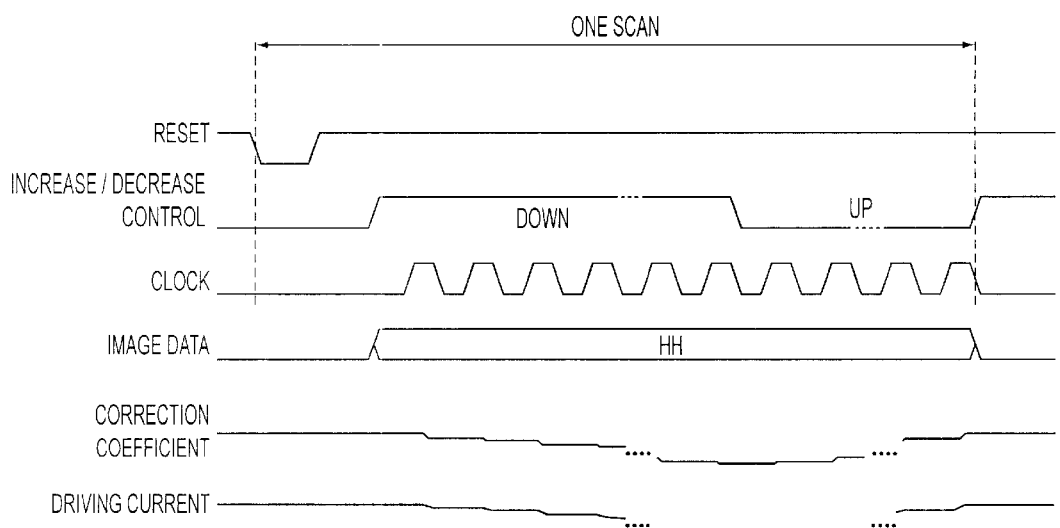
FIG. 33 is a timing chart showing an updown counter.

FIG. 33 is a timing chart of the updown counter 171 shown in FIG. 15.

A reset pulse is input to the updown counter 171 at the start timing of one scan (one vertical scan), subtraction control in increase/decrease control is executed in the former half of one scan and the count value of the updown counter 171, that is, a correction coefficient is sequentially decreased according to a clock pulse. In the latter half of one scan, addition control is executed and the count value, that is, a correction coefficient is sequentially increased. When image data is temporarily kept a fixed value (at a high level in this case), modulation current Is is also sequentially decreased in the former half of one scan and is sequentially increased in the latter half. Hereby, as described referring to FIG. 16, the variation that luminous energy is increased in the center of one scan of luminous energy due to the scanning optical system is corrected.

Figure 34:
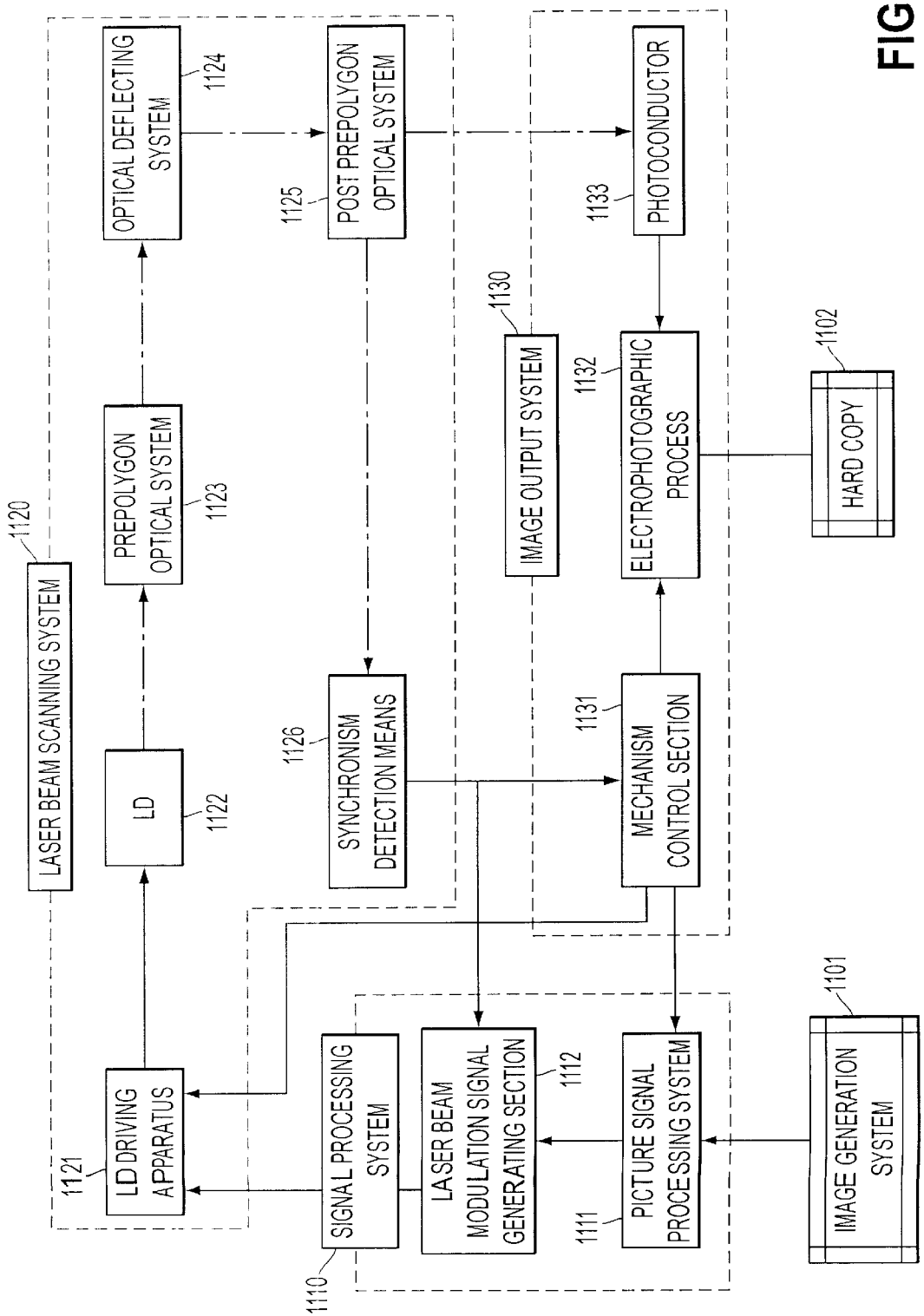
FIG. 34 is a block diagram showing an embodiment of an image recording device according to the present invention.
Figure 35:
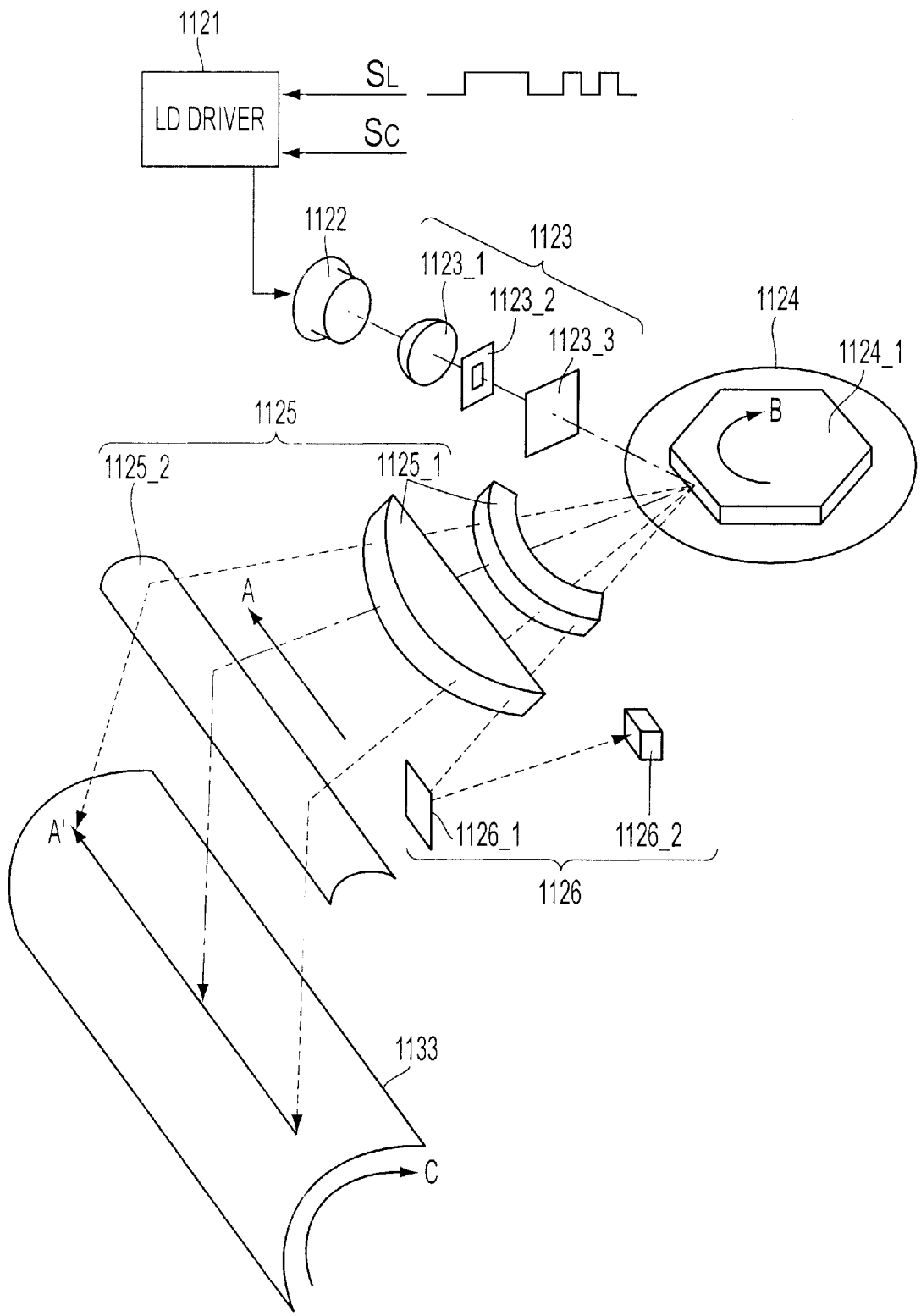
FIG. 35 is a block diagram showing an embodiment of a laser beam scanner according to the present invention.

FIG. 34 is a block diagram showing an embodiment of the image recording device according to the present invention and FIG. 35 shows a laser beam scanning system of the image recording device shown in FIG. 34 and shows an embodiment of the laser beam scanning system according to the present invention.

The configuration of the image recording device shown in FIG. 34 is roughly divided into a signal processing system 1110, a laser beam scanning system 1120 and an image output system 1130. When a picture signal acquired in an image generation system 1101 such as a digital scanner which acquires a picture signal by reading an image is input to a picture signal processing system 1111 composing the signal processing system 1110, the picture signal processing system 1111 receives control information such as a developing condition from a mechanism control section 1131 for controlling the mechanism of an electrophotographic process composing the image output system 1130, suitable image processing, for example gradation processing and color correction processing are applied to the input picture signal so that the input picture signal is suited to the control information and the picture signal after image processing is applied is input to a laser modulating signal generating section 1112. The laser modulating signal generating section 1112 generates a laser modulating signal showing the intensity of the modulation of a laser beam emitted from a semiconductor laser 1122 composing the laser beam scanning system 1120 based upon the input picture signal. In the generation of a laser modulating signal, information from the synchronism detection means 1126 of a scanning laser beam composing the laser scanning system 1120 is received and a laser modulating signal is generated so that it is synchronized with laser beam scanning. The synchronism detection means 1126 of a scanning laser beam is composed of a mirror 1126_1 and a photodiode 1126_2 as shown in FIG. 35 in this embodiment and a synchronization pulse is output from the photodiode 1126_2 every time a laser beam emitted from the semiconductor laser 1122 is once deflected in a direction shown by an arrow A in FIG. 35.

A laser modulating signal SL generated in the laser modulating signal generating section 1112 shown in FIG. 34 is input to a laser driving apparatus 1121 composing the laser scanning system 1120. Mechanism control information SC from the mechanism control section 1131 is also input to the laser driving apparatus 1121 and the laser driving apparatus 1121 drives the semiconductor laser 1122 according to mechanism control. The semiconductor laser 1122 emits a laser beam to which intensity modulation in time sequence is applied by driving by the laser driving apparatus 1121, the emitted laser beam is repeatedly deflected in the direction shown by the arrow A by an optical deflecting system 124 including a polygon mirror 1124_1 rotated in a direction shown by an arrow B via a prepolygon optical system 1123 composed of a lens 1123_1, an aperture 1123_2 and a cylindrical lens 1123_3, and further, the emitted laser beam is repeatedly scanned vertically in a direction shown by an arrow A' on a photoconductor 1133 rotated in a direction shown by an arrow C and composing the image output system 1130 via a postpolygon optical system 1125 composed of an fθ lens 1125_1 and a cylindrical mirror 1125_2.

The photoconductor 1133 is provided with a character that the resistance of the surface varies by the irradiation of a beam and an electrostatic latent image is formed on the surface by scanning the surface by a laser beam holding image information. The electrostatic latent image formed on the photoconductor 1133 is transferred on predetermined paper via a predetermined electrophotographic process 1133 and the hard copy 1102 of an image which a picture signal acquired in the image generation system 1101 holds is generated.

Figure 36:
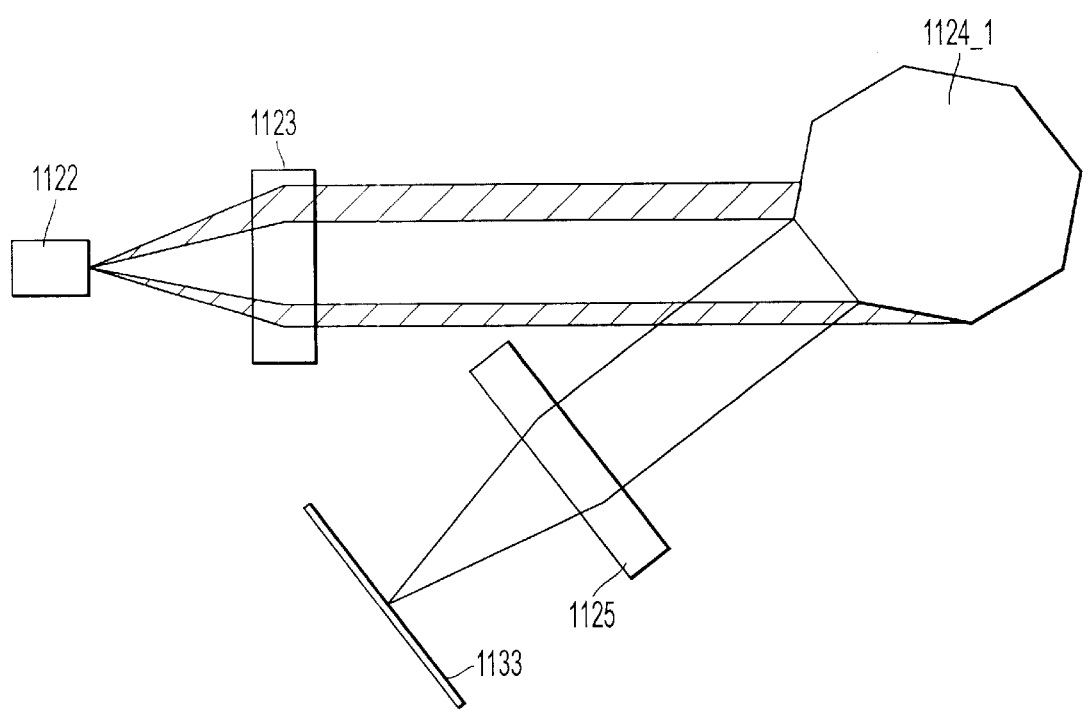
FIG. 36 shows relationship between the beam diameter of a laser beam and a polygon mirror.
Figure 37:
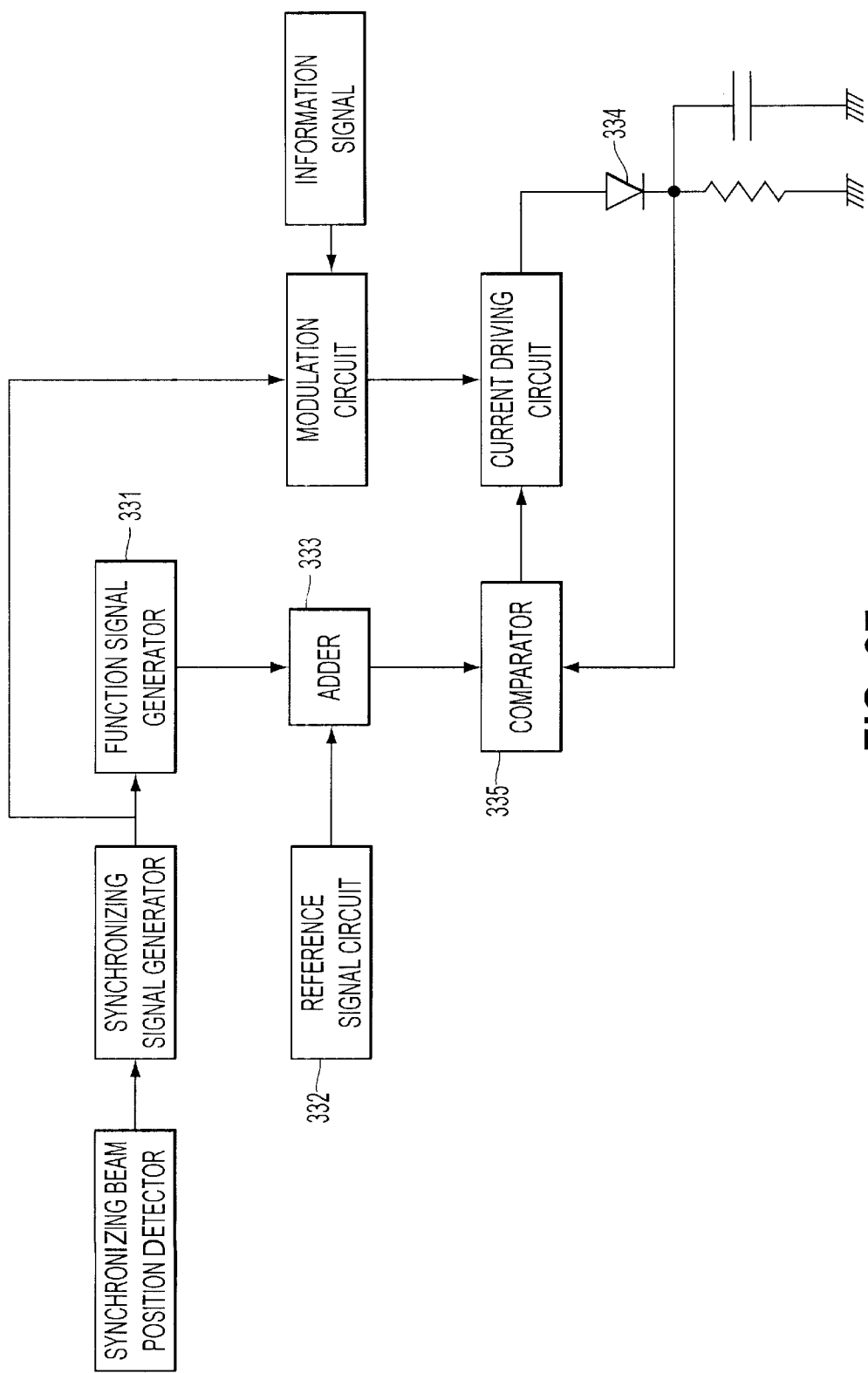
FIG. 37 shows an example of a conventional type method disclosed in the Examined Japanese Patent Publication Application No. Hei 2-51188.
Figure 38:
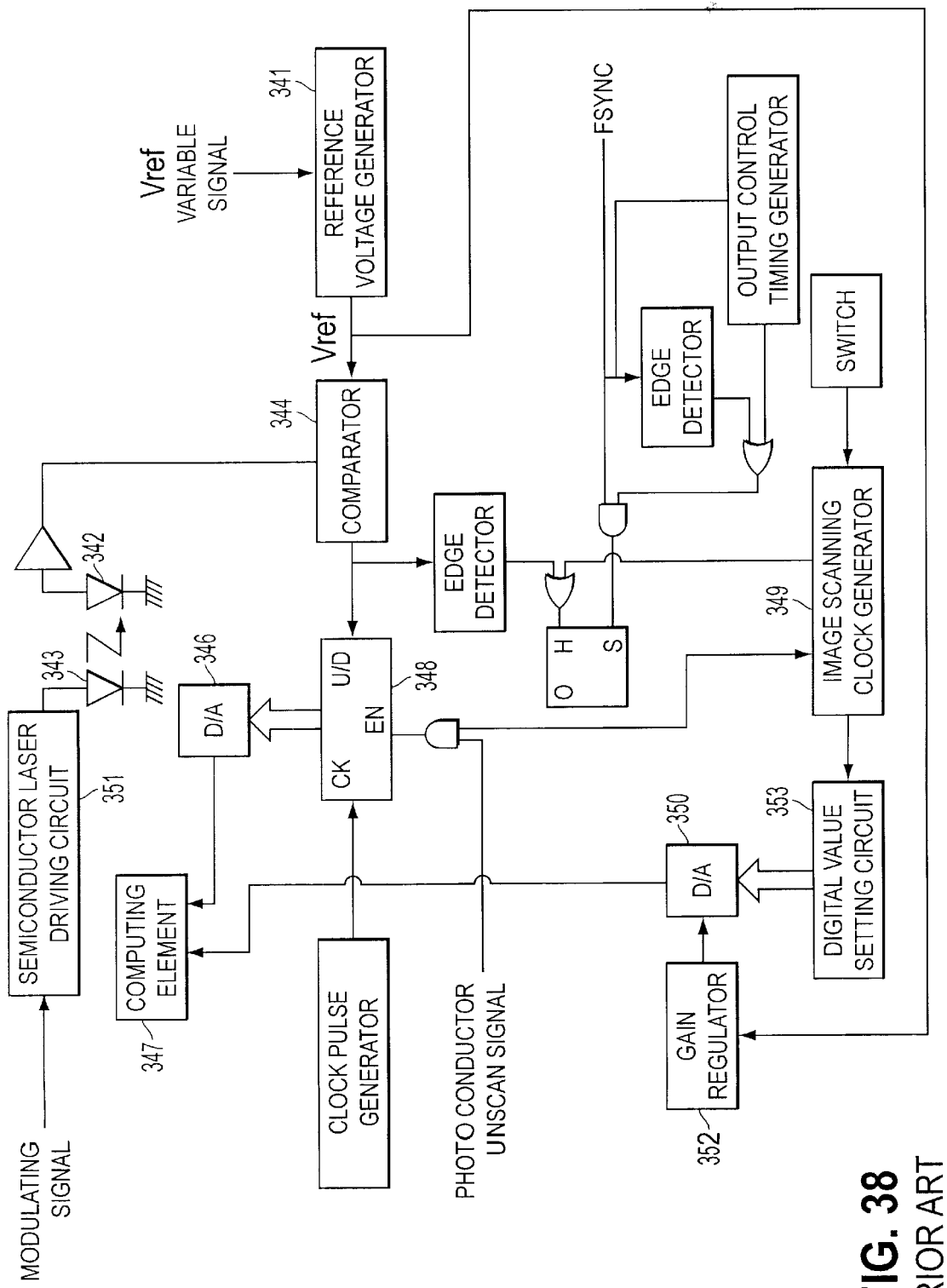
FIG. 38 shows another example of a conventional type method disclosed in the Unexamined Japanese Patent Publication Application No. Hei 1-182819.

FIG. 36 shows relationship between the beam diameter of a laser beam and a polygon mirror.

A laser beam emitted from the semiconductor laser 1122 is shown by one line in FIG. 35, however, actually, the emitted laser beam is regulated by the prepolygon optical system 1123 so that it has a beam diameter exceeding the dimension of one mirror of plural mirrors composing the polygon mirror 1124_1 and is incident on the polygon mirror 1124_1. Such relationship is called "over filled". In this case, a part of laser beams is not used for scanning, however, as the quantity of laser beams is originally much, it is not a large problem. In this case, as a beam diameter is allowed to be projected from a mirror, the dimension of each mirror composing the polygon mirror 1124_1 can be reduced, thereby, the polygon mirror can be made further polygonal and high-speed scanning is enabled.

However, in this case, the rate of laser beams incident on a mirror is varied depending upon the rotational angle of the polygon mirror 1124_1 and the variation of luminous energy on the photoconductor 1133 increases.

For the laser driving apparatus 1121 in this embodiment, the laser driving apparatus equivalent to any embodiment of the present invention is used. Therefore, according to the image recording device according to the present invention and composed as described above, the variation of the density of an image caused by the variation of luminous energy on the photoconductor 1133 caused by the scanning optical system is suppressed and high quality of image recording is enabled.

The phenomenon of "over filled" in which the beam diameter of a laser beam irradiated on the polygon mirror 1124_1 is larger than the diameter of one mirror composing the polygon mirror 1124_1 is described above, however, in the case of small beam diameter smaller than the dimension of one mirror, the variation of luminous energy may be also caused by the scanning optical system and when the variation exceeds an allowable level, the correction of luminous energy is similarly executed.

In the above embodiment, the correction of the variation of luminous energy caused by the scanning optical system is disclosed, however, unevenness repeatedly caused such as the unevenness of the sensitivity of a photoconductor, the unevenness of electrification and the unevenness of the transfer of toner on paper can be corrected by preparing a correction coefficient for two dimensions as the density of an image together with the unevenness of luminous energy by a scanning optical system. That is, the above correction can be realized by setting a correction value in a horizontal scanning direction (corresponding to a scanning line) in addition to the above correction value in a vertical scanning direction for unevenness repeated caused, storing these correction values in a memory, reading them from memory corresponding to a scanning line and multiplying.

As described above, according to the laser beam luminous energy correction method and the laser driving apparatus respectively according to the present invention, the variation of luminous energy caused by the scanning optical system can be precisely corrected, therefore, if the method is applied to a laser beam scanner, scanning by a laser beam the luminous energy of which is precisely regulated can be realized and if the method is applied to an image formation device, a high quality of image the variation of the density of which is small between the center and the end of the image is formed.

That is, according to the first aspect, as a current value exceeding a threshold current part having a current value in the vicinity in a spontaneous emission area of an extrapolated point is corrected, the variation of an output beam according to a beam position or an angle of incidence with the scanned surface can be precisely corrected.

According to the second aspect, as a current value in a current area exceeding threshold current is corrected, the variation of an output beam according to a beam position or an angle of incidence with the scanned surface can be precisely corrected. Also, as correction that a reference value is multiplied by a correction value is made, a correction value is not required to be varied even if intensity is required to be varied according to the condition of the scanning system and the scanned surface. Further, as the current value of the constant current source is controlled based upon the result of the multiplication, the correction circuit can be realized by simple configuration.

According to the third aspect, as a current value in a current area exceeding threshold current is corrected, the variation of an output beam according to an angle of incidence with the scanned surface can be precisely corrected. Also, as correction that a reference value is multiplied by a correction value is made, a correction value is not required to be varied even in intensity modulation according to image data or even if intensity is required to be varied according to the condition of the scanning system and the scanned surface. Further, as the current value of the constant current source is controlled based upon the result of the multiplication, the correction circuit can be realized by simple configuration.

Further, according to the fourth aspect, threshold current is correctly regulated by operation by the operation section, modulation current exceeding the threshold current is corrected right and therefore, as in the above first to third aspects, the variation of an output beam according to an angle of incidence with the scanned surface can be precisely corrected. Also, according to the fourth aspect, as correction that a reference value is multiplied by a correction value is made, a correction value is not required to be varied even if intensity is required to be varied according to the condition of the scanning system and the scanned surface. Further, as the current value of the constant current source is controlled based upon the result of the multiplication, the correction circuit can be realized by simple configuration.

According to the fifth aspect, a threshold at an extrapolated point and a gain set value are precisely acquired at high speed by analog operation in a first mode and in a second mode, as in the laser driving apparatus in the above second to fourth aspects, the variation of an output beam according to a beam position or an angle of incidence with the scanned surface can be precisely corrected.

Further, according to the sixth aspect, the variation of luminous energy caused by the laser beam scanning optical system is precisely corrected and the scanned surface can be scanned by a laser beam precisely holding image information.

Further, according to the seventh aspect, the variation of luminous energy caused by the laser beam scanning optical system is precisely corrected and a high quality of image having precise density can be formed.

As correction that a correction value is multiplied is made, unevenness repeatedly caused can be readily corrected by providing a correction value according to the above unevenness such as the unevenness of sensitivity, the unevenness of electrification and the unevenness of transfer.

What is claimed is:

1. A laser beam luminous energy correction method for correcting the variation of an output beam according to a beam position or an angle of incidence with a scanned surface when a beam output from a laser is scanned on the scanned surface via a scanning optical system, said correction method comprising the steps of:

correcting a current value exceeding a threshold current part having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero with a correction value for correcting the variation of an output beam according to a beam position or an angle of incidence with the scanned surface; and driving said laser based upon the result of the correction and the threshold current.

2. A laser driving apparatus for driving a laser of which the output beam is scanned on a scanned surface via a scanning optical system, said laser driving apparatus comprising:

generation means for generating a correction value for correcting the variation of an output beam according to an angle of incidence with the scanned surface;

multiplication means for multiplying a reference value by the correction value from said generation means;

first generation means with a constant current source in which a current value is controlled based upon the result of the multiplication by said multiplication means, said first generation means being for generating modulation current acquired by modulating current flowing in said constant current source according to the image data;

second generation means for generating threshold current having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero; and addition means for driving a laser based upon current generated from first and second current sources.

3. A laser driving apparatus for driving a laser of which the output beam is scanned on a scanned surface via a scanning optical system, comprising:
   first generation means for generating a correction value for correcting the variation of an output beam according to an angle of incidence with the scanned surface;
   multiplication means for multiplying a reference value by the correction value from said generation means;
   second generation means with one or more constant current sources in which a current value is controlled based upon the result of the multiplication by said multiplication means, selecting the constant current source according to input image data, said second generation means for generating modulation current acquired by modulating current flowing in the selected constant current source according to the image data;
   a second current source for generating threshold current having a current value in the vicinity in a spontaneous emission area of an extrapolated point which is an intersection with an axis when a linear part corresponding to a laser beam emission area in the driving current-to-output beam luminous energy characteristic of said laser is extrapolated up to the axis showing that luminous energy is zero; and
   addition means for driving a laser based upon current generated from said second generation means and the second current source.

4. The laser driving apparatus according to claim 2, wherein:
   said second generation means comprises:
   third generation means for generating bias current regularly output independent of time when the image data is input, and
   fourth generation means for generating current output when the image data is input meaning the emission of said laser; wherein
   the threshold current is generated based upon current output from said third and fourth generation means.

5. The laser driving apparatus according to claim 3, wherein:
   said second generation means comprises:
   third generation means for generating bias current regularly output independent of time when the image data is input, and
   fourth generation means for generating current output when the image data is input meaning the emission of said laser; wherein
   the threshold current is generated based upon current output from said third and fourth generation means.

6. A laser driving apparatus for and generating supply current modulated according to image data and driving a semiconductor laser for emitting a laser beam having luminous energy according to supply current by the supply current for scanning a scanned surface via a scanning optical system,
   said laser driving apparatus comprising:
   a modulation current source to which a predetermined gain control signal and image data are input for outputting modulation current which composes a part of the supply current, by which the image data is converted so that it has gain according to the gain control signal and which is modulated according to the image data;
   a threshold current source for outputting threshold current included in the modulation current and the supply current according to a predetermined current control signal; and
   an operation section for generating the gain control signal by multiplying a gain set value which functions as the criterion of the gain of the modulation current source by a correction value according to a beam position or an angle of incidence varying according to scanning with the scanned surface of a laser beam emitted from said semiconductor laser, and generating the current control signal to control so that threshold current output from said threshold current source is a current value in the vicinity in a spontaneous emission area of an extrapolated point which is an intersection with an axis when a linear part corresponding to a laser emission area in the supply current-to-output beam luminous energy characteristic of said semiconductor laser is extrapolated up to the axis showing that luminous energy is zero.

7. The laser driving apparatus according to claim 6, wherein:
   said operation section comprises:
   first means to which a monitoring signal for monitoring the luminous energy of a laser beam emitted from said semiconductor laser is input for acquiring emission efficiency represented by the inclination of said linear part, and generating the gain set value based upon the emission efficiency, and
   second means for acquiring an extrapolated point according to the monitoring signal, and generating the current control signal based upon the extrapolated point.

8. A laser driving apparatus for generating supply current modulated according to image data and driving a semiconductor laser for emitting a laser beam having luminous energy according to the supply current for scanning a scanned surface via a scanning optical system by the supply current,
   said laser driving apparatus comprising:
   a modulation current source to which a predetermined gain control value and image data are input for outputting modulation current which composes a part of the supply current, by which the image data is converted so that it has gain according to the gain control value and which is modulated according to the image data;
   gain correction means for generating the gain control value by multiplying a gain set value which functions as the criterion of the gain of said modulation current source by a correction value according to a beam position or an angle of incidence varying according to scanning with the scanned surface of a laser beam emitted from said semiconductor laser and transmitting the gain control value to said modulation current source;
   a threshold current source for generating threshold current according to a current control value and composing the modulation current and the supply current;
   monitor value generation means for generating a monitor value by adding a first monitor value to which a predetermined set value is converted so that it has gain according to the gain control value and a second monitor value according to the current control value;
   current control value generation means to which an emission luminous energy monitoring signal for monitoring the emission luminous energy of said semiconductor laser and a predetermined first reference value are input for generating the current control value so that said semiconductor laser emits a beam having emission luminous energy corresponding to the first reference value;

gain set value generation means to which a monitor value generated by said monitor value generation means and a predetermined second reference value are input for generating the gain set value so that a monitor value corresponding to the second reference value is generated by said monitor value generation means;

first sample-hold means which can be switched to a through state in which input is output as it is and to a hold state in which a value the input of which is sample-held is output for supplying a current control value generated by said current control value generation means as it is in the through state and with the current control value held in the hold state to said bias current source and said monitor value generation means; and second sample-hold means which can be switched to a through state in which input is output as it is and to a hold state in which a value the input of which is sample-held is output for supplying a gain set value generated by said gain set value generation means as it is in the through state and with the gain set value held in the hold state to said gain correction means and said monitor value generation means, wherein said laser driving apparatus is provided with:

a first mode for keeping said first and second sample-hold means through and controlling the gain set value and the current control value using a correction value fixed in said gain correction means; and a second mode for keeping said first and second sample-hold means sample-held, generating the gain control value using a correction value according to the angle of incidence in said gain correction means and outputting driving current by which image data is converted so that the image data has gain according to the gain control value in said driving current source and which is modulated according to the image data.

9. The laser driving apparatus according to claim 8, further comprising:

a low-pass filter located between said gain correction means and said modulation current source, and operated in the second mode.

10. A laser beam scanner for scanning a predetermined scanned surface by a laser beam holding image information, said laser beam scanner comprising:

a semiconductor laser for emitting a laser beam having luminous energy according to supply current;

a laser driving circuit for generating supply current modulated according to image data and driving said semiconductor laser by the supply current; and a scanning optical system for helping a laser beam emitted from said semiconductor laser to scan the predetermined scanned surface, wherein:

said laser driving circuit comprises:

generation means for generating a correction value for correcting the variation of an output beam according to an angle of incidence with the scanned surface;

multiplication means for multiplying a reference value by a correction value from said generation means;

first generation means with a constant current source the current value of which is controlled based upon the result of the multiplication by said multiplication means, said first generation means being for generating modulation current acquired by modulating current flowing in said constant current source according to the image data;

second generation means for generating threshold current having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero; and addition means for driving a laser based upon current generated from the first and second current sources.

11. The laser beam scanner according to claim 10, wherein:

said scanning optical system comprises:

a rotating polygon mirror for reflecting and deflecting a laser beam emitted from said semiconductor laser, and a beam diameter control optical member for regulating a laser beam emitted from said semiconductor laser and outgoing from one mirror surface of said rotating polygon mirror so that the beam has a predetermined beam diameter, and leading the beam to said rotating polygon mirror.

12. An image recording device with a process for scanning a predetermined scanned surface by a laser beam holding image information in a process for recording an image, said image recording device comprising:

a semiconductor laser for emitting a laser beam having luminous energy according to supply current;

a laser driving circuit for generating supply current modulated according to image data and driving said semiconductor laser by the supply current; and a scanning optical system for helping a laser beam emitted from said semiconductor laser to scan a predetermined scanned surface, wherein:

said laser driving circuit comprises:

generation means for generating a correction value for correcting the variation of an output beam according to an angle of incidence with the scanned surface;

multiplication means for multiplying a reference value by a correction value from said generation means;

first generation means with a constant current source the current value of which is controlled based upon the result of the multiplication by said multiplication means, said first generation means being for generating modulation current acquired by modulating current flowing in said constant current source according to the image data;

second generation means for generating threshold current having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero; and addition means for driving a laser based upon current generated from said first and second current sources.

13. A laser driving method for driving a laser of which the output beam is scanned on a scanned surface via a scanning optical system, said laser driving method comprising the steps of:

generating a correction value for correcting the variation of an output beam according to an angle of incidence with the scanned surface;

multiplying a reference value by the correction value obtained by said generating step;

with a constant current source in which a current value is controlled based upon the result of the multiplication obtained by said multiplication step, first generating for generating modulation current acquired by modulating current flowing in said constant current source according to the image data;

second generating for generating threshold current having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero; and addition for driving a laser based upon current generated from said first and second current generating steps.

14. A laser driving method for driving a laser of which the output beam is scanned on a scanned surface via a scanning optical system, comprising the steps of:

first generating for generating a correction value for correcting the variation of an output beam according to an angle of incidence with the scanned surface;

multiplying a reference value by the correction value obtained by said first generation step;

with one or more constant current sources in which a current value is controlled based upon the result of the multiplication obtained by said multiplying step, second generating for selecting said constant current source according to input image data and for generating modulation current acquired by modulating current flowing in said selected constant current source according to the image data;

generating threshold current having a current value in the vicinity in a spontaneous emission area of an extrapolated point which is an intersection with an axis when a linear part corresponding to a laser beam emission area in the driving current-to-output beam luminous energy characteristic of said laser is extrapolated up to the axis showing that luminous energy is zero by a second current source; and addition for driving a laser based upon current generated from said second generation step and said second current step.

15. The laser driving method according to claim 13, wherein:

said second generation step comprises:

third generation step for generating bias current regularly output independent of time when the image data is input, and fourth generation step for generating current output when the image data is input meaning the emission of said laser; wherein the threshold current is generated based upon current output from said third and fourth generation means.

16. The laser driving method according to claim 14, wherein:

said second generation step comprises:

third generation step for generating bias current regularly output independent of time when the image data is input, and fourth generation step for generating current output when the image data is input meaning the emission of said laser; wherein the threshold current is generated based upon current output from said third and fourth generation means.

17. A laser driving method for generating supply current modulated according to image data and driving a semiconductor laser for emitting a laser beam having luminous energy according to supply current by the supply current for scanning a scanned surface via a scanning optical system, said laser driving method comprising the steps of:

modulation in which a predetermined gain control signal and image data are input for outputting modulation current which composes a part of the supply current, by which the image data is converted so that it has gain according to the gain control signal and which is modulated according to the image data;

outputting threshold current included in the modulation current and the supply current according to a predetermined current control signal; and generating the gain control signal by multiplying a gain set value which functions as the criterion of the gain of said modulation step by a correction value according to an angle of incidence varying according to scanning with the scanned surface of a laser beam emitted from said semiconductor laser, and generating the current control signal to control so that threshold current output from said threshold current source is a current value in the vicinity in a spontaneous emission area of an extrapolated point which is an intersection with an axis when a linear part corresponding to a laser emission area in the supply current-to-output beam luminous energy characteristic of said semiconductor laser is extrapolated up to the axis showing that luminous energy is zero.

18. The laser driving method according to claim 17, wherein:

said generating the current control signal step comprises:

inputting a monitoring signal for monitoring the luminous energy of a laser beam emitted from said semiconductor laser for acquiring emission efficiency represented by the inclination of the linear part, generating the gain set value based upon the emission efficiency, acquiring an extrapolated point according to the monitoring signal, and generating the current control signal based upon the extrapolated point.

19. A laser driving method for generating supply current modulated according to image data and driving a semiconductor laser for emitting a laser beam having luminous energy according to the supply current for scanning a scanned surface via a scanning optical system by the supply current, said laser driving method comprising the steps of:

outputting modulation current which composes a part of the supply current by a modulation current source to which a predetermined gain control value and image data are input, by which the image data is converted so that it has gain according to the gain control value and which is modulated according to the image data;

generating the gain control value by gain correction means by multiplying a gain set value which functions as the criterion of the gain of said modulation current source by a correction value according to an angle of incidence varying according to scanning with the scanned surface of a laser beam emitted from said semiconductor laser and transmitting the gain control value to said modulation current source by gain correction means;

generating threshold current by a threshold current source according to a current control value and composing the modulation current and the supply current;

generating a monitor value by monitor value generation means by adding a first monitor value to which a predetermined set value is converted so that it has gain according to the gain control value and a second monitor value according to the current control value;

generating the current control value by current control value generation means to which an emission luminous energy monitoring signal for monitoring the emission luminous energy of said semiconductor laser and a predetermined first reference value are input so that said semiconductor laser emits a beam having emission luminous energy corresponding to the first reference value;

generating the gain set value so that a monitor value corresponding to the second reference value is generated by said monitor value generation means by gain set value generation means to which a monitor value generated by said monitor value generation means and a predetermined second reference value are input;

supplying a current control value generated by said current control value generation means as it is in the through state and with the current control value held in the hold state to said bias current source and said monitor value generation means, by first sample-hold means capable to be switched to a through state in which input is output as it is and to a hold state in which a value the input of which is sample-held is output; and supplying a gain set value generated by said gain set value generation means as it is in the through state and with the gain set value held in the hold state to said gain correction means and said monitor value generation means, by second sample-hold means capable to switched to a through state in which input is output as it is and to a hold state in which a value the input of which is sample-held is output, wherein said laser driving apparatus utilizes:

a first mode for keeping said first and second sample-hold means through and controlling the gain set value and the current control value using a correction value fixed in said gain correction means; and a second mode for keeping said first and second sample-hold means sample-held, generating the gain control value using a correction value according to the angle of incidence in said gain correction means and outputting driving current by which image data is converted so that the image data has gain according to the gain control value in said driving current source and which is modulated according to the image data.

20. The laser driving method according to claim 19, further comprising:

a low-pass filter located between said gain correction means and said modulation current source, and operated in the second mode.

21. A laser beam scanning method for scanning a predetermined scanned surface by a laser beam holding image information, said laser beam scanning method comprising the steps of:

emitting a laser beam having luminous energy according to supply current by a semiconductor laser;

generating supply current modulated according to image data and driving said semiconductor laser by the supply current by a laser driving circuit; and scanning the predetermined scanned surface by a scanning optical system for helping a laser beam emitted from said semiconductor laser, wherein:

said semiconductor laser driving method comprises the steps of:

generating a correction value for correcting the variation of an output beam according to an angle of incidence with the scanned surface by generation means;

multiplying a reference value by a correction value from said generation means by multiplication means;

generating modulation current acquired by modulating current flowing in said constant current source according to the image data by first generation means with a constant current source the current value of which is controlled based upon the result of the multiplication by said multiplication means, by said first generation means;

generating threshold current having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero, by second generation means; and driving a laser based upon current generated from said first and second current sources by addition means.

22. The laser beam scanning method according to claim 21, wherein:

said scanning optical system comprises:

a rotating polygon mirror for reflecting and deflecting a laser beam emitted from said semiconductor laser, and a beam diameter control optical member for regulating a laser beam emitted from said semiconductor laser and outgoing from one mirror surface of said rotating polygon mirror so that the beam has a predetermined beam diameter, and leading the beam to said rotating polygon mirror.

23. An image recording method with a process for scanning a predetermined scanned surface by a laser beam holding image information in a process for recording an image, said image recording method comprising the steps of:

causing a semiconductor laser beam having luminous energy according to supply current emit;

causing a laser driving circuit generate supply current modulated according to image data and driving said semiconductor laser by the supply current; and causing scanning optical system for helping a laser beam emitted from said semiconductor laser scan a predetermined scanned surface, wherein:

said step of causing said laser driving circuit generate supply current comprises:

generating a correction value for correcting the variation of an output beam according to an angle of incidence with the scanned surface by generation means;

multiplying a reference value by a correction value from said generation means by multiplication means;

generating modulation current acquired by modulating current flowing in said constant current source according to the image data, by first generation means with a constant current source the current value of which is controlled based upon the result of the multiplication by said multiplication means;

generating threshold current having a current value in the vicinity in a spontaneous emission area of an extrapolated point which is an intersection with an axis when a linear part corresponding to a laser emission area in the driving current-to-output beam luminous energy characteristic of said laser is extrapolated up to the axis showing that luminous energy is zero by second generation means; and driving a laser based upon current generated from said first and second current sources by addition means.

* * * * *